United States Patent
Onodera et al.

(10) Patent No.: US 12,557,708 B2
(45) Date of Patent: Feb. 17, 2026

(54) POWER MODULE WITH IMPROVED CONDUCTIVE PATHS

(71) Applicant: ROHM CO., LTD., Kyoto (JP)

(72) Inventors: Kenichi Onodera, Kyoto (JP); Soichiro Takahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 40 days.

(21) Appl. No.: 18/770,232

(22) Filed: Jul. 11, 2024

(65) Prior Publication Data

US 2024/0363595 A1 Oct. 31, 2024

Related U.S. Application Data

(63) Continuation of application No. 17/596,558, filed as application No. PCT/JP2020/030190 on Aug. 6, 2020, now Pat. No. 12,068,289.

(30) Foreign Application Priority Data

Aug. 21, 2019 (JP) .................. 2019-150978

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/053* (2013.01); *H01L 23/142* (2013.01);
(Continued)

(58) Field of Classification Search
CPC .................................................. H01L 25/072
(Continued)

(56) References Cited

U.S. PATENT DOCUMENTS 6,800,934 B2 10/2004 Oumaru
2012/0032725 A1 2/2012 Hiyama
(Continued)

FOREIGN PATENT DOCUMENTS

JP 2012038803 A 2/2012

OTHER PUBLICATIONS

International Preliminary Report on Patentability issued for International Patent Application No. PCT/JP2020/030190, Date of mailing: Mar. 3, 2022, 11 pages including English translation.

*Primary Examiner* — Ajay Arora
(74) *Attorney, Agent, or Firm* — HSML P.C.

(57) ABSTRACT

A power module includes a first end power semiconductor element and a second end power semiconductor element. A first sum is a sum of a path length between the gate electrode of the first end power semiconductor element and a first control terminal and a path length between the source electrode of the first end power semiconductor element and a first detection terminal. A second sum is a sum of a path length between the gate electrode of the second end power semiconductor element and the first control terminal and a path length between the source electrode of the second end power semiconductor element and the first detection terminal. The power module includes a first control layer connected to the gate electrode. The first control layer includes a first detour portion that detours the path to reduce a difference between the first sum and the second sum.

15 Claims, 38 Drawing Sheets

(51) Int. Cl.
*H01L 23/053* (2006.01)
*H01L 23/14* (2006.01)
*H01L 23/15* (2006.01)
*H01L 23/31* (2006.01)
*H01L 23/367* (2006.01)
*H01L 23/49* (2006.01)

(52) U.S. Cl.
CPC .......... *H01L 23/15* (2013.01); *H01L 23/3121* (2013.01); *H01L 23/367* (2013.01); *H01L 23/49* (2013.01); *H01L 24/40* (2013.01); *H01L 24/48* (2013.01); *H01L 24/73* (2013.01); *H01L 2224/40227* (2013.01); *H01L 2224/48227* (2013.01); *H01L 2224/73221* (2013.01)

(58) Field of Classification Search
USPC ........................................................ 257/668
See application file for complete search history.

(56) References Cited

U.S. PATENT DOCUMENTS

| | | |
|---|---|---|
| 2018/0212509 A1 | 7/2018 | Uehara et al. |
| 2022/0320049 A1* | 10/2022 | Onodera ................. H01L 24/73 |
| 2023/0052108 A1* | 2/2023 | Hama ................ H01L 23/49575 |
| 2023/0163078 A1* | 5/2023 | Ishimatsu ............... H01L 25/18 |
| | | 257/668 |

* cited by examiner

POWER MODULE WITH IMPROVED CONDUCTIVE PATHS

CROSS-REFERENCE TO RELATED APPLICATIONS

This application is a continuation of and claims the benefit of priority from U.S. patent application Ser. No. 17/596,558, filed on Dec. 13, 2021, which is based upon and claims the benefit of priority from International Application No. PCT/JP2020/030190, filed on Aug. 6, 2020, each of which are incorporated by reference herein in its entirety.

TECHNICAL FIELD

The present disclosure relates to a power module.

BACKGROUND ART

As an example of the power module, a power module configured to be an inverter device is known (refer to Japanese Laid-Open Patent Publication No. 2012-38803). The power module includes a power semiconductor element such as an insulated gate bipolar transistor (IGBT) or a metal oxide semiconductor field effect transistor (MOSFET).

SUMMARY

When a power module is used to supply a high current, the power module may include a first element group and a second element group that are connected in series. The first element group includes power semiconductor elements connected in parallel. The second element group includes power semiconductor elements connected in parallel. The power module includes a control terminal from which a control voltage is supplied to the control terminals of the power semiconductor elements in the first element group. The power module includes another control terminal from which a control voltage is supplied to the control terminals of the power semiconductor elements in the second element group. In this case, inductance values between the control electrode of each power semiconductor element in the first element group and the control terminal of the power module vary depending on, for example, the layout of the power semiconductor elements in the first element group. This causes variations in the timing for activating and deactivating the power semiconductor elements, which may result in unstable operation. The same issue as the power semiconductor elements in the first element group occurs in the power semiconductor elements in the second element group.

A power module according to one aspect of the present disclosure includes an electrically insulative substrate including a substrate main surface and a substrate back surface that face in opposite directions in a thickness-wise direction. The power module also includes a first control layer, a second control layer, a first drive layer, a second drive layer, a first mount layer, a second mount layer, and a conductive layer that are formed on the substrate main surface and are electrically conductive. The power module also includes first power semiconductor elements mounted on the first mount layer and arranged in one direction as viewed in the thickness-wise direction, each of the first power semiconductor elements including a first element back surface, a first element main surface, a first drive electrode formed on the first element back surface and electrically connected to a first input terminal, and a second drive electrode and a control electrode formed on the first element main surface, the second drive electrode being electrically connected to an output terminal. The power module also includes second power semiconductor elements mounted on the second mount layer and arranged in the one direction as viewed in the thickness-wise direction, each of the second power semiconductor elements including a second element back surface, a second element main surface, a first drive electrode formed on the second element back surface and electrically connected to the output terminal, and a second drive electrode and a control electrode formed on the second element main surface, the second drive electrode being electrically connected to a second input terminal. The power module also includes first control-side connection members arranged in the same direction as an arrangement direction of the first power semiconductor elements to connect the control electrodes of the first power semiconductor elements to the first control layer. The power module also includes first drive-side connection members arranged in the same direction as the arrangement direction of the first power semiconductor elements to connect the second drive electrodes of the first power semiconductor elements to the first drive layer. The power module also includes second control-side connection members arranged in the same direction as an arrangement direction of the second power semiconductor elements to connect the control electrodes of the second power semiconductor elements to the second control layer. The power module also includes second drive-side connection members arranged in the same direction as the arrangement direction of the second power semiconductor elements to connect the second drive electrodes of the second power semiconductor elements to the second drive layer. The power module further includes a first control terminal electrically connected to the first control layer, a second control terminal electrically connected to the second control layer, a first detection terminal electrically connected to the first drive layer, and a second detection terminal electrically connected to the second drive layer. The first power semiconductor elements include a first end power semiconductor element and a second end power semiconductor element located at opposite ends in the arrangement direction of the first power semiconductor elements. A first end control-side conductive path is a path between the control electrode of the first end power semiconductor element and the first control terminal. A first end drive-side conductive path is a path between the second drive electrode of the first end power semiconductor element and the first detection terminal. A first sum is a sum of a length of the first end control-side conductive path and a length of the first end drive-side conductive path. A second end control-side conductive path is a path between the control electrode of the second end power semiconductor element and the first control terminal. A second end drive-side conductive path is a path between the second drive electrode of the second end power semiconductor element and the first detection terminal. A second sum is a sum of a length of the second end control-side conductive path and a length of the second end drive-side conductive path. At least one of the first control layer and the first drive layer includes a first detour portion that detours the conductive paths to reduce a difference between the first sum and the second sum.

DESCRIPTION OF THE EMBODIMENTS

Embodiments of a power module will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

A first embodiment of a power module 1A will now be described with reference to FIGS. 1 to 25.

FIGS. 1 to 6 show external shapes of the power module 1A. FIG. 7 shows an internal structure of the power module 1A. For the sake of convenience, a case 80 and terminals 50 are not shown in FIG. 9.

Figure 1:
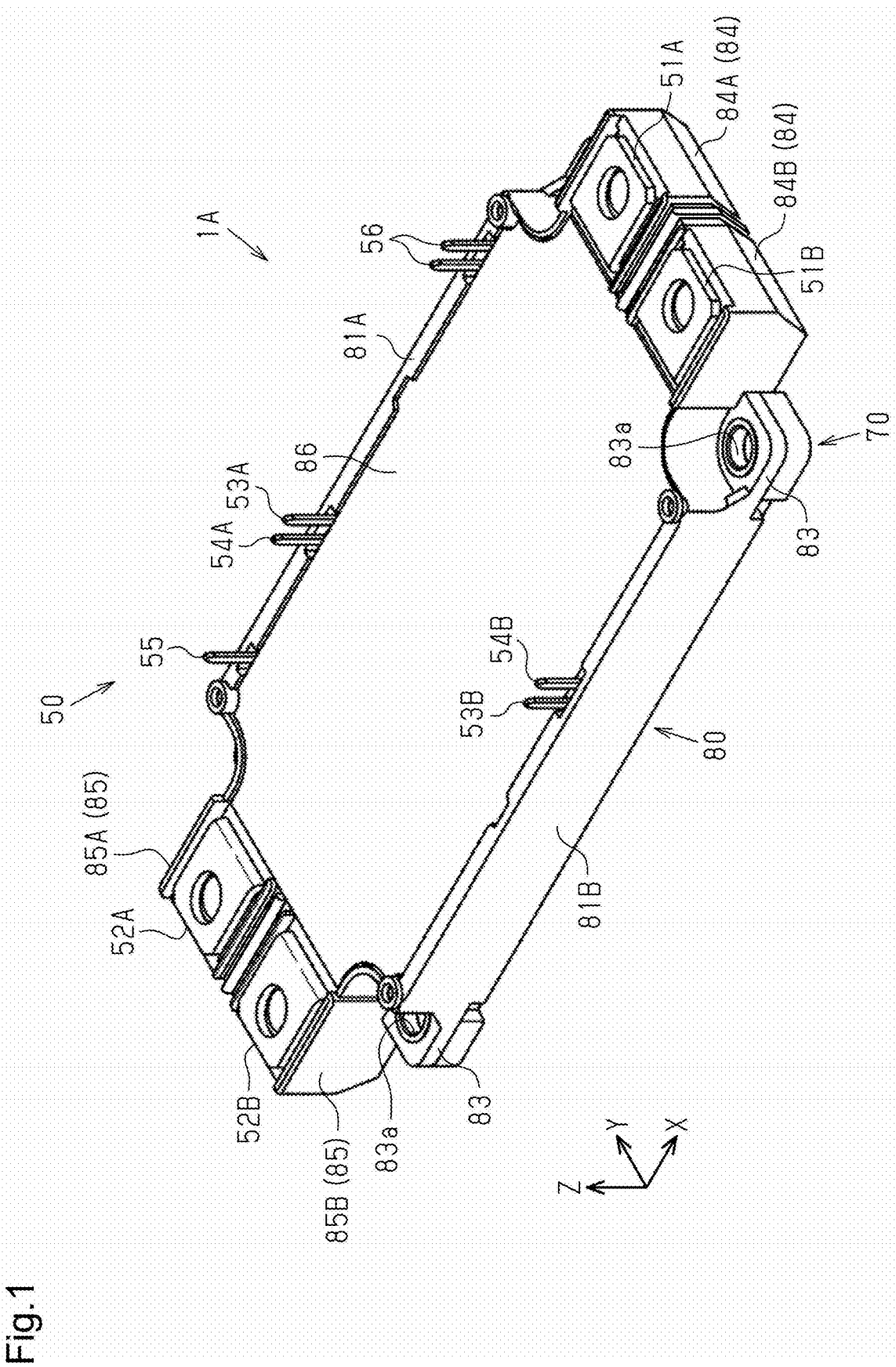
FIG. 1 is a perspective view showing a first embodiment of a power module.
Figure 2:
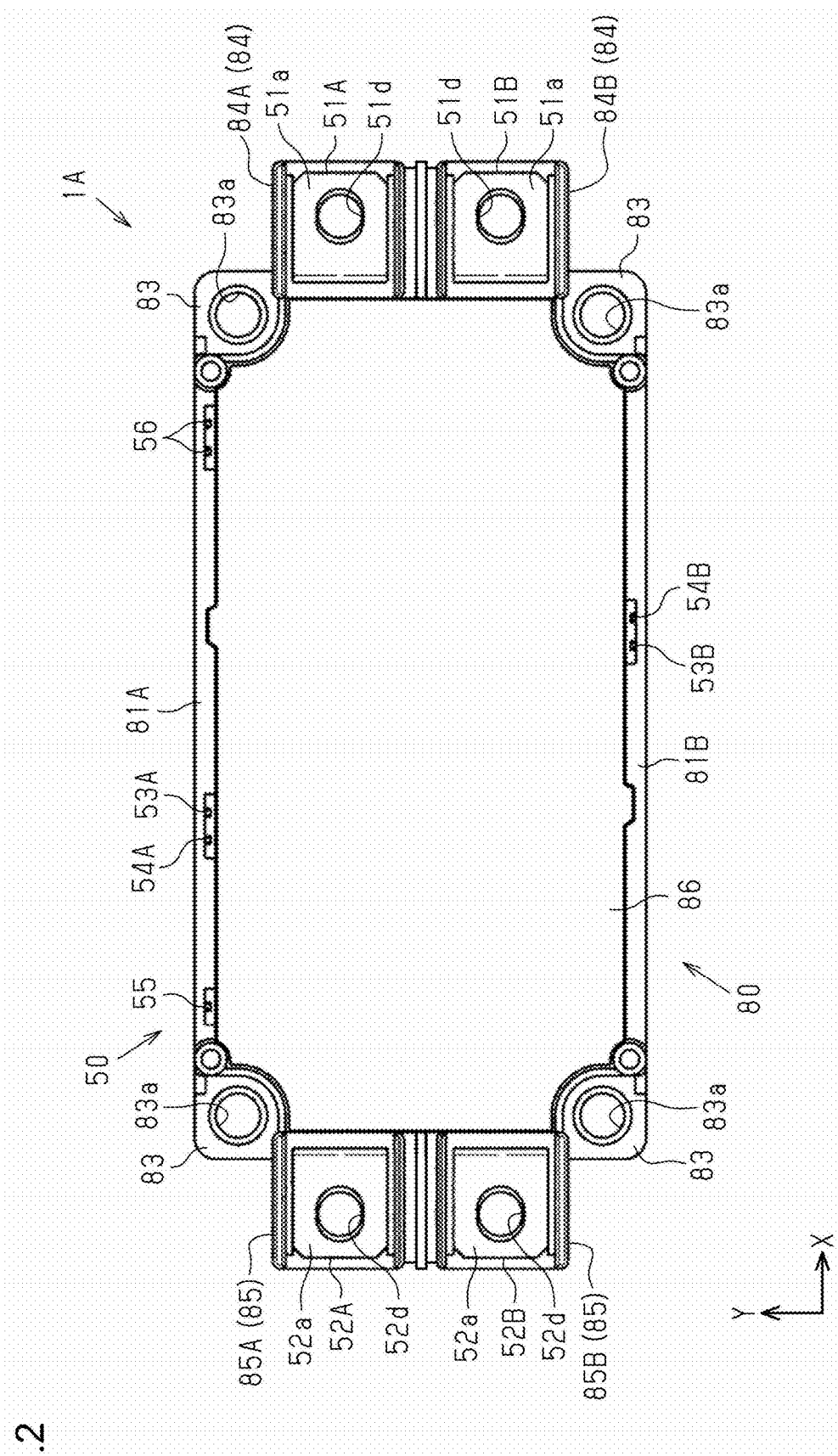
FIG. 2 is a plan view of the power module shown in FIG. 1.

As shown in FIGS. 1 to 7, the power module 1A mainly includes the case 80 and a substrate 10, connection members 30, power semiconductor elements 40, the terminals 50, an encapsulation resin 60 (refer to FIG. 10), and a heat dissipation plate 70, which are accommodated in the case 80. The power module 1A is capable of supplying a current of, for example, 300 A or greater and 1000 A or less. The encapsulation resin 60 is not shown in FIG. 7 for the sake of convenience. As shown in FIGS. 1 to 7, the substrate 10, the connection members 30, the power semiconductor elements 40, and the encapsulation resin 60 are accommodated in the heat dissipation plate 70 and the case 80 and are not exposed to the outside. The terminals 50 are accommodated in the case 80 and are partially exposed or project to the outside of the case 80. The power module 1A is used in, for example, an inverter device. As shown in FIGS. 1, 2, and 7, as viewed in the thickness-wise direction of the substrate 10 (hereafter, referred to as "in plan view"), the power module 1A is rectangular. For the sake of brevity, a direction extending in the thickness-wise direction of the substrate 10 is referred to as "the thickness-wise direction Z", and two directions that are orthogonal to each other and orthogonal to the thickness-wise direction Z are referred to as "the longitudinal direction X" and "the lateral direction Y." In the present embodiment, the power module 1A has a long-side direction that conforms to the longitudinal direction X and a short-side direction that conforms to the lateral direction Y.

Figure 8:
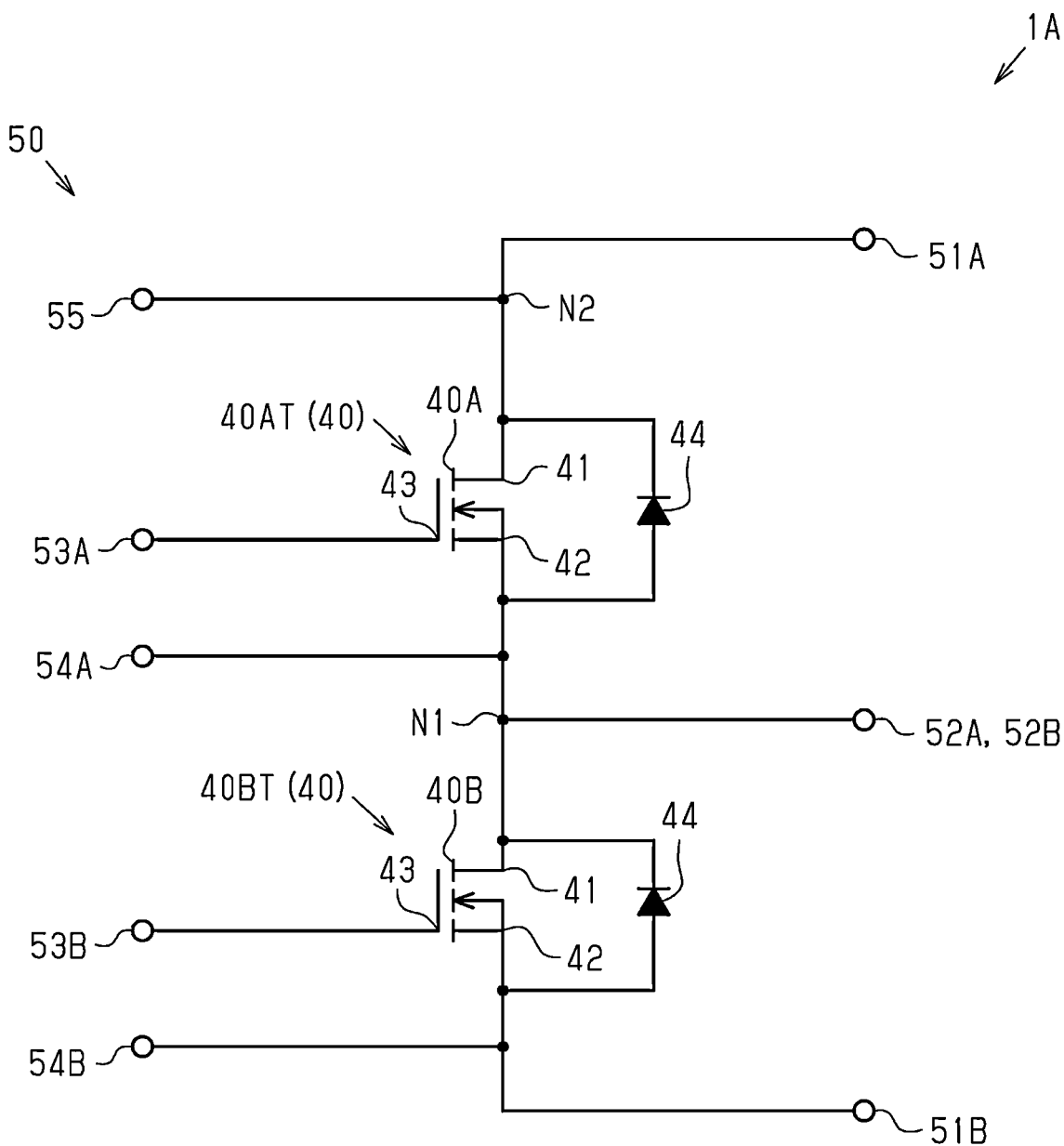
FIG. 8 is a circuit diagram showing a circuit configuration of the power module shown in FIG. 1.

FIG. 8 shows the circuit configuration of the power module 1A in the present embodiment. The power module 1A includes a first power semiconductor element group 40AT including first power semiconductor elements 40A and a second power semiconductor element group 40BT including second power semiconductor elements 40B. The first power semiconductor elements 40A and the second power semiconductor elements 40B are the power semiconductor elements 40. For the sake of brevity, in FIG. 8, a single first power semiconductor element 40A is shown as the first power semiconductor element group 40AT, and a single second power semiconductor element 40B is shown as the second power semiconductor element group 40BT.

Each of the first power semiconductor elements 40A in the first power semiconductor element group 40AT and the second power semiconductor elements 40B in the second power semiconductor element group 40BT is used as a switching element. Each of the power semiconductor elements 40A and 40B is, for example, a transistor formed from Si (silicon), SiC (silicon carbide), GaN (gallium nitride) or GaAs (gallium arsenide), or $Ga_2O_3$ (gallium oxide). When the power semiconductor elements 40A and 40B are formed from SiC, it is suitable for high-speed switching. In the present embodiment, each of the power semiconductor elements 40A and 40B is an N-channel MOSFET formed from SiC. The power semiconductor elements 40A and 40B are not limited to MOSFETs and may be field effect transistors including a metal-insulator-semiconductor FET (MISFET) or bipolar transistors including an IGBT. Each of the power semiconductor elements 40A and 40B may be an N-channel MOSFET or a P-channel MOSFET.

Each of the power semiconductor elements 40A and 40B includes a drain electrode 41, a source electrode 42, and a gate electrode 43. Each of the power semiconductor elements 40A and 40B also includes a body diode 44. Although not shown in FIG. 8, the first power semiconductor elements 40A in the first power semiconductor element group 40AT are connected in parallel to each other. More specifically, the drain electrodes 41 of the first power semiconductor elements 40A are connected to each other, and the source electrodes 42 of the first power semiconductor elements 40A are connected to each other. Also, the second power semiconductor elements 40B in the second power semiconductor element group 40BT are connected in parallel to each other. More specifically, the drain electrodes 41 of the second power semiconductor elements 40B are connected to each other, and the source electrodes 42 of the second power semiconductor elements 40B are connected to each other. The first power semiconductor element group 40AT is connected in series to the second power semiconductor element group 40BT. More specifically, the source electrode 42 of the first power semiconductor element group 40AT (the source electrodes 42 of the first power semiconductor elements 40A) is electrically connected to the drain electrode 41 of the second power semiconductor element group 40BT (the drain electrodes 41 of the second power semiconductor elements 40B). Thus, in the present embodiment, the power module 1A includes an inverter circuit. The first power semiconductor element group 40AT forms an upper arm, and the second power semiconductor element group 40BT forms a lower arm.

The drain electrode 41, the source electrode 42, and the gate electrode 43 of each of the first power semiconductor elements 40A in the first power semiconductor element group 40AT and the second power semiconductor elements 40B in the second power semiconductor element group 40BT are connected to the terminals 50.

As shown in FIGS. 1, 2, and 8, the terminals 50 include a first input terminal 51A, a second input terminal 51B, a first output terminal 52A, a second output terminal 52B, a first control terminal 53A, a second control terminal 53B, a first detection terminal 54A, a second detection terminal 54B, a power supply current terminal 55, and two temperature detection terminals 56. The two temperature detection terminals 56 are not electrically connected to the power semiconductor elements 40A and 40B and are not shown in FIG. 8 for the sake of convenience.

The first input terminal 51A is electrically connected to the drain electrode 41 of the first power semiconductor element group 40AT. More specifically, the first input terminal 51A is electrically connected to the drain electrode 41 of each of the first power semiconductor elements 40A. The second input terminal 51B is electrically connected to the source electrode 42 of the second power semiconductor element group 40BT. More specifically, the second input terminal 51B is electrically connected to the source electrode 42 of each of the second power semiconductor elements 40B. Each of the output terminals 52A and 52B is electrically connected to a node N1 between the source electrode 42 of the first power semiconductor element group 40AT and the drain electrode 41 of the second power semiconductor element group 40BT. More specifically, each of the output terminals 52A and 52B is electrically connected to the node N1 between the source electrodes 42 of the first power semiconductor elements 40A and the drain electrodes 41 of the second power semiconductor elements 40B. The first control terminal 53A is electrically connected to the gate electrode 43 of the first power semiconductor element group 40AT. More specifically, the first control terminal 53A is electrically connected to the gate electrode 43 of each of the first power semiconductor elements 40A. The second control terminal 53B is electrically connected to the gate electrode 43 of the second power semiconductor element group 40BT. More specifically, the second control terminal 53B is electrically connected to the gate electrode 43 of each of the second power semiconductor elements 40B. The first detection terminal 54A is electrically connected to the source electrode 42 of the first power semiconductor element group 40AT. More specifically, the first detection terminal 54A is electrically connected to the source electrode 42 of each of the first power semiconductor elements 40A. The second detection terminal 54B is electrically connected to the source electrode 42 of the second power semiconductor element group 40BT. More specifically, the second detection terminal 54B is electrically connected to the source electrode 42 of each of the second power semiconductor elements 40B. The power supply current terminal 55 is electrically connected to a node N2 between the drain electrode 41 of the first power semiconductor element group 40AT and the first input terminal 51A. More specifically, the power supply current terminal 55 is electrically connected to the node N2 between the drain electrode 41 of each of the first power semiconductor elements 40A and the first input terminal 51A. In the present embodiment, the control terminals 53A and 53B, the detection terminals 54A and 54B, the power supply current terminal 55, and the two temperature detection terminals 56 are electrically connected to a control circuit (not shown) arranged outside the power module 1A.

As shown in FIGS. 1 and 2, the above-described terminals 51A, 51B, 52A, 52B, 53A, 53B, 54A, 54B, 55, and 56 are arranged in the case 80.

As shown in FIGS. 1, 2, and 7, in plan view, the case 80 is frame-shaped and surrounds the substrate 10, the connection members 30, and the power semiconductor elements 40. The case 80 is formed from, for example, an electrically-insulative synthetic resin having a superior heat resistance such as polyphenylene sulfide (PPS). The case 80 includes two side walls 81A and 81B, two terminal seats 82A and 82B, attachment portions 83, power terminal mounts 84, and output terminal mounts 85.

Figure 3:
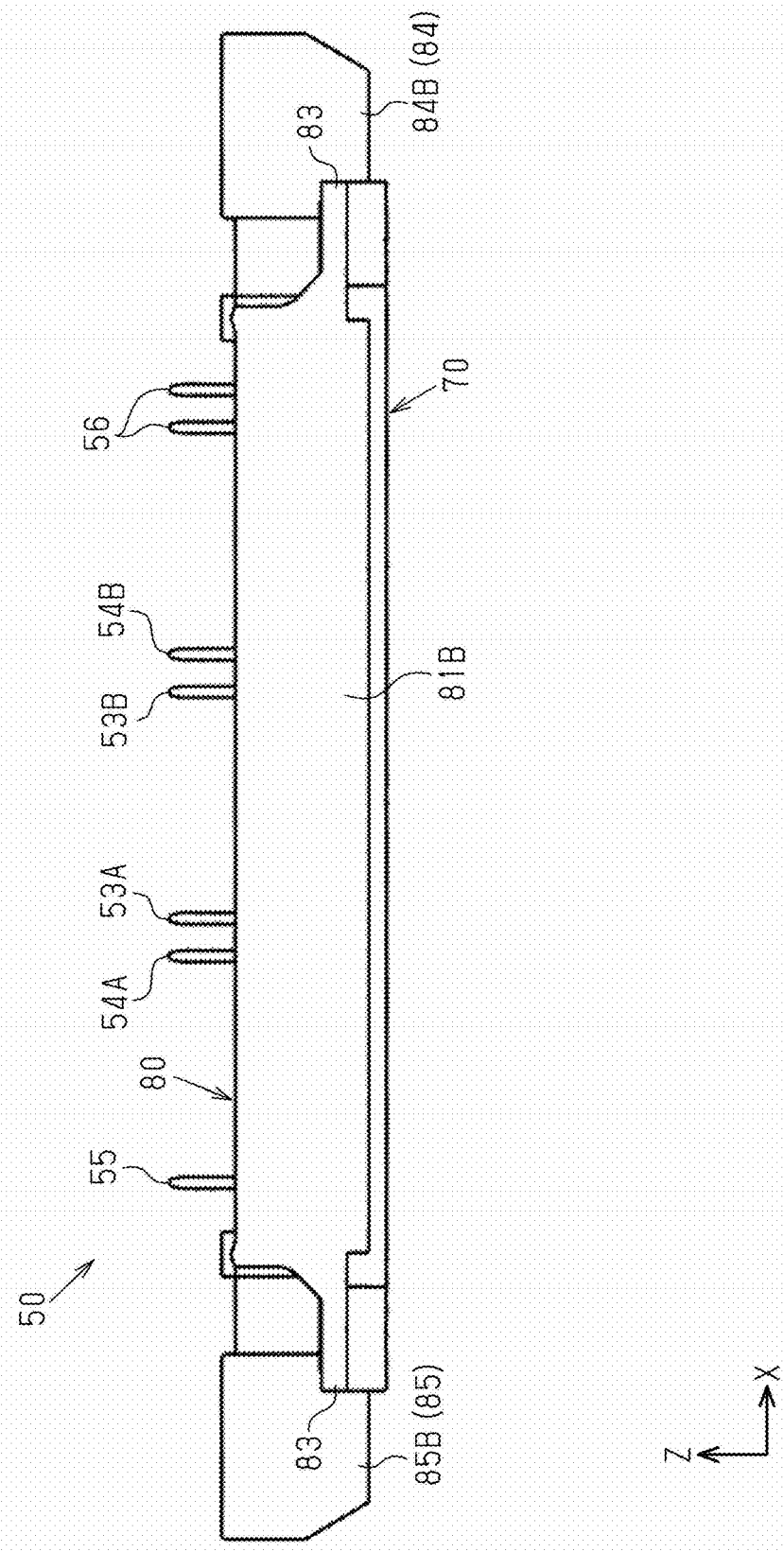
FIG. 3 is a side view of the power module shown in FIG. 1.
Figure 5:
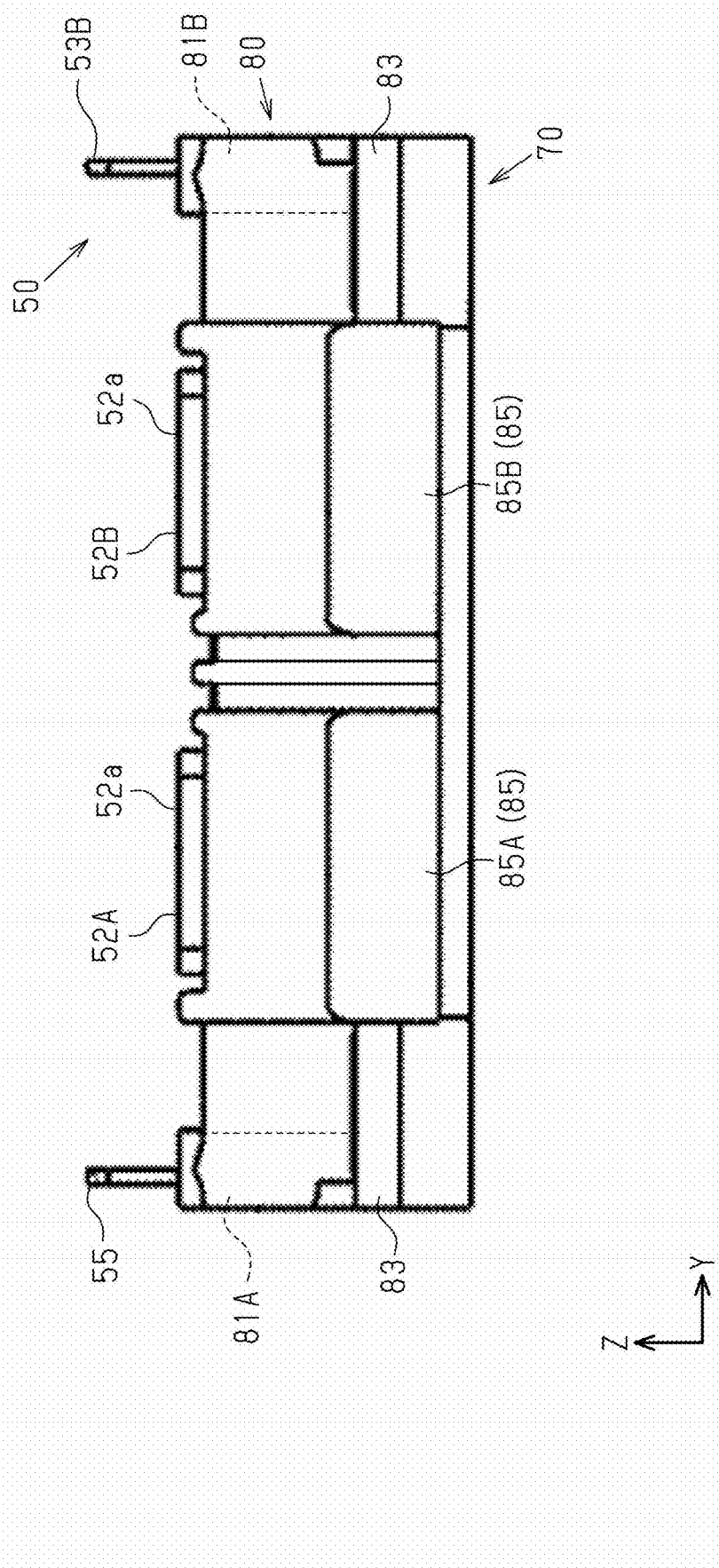
FIG. 5 is a side view of the power module shown in FIG. 1 as viewed in a direction different from those of FIGS. 3 and 4.
Figure 6:
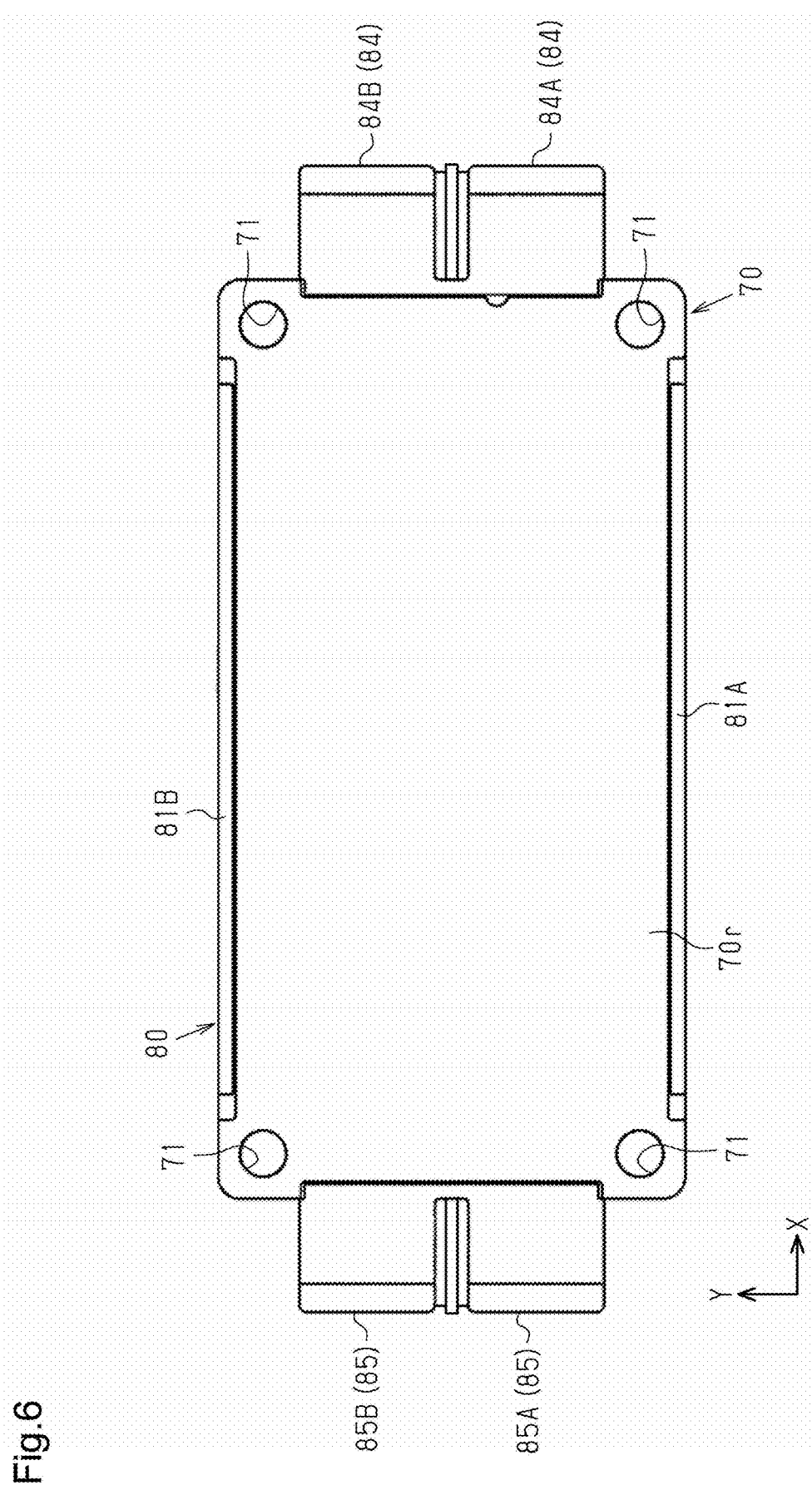
FIG. 6 is a bottom view of the power module shown in FIG. 1.
Figure 7:
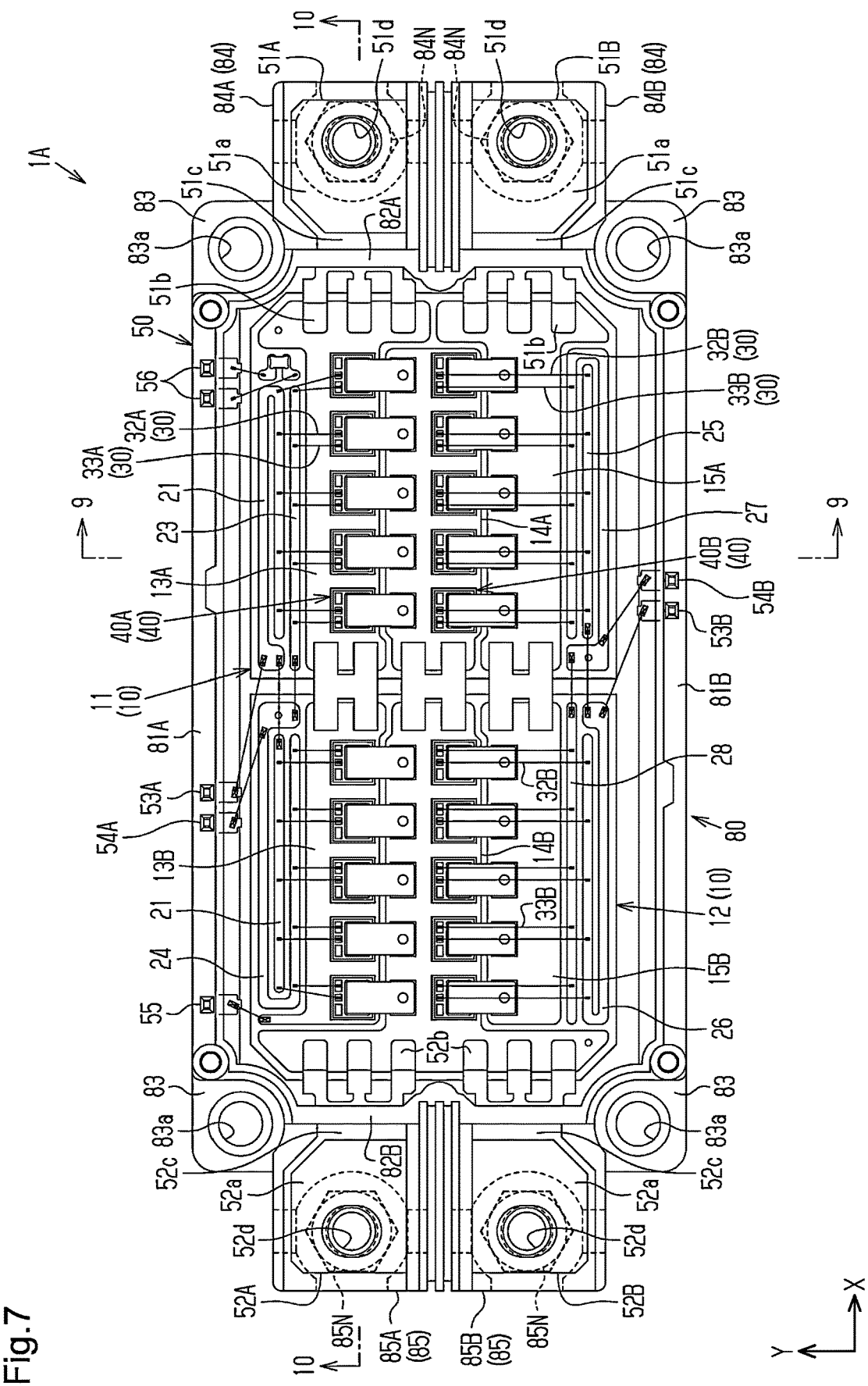
FIG. 7 is a plan view showing an internal structure of the power module shown in FIG. 1.

As shown in FIGS. 2, 6, and 7, in plan view, the two side walls 81A and 81B are separated from each other in the lateral direction Y and extend in the longitudinal direction X. As shown in FIGS. 3 and 5, in a side view, the two side walls 81A and 81B extend in the thickness-wise direction Z. As shown in FIGS. 2 and 7, the first control terminal 53A, the first detection terminal 54A, the power supply current terminal 55, and the two temperature detection terminals 56 are arranged in the side wall 81A. The first control terminal 53A, the first detection terminal 54A, the power supply current terminal 55, and the two temperature detection terminals 56 are supported by the side wall 81A. As shown in FIGS. 1 and 3, the first control terminal 53A, the first detection terminal 54A, the power supply current terminal 55, and the two temperature detection terminals 56 project from the side wall 81A in the thickness-wise direction Z. As shown in FIGS. 2 and 7, the second control terminal 53B and the second detection terminal 54B are arranged in the side wall 81B. The second control terminal 53B and the second detection terminal 54B are supported by the side wall 81B. As shown in FIGS. 1 and 3, the second control terminal 53B and the second detection terminal 54B project from the side wall 81B in the thickness-wise direction Z. The control terminals 53A and 53B, the detection terminals 54A and 54B, the power supply current terminal 55, and the two temperature detection terminals 56 are each formed of, for example, a metal rod formed from copper (Cu). The surface of the metal rod is plated with tin (Sn). Nickel plating may be applied between the surface of the metal rod and the tin plating. The control terminals 53A and 53B, the detection terminals 54A and 54B, the power supply current terminal 55, and the two temperature detection terminals 56 are, for example, identical in shape and, in an example, L-shaped to have a first part extending in the lateral direction Y and a second part extending in the thickness-wise direction Z.

As shown in FIG. 7, the two terminal seats 82A and 82B are connected to opposite ends of each of the two side walls 81A and 81B in the longitudinal direction X. The two side walls 81A and 81B and the two terminal seats 82A and 82B form the shape of a frame surrounding the substrate 10, the connection members 30, and the power semiconductor elements 40. The two terminal seats 82A and 82B are separated from each other in the longitudinal direction X. The power terminal mounts 84 are connected to the terminal seat 82A and project outward from the terminal seat 82A in the longitudinal direction X. The output terminal mounts 85 are connected to the terminal seat 82B and project outward from the terminal seat 82B in the longitudinal direction X.

Figure 4:
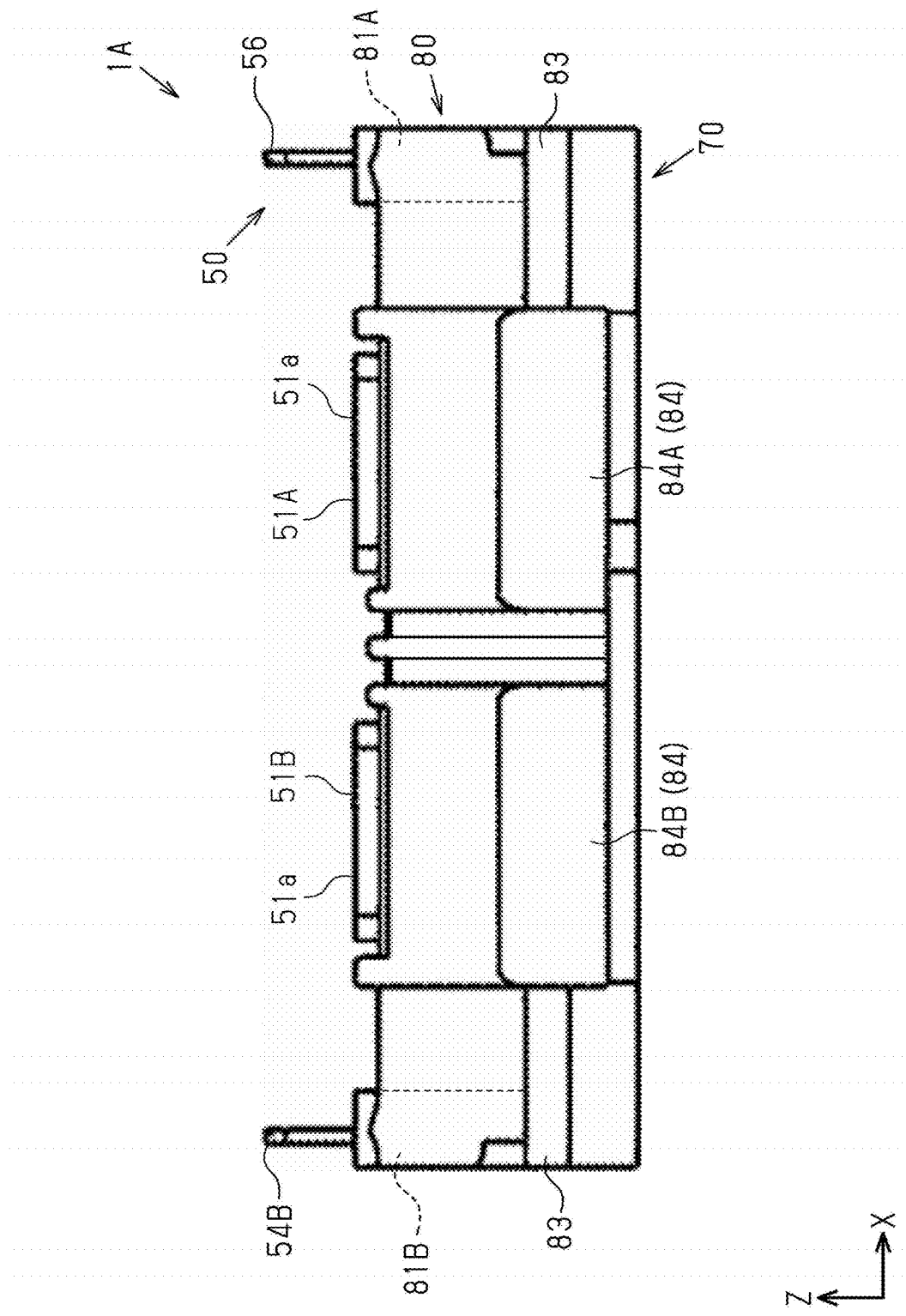
FIG. 4 is a side view of the power module shown in FIG. 1 as viewed in a direction different from that of FIG. 3.

As shown in FIGS. 2, 4, and 7, the power terminal mounts 84 include a first terminal mount 84A and a second terminal mount 84B. The first terminal mount 84A and the second terminal mount 84B are aligned in the longitudinal direction X and arranged in the lateral direction Y. A portion of the first input terminal 51A is arranged on the first terminal mount 84A. The first terminal mount 84A supports the portion of the first input terminal 51A. A portion of the second input terminal 51B is arranged on the second terminal mount 84B. The second terminal mount 84B supports the portion of the second input terminal 51B. As shown in FIG. 7, a nut 84N is arranged in the first terminal mount 84A. As shown in FIG. 7, a nut 84N is arranged in the second terminal mount 84B in the same manner as the first terminal mount 84A.

As shown in FIG. 7, in plan view, the first input terminal 51A and the second input terminal 51B are symmetrical to each other. Each of the input terminals 51A and 51B includes an exposed portion 51a exposed to the outside of the power module 1A, connection portions 51b electrically connected to the power semiconductor elements 40A and 40B, and a joint portion 51c joining the exposed portion 51a to the connection portions 51b. In the present embodiment, each of the input terminals 51A and 51B is a single-piece component in which the exposed portion 51a, the connection portions 51b, and the joint portion 51c are formed integrally. The exposed portion 51a has a through hole 51d extending through the exposed portion 51a in the thickness-wise direction Z. As the first input terminal 51A is viewed in the lateral direction Y, that is, in a side view, the first input terminal 51A is step-shaped. The exposed portion 51a of the first input terminal 51A is supported by the first terminal mount 84A. The exposed portion 51a of the second input terminal 51B is supported by the second terminal mount 84B. As shown in FIG. 7, the through hole 51d is arranged in the exposed portion 51a of the first input terminal 51A in correspondence with the nut 84N of the first terminal mount 84A. The through hole 51d is arranged in the exposed portion 51a of the second input terminal 51B in correspondence with the nut 84N of the second terminal mount 84B. The connection portions 51b are separated from each other in the lateral direction Y.

As shown in FIGS. 2, 5, and 7, the output terminal mounts 85 include a first terminal mount 85A and a second terminal mount 85B. The first terminal mount 85A and the second terminal mount 85B are aligned in the longitudinal direction X and arranged in the lateral direction Y. A portion of the first output terminal 52A is arranged on the first terminal mount 85A. The first terminal mount 85A supports the portion of the first output terminal 52A. A portion of the second output terminal 52B is arranged on the second terminal mount 85B. The second terminal mount 85B supports the portion of the second output terminal 52B. As shown in FIG. 7, a nut 85N is arranged in the first terminal mount 85A. As shown in FIG. 7, in the same manner as the first terminal mount 85A, a nut 85N is arranged in the second terminal mount 85B.

As shown in FIG. 7, in plan view, the first output terminal 52A and the second output terminal 52B are symmetrical to each other. In the present embodiment, the output terminals 52A and 52B are identical in shape to the input terminals 51A and 51B. Each of the output terminals 52A and 52B includes an exposed portion 52a exposed to the outside of the power module 1A, connection portions 52b electrically connected to the power semiconductor elements 40A and 40B, and a joint portion 52c joining the exposed portion 52a to the connection portions 52b. In the present embodiment, each of the output terminals 52A and 52B is a single-piece component in which the exposed portion 52a, the connection portions 52b, and the joint portion 52c are formed integrally. The exposed portion 52a has a through hole 52d extending through the exposed portion 52a in the thickness-wise direction Z. As the first output terminal 52A is viewed in the lateral direction Y, that is, in a side view, the first output terminal 52A is step-shaped. The exposed portion 52a of the first output terminal 52A is supported by the first terminal mount 85A. The exposed portion 52a of the second output terminal 52B is supported by the second terminal mount 85B. As shown in FIG. 7, the through hole 52d is arranged in the exposed portion 52a of the first output terminal 52A in correspondence with the nut 85N of the first terminal mount 85A. The through hole 52d is arranged in the exposed portion 52a of the second output terminal 52B in correspondence with the nut 85N of the second terminal mount 85B. The connection portions 52b are separated from each other in the lateral direction Y.

Figure 9:
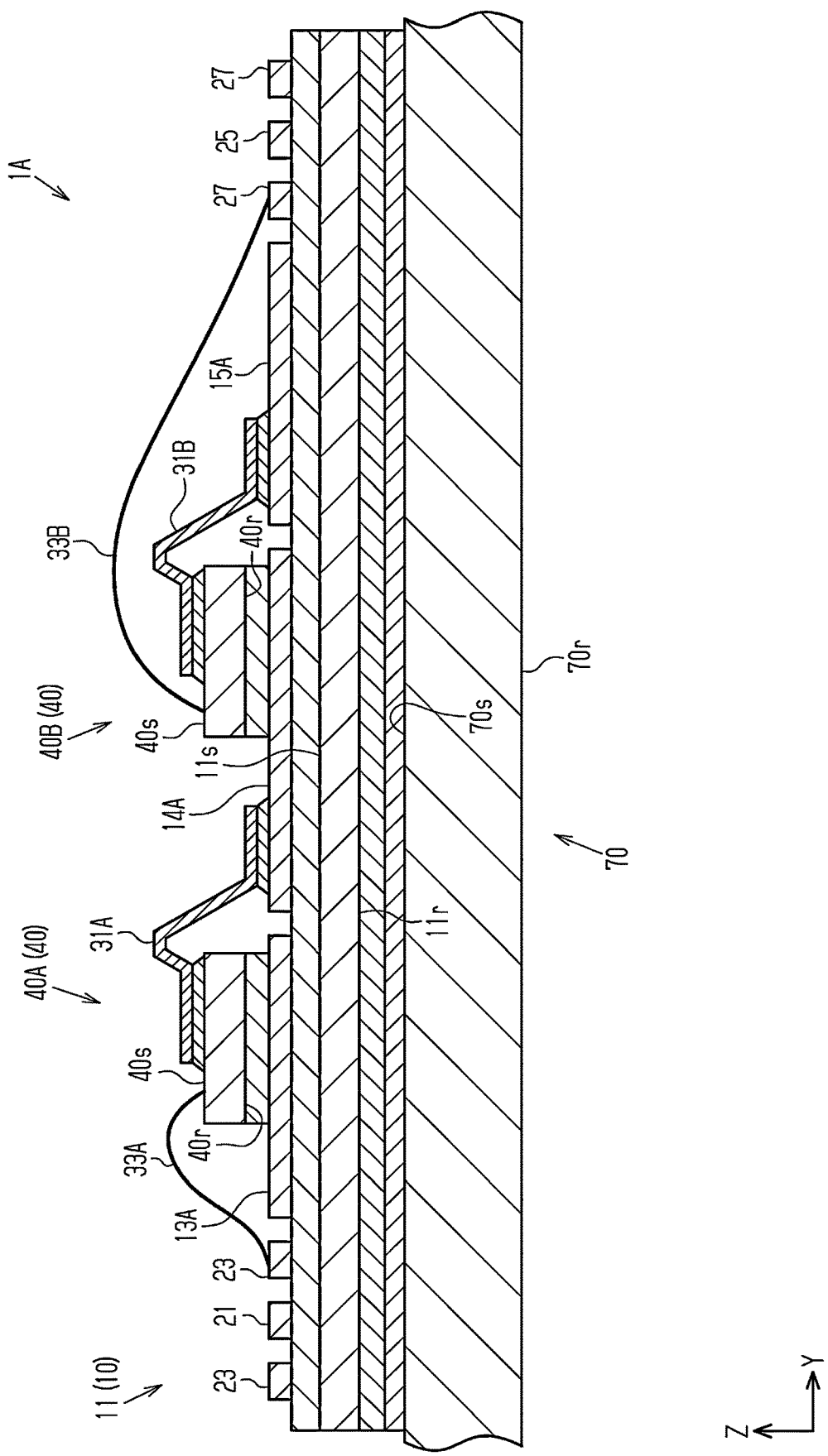
FIG. 9 is a cross-sectional view taken along line 9-9 in FIG. 7.

As shown in FIGS. 3 and 6, the heat dissipation plate 70 is attached to the case 80 to close an end of an opening in the case 80 that is open in the thickness-wise direction Z. The heat dissipation plate 70 is formed from, for example, Cu or a Cu alloy. In this case, the surface of the metal plate may be plated with nickel. As shown in FIG. 9, the heat dissipation plate 70 includes a heat dissipation main surface 70s and a heat dissipation back surface 70r that face in opposite directions in the thickness-wise direction Z. The heat dissipation back surface 70r is exposed to the outside of the power module 1A. As shown in FIG. 6, in plan view, the four corners of the heat dissipation plate 70 have support holes 71 extending through the heat dissipation plate 70 in the thickness-wise direction Z.

As shown in FIGS. 2 and 7, the attachment portions 83 are arranged on the four corners of the case 80 in plan view. Each of the attachment portions 83 has an attachment hole 83a extending through the attachment portion 83 in the thickness-wise direction Z. As viewed in the thickness-wise direction Z, the attachment portions 83 are arranged to overlap the four corners of the heat dissipation plate 70. Thus, the attachment holes 83*a* correspond to the support holes 71 in the heat dissipation plate 70 (refer to FIG. 6). When fastening members such as pins are fitted into the attachment holes 83*a* and the support holes 71, the heat dissipation plate 70 is supported by the case 80.

As shown in FIGS. 1 and 2, the case 80 includes a top plate 86. The top plate 86 closes an inner region of the power module 1A defined by the heat dissipation plate 70, the two side walls 81A and 81B, and the two terminal seats 82A and 82B. When the top plate 86 is supported by the two side walls 81A and 81B, the top plate 86 is separated from the heat dissipation plate 70 and the substrate 10 in the thickness-wise direction Z.

The inner region of the power module 1A will now be described in detail with reference to FIGS. 7 and 9 to 19. In FIGS. 15, 16, 18, and 19, double-dashed lines are auxiliary lines for defining the positional relationship between each control layer and each drive layer.

Figure 10:
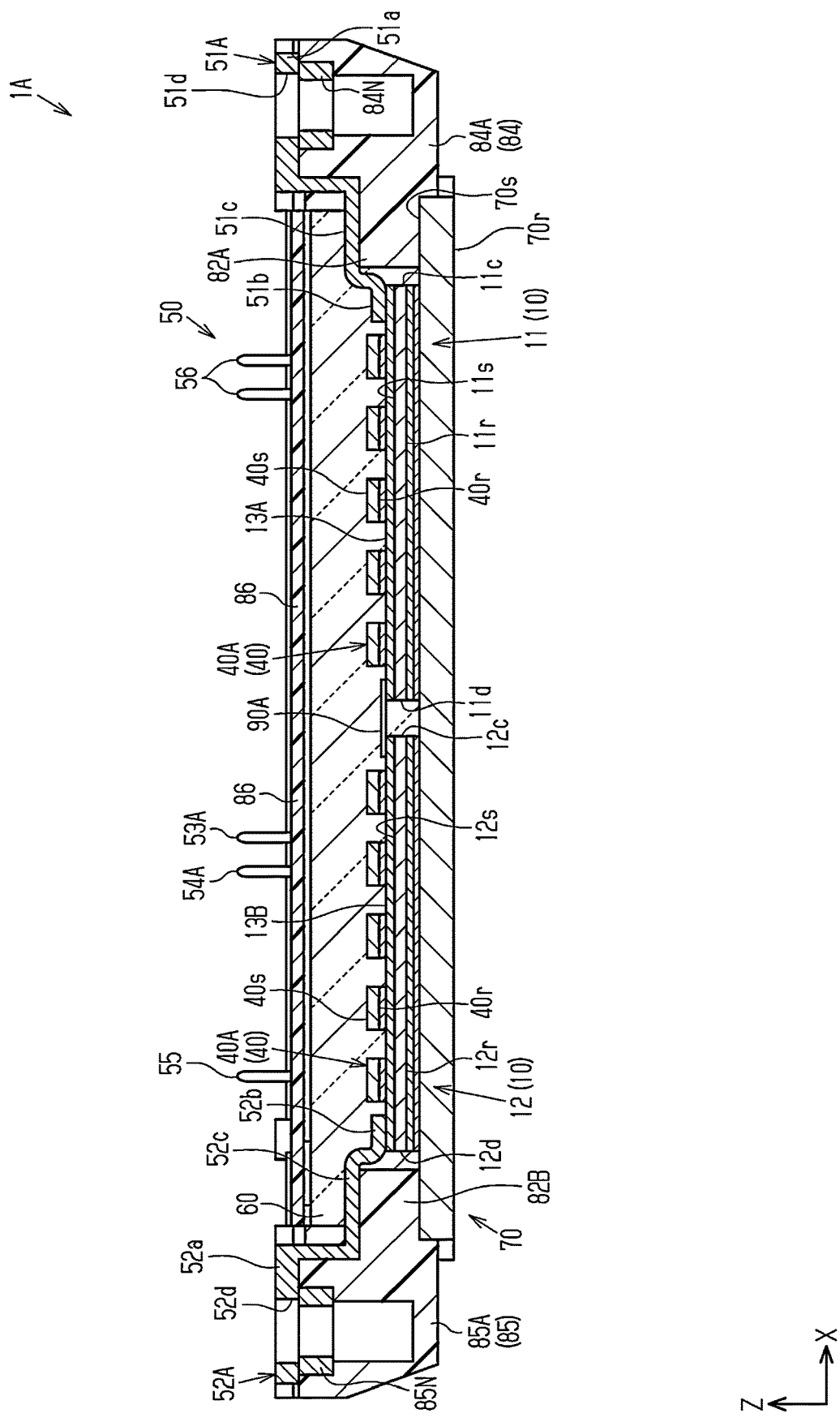
FIG. 10 is a cross-sectional view taken along line 10-10 in FIG. 7.

As shown in FIGS. 7 and 10, the inner region of the power module 1A is an open region that is surrounded by the two side walls 81A and 81B and the two terminal seats 82A and 82B of the case 80. The heat dissipation plate 70 closes one end of the open region in the thickness-wise direction Z. The inner region accommodates the substrate 10, the connection members 30, the power semiconductor elements 40, and the encapsulation resin 60 (not shown in FIG. 7).

As shown in FIG. 10, the encapsulation resin 60 is formed from an electrically-insulative resin material and fills the inner region closed by the heat dissipation plate 70 and the top plate 86. The encapsulation resin 60 encapsulates the substrate 10, the connection members 30, and the power semiconductor elements 40.

As shown in FIG. 9, the substrate 10 is bonded to the heat dissipation main surface 70*s* of the heat dissipation plate 70 by, for example, a bonding material such as silver (Ag) paste or solder. The bonding material is not limited to a conductive bonding material such as Ag paste or solder and may be electrically insulative. As shown in FIG. 7, the substrate 10 includes a first substrate 11 and a second substrate 12. The first substrate 11 and the second substrate 12 are aligned in the lateral direction Y and separated from each other in the longitudinal direction X. The first substrate 11 is located in the inner region toward the input terminals 51A and 51B in the longitudinal direction X. The second substrate 12 is located in the inner region toward the output terminals 52A and 52B in the longitudinal direction X. As shown in FIG. 10, the first substrate 11 includes a first substrate main surface 11*s* and a first substrate back surface 11*r* that face in opposite directions in the thickness-wise direction Z. The second substrate 12 includes a second substrate main surface 12*s* and a second substrate back surface 12*r* that face in opposite directions in the thickness-wise direction Z.

Each of the substrates 11 and 12 is an electrically-insulative member including a mount layer and a conductive layer. The mount layer is for mounting the power semiconductor elements 40 on the substrates 11 and 12. The conductive layer is for electrical connection with the power semiconductor elements 40. The material forming the substrates 11 and 12 is a ceramic having a superior thermal conductivity. Such a ceramic includes, for example, AlN (aluminum nitride). Each of the substrates 11 and 12 may be a direct bonding copper (DBC) substrate in which a Cu foil is bonded to the substrate main surfaces 11*s* and 12*s* and the substrate back surfaces 11*r* and 12*r*, respectively. When a DBC substrate is used, the mount layer and the conductive layer are readily formed by patterning the copper foil bonded to the substrate main surfaces 11*s* and 12*s*. In addition, the copper foil bonded to each of the substrate back surfaces 11*r* and 12*r* may be used as a thermal conducting layer.

Figure 11:
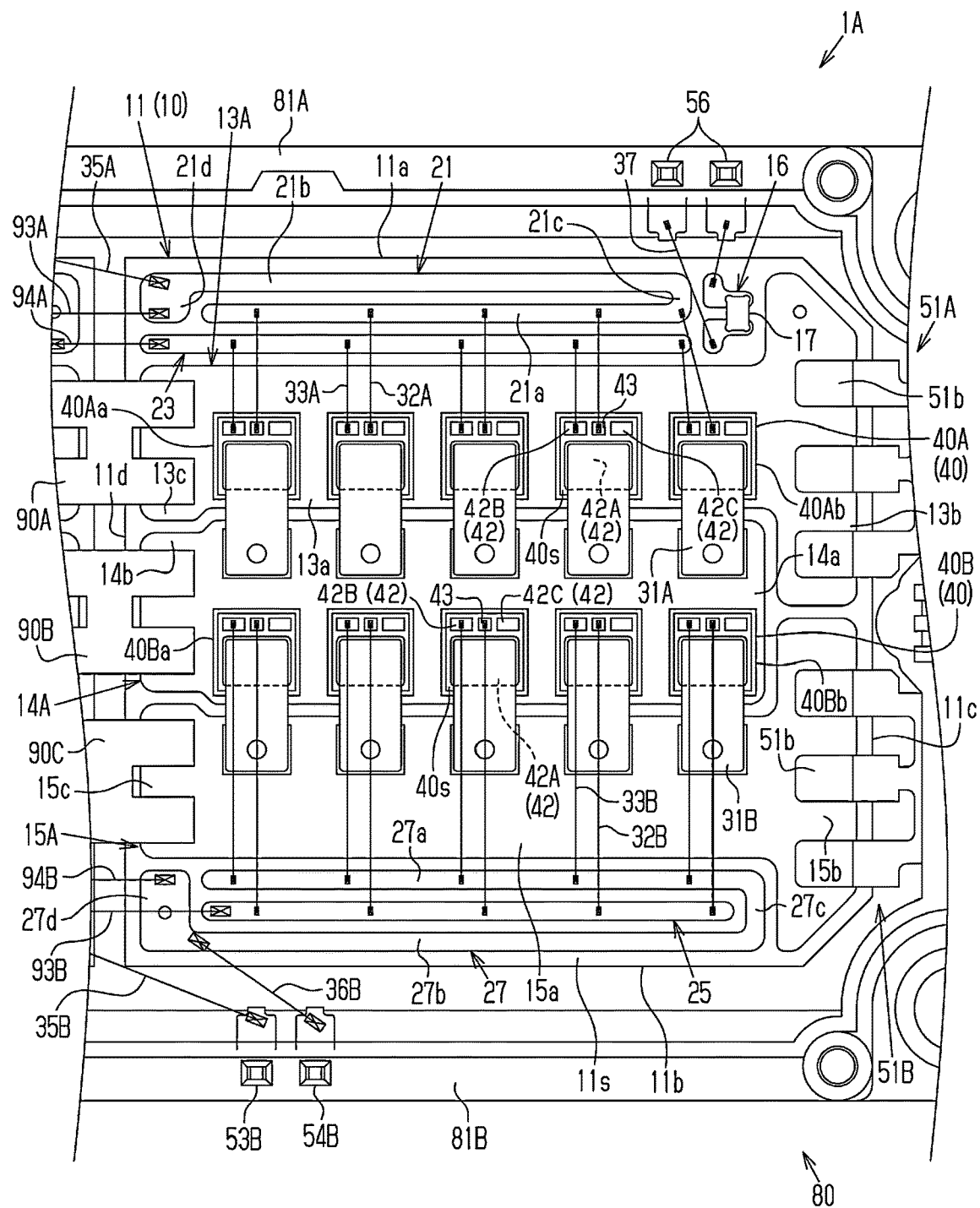
FIG. 11 is a partial enlarged view of FIG. 7.

As shown in FIGS. 7 and 11, in plan view, the first substrate 11 is rectangular so that the long sides extend in the longitudinal direction X and the short sides extend in the lateral direction Y. As shown in FIG. 11, the first substrate 11 mainly includes a first substrate side surface 11*a*, a second substrate side surface 11*b*, a third substrate side surface 11*c*, and a fourth substrate side surface 11*d*. The first substrate side surface 11*a* and the second substrate side surface 11*b* face in opposite directions in the lateral direction Y and extend in the longitudinal direction X. The first substrate side surface 11*a* is a side surface of the first substrate 11 located toward the side wall 81A. The second substrate side surface 11*b* is a side surface of the first substrate 11 located toward the side wall 81B. The third substrate side surface 11*c* and the fourth substrate side surface 11*d* face in opposite directions in the longitudinal direction X and extend in the lateral direction Y. The third substrate side surface 11*c* is a side surface of the first substrate 11 located toward the terminal seat 82A. The fourth substrate side surface 11*d* is a side surface of the first substrate 11 located toward the terminal seat 82B (refer to FIG. 7).

As shown in FIG. 11, a first mount layer 13A, a second mount layer 14A, a conductive layer 15A, a first control layer 21, a second control layer 25, a first drive layer 23, a second drive layer 27, and a thermistor mount layer 16 are arranged on the first substrate main surface 11*s* of the first substrate 11.

The first mount layer 13A, the second mount layer 14A, and the conductive layer 15A are separated in the lateral direction Y. The first mount layer 13A is located closer to the first substrate side surface 11*a* of the first substrate 11 than the second mount layer 14A and the conductive layer 15A in the lateral direction Y. The conductive layer 15A is located closer to the second substrate side surface 11*b* of the first substrate 11 than the first mount layer 13A and the second mount layer 14A in the lateral direction Y. The second mount layer 14A is located between the first mount layer 13A and the conductive layer 15A in the lateral direction Y.

The first mount layer 13A includes a main mount portion 13*a*, a terminal-side connection portion 13*b*, and an interlayer connection portion 13*c*. The main mount portion 13*a* is band-shaped and extends in the longitudinal direction X. The terminal-side connection portion 13*b* is formed on an end of the main mount portion 13*a* in the longitudinal direction X located toward the third substrate side surface 11*c* of the first substrate 11. The interlayer connection portion 13*c* is formed on an end of the main mount portion 13*a* in the longitudinal direction X located toward the fourth substrate side surface 11*d* of the first substrate 11. In the present embodiment, the first mount layer 13A is a single-piece member in which the main mount portion 13*a*, the terminal-side connection portion 13*b*, and the interlayer connection portion 13*c* are integrally formed. The terminal-side connection portion 13*b* extends in the lateral direction Y and projects from opposite ends of the main mount portion 13*a* in the lateral direction Y. The terminal-side connection portion 13*b* is arranged adjacent to the terminal seat 82A (refer to FIG. 7), that is, the first input terminal 51A, in the longitudinal direction X. The connection portions 51*b* of the first input terminal 51A are connected to the terminal-side connection portion 13*b*. The width-wise dimension of the main mount portion 13*a* (dimension of the main mount portion 13*a* in the lateral direction Y) is greater than the width-wise dimension of the first control layer 21 (dimension in a direction orthogonal to the extension direction of the first control layer 21 in plan view) and is also greater than the width-wise dimension of the first drive layer 23 (dimension of the first drive layer 23 in the lateral direction Y). The width-wise dimension of the main mount portion 13*a* is greater than or equal to two times the width-wise dimension of the first control layer 21 and the width-wise dimension of the first drive layer 23 and is preferably greater than or equal to four times. In the present embodiment, the width-wise dimension of the main mount portion 13*a* is approximately eight times the width-wise dimension of the first control layer 21 and the width-wise dimension of the first drive layer 23. The width-wise dimension of the interlayer connection portion 13*c* (dimension of the interlayer connection portion 13*c* in the lateral direction Y) is greater than the width-wise dimension of the main mount portion 13*a* (dimension of the main mount portion 13*a* in the lateral direction Y). An edge of the interlayer connection portion 13*c* in the lateral direction Y located toward the first substrate side surface 11*a* of the first substrate 11 is aligned in the lateral direction Y with an edge of the main mount portion 13*a* in the lateral direction Y located toward the first substrate side surface 11*a* of the first substrate 11. Thus, the interlayer connection portion 13*c* projects relative to the main mount portion 13*a* toward the second substrate side surface 11*b* of the first substrate 11.

The conductive layer 15A includes a main conductive portion 15*a*, a terminal-side connection portion 15*b*, and an interlayer connection portion 15*c*. The main conductive portion 15*a* is band-shaped and extends in the longitudinal direction X. The terminal-side connection portion 15*b* is formed on an end of the main conductive portion 15*a* in the longitudinal direction X located toward the third substrate side surface 11*c* of the first substrate 11. The interlayer connection portion 15*c* is formed on an end of the main conductive portion 15*a* in the longitudinal direction X located toward the fourth substrate side surface 11*d* of the first substrate 11. In the present embodiment, the conductive layer 15A is a single-piece member in which the main conductive portion 15*a*, the terminal-side connection portion 15*b*, and the interlayer connection portion 15*c* are integrally formed. The terminal-side connection portion 15*b* extends in the lateral direction Y and projects from opposite ends of the main conductive portion 15*a* in the lateral direction Y. The width-wise dimension of the main conductive portion 15*a* (dimension of the main conductive portion 15*a* in the lateral direction Y) is equal to the width-wise dimension of the main mount portion 13*a* of the first mount layer 13A (dimension of the main mount portion 13*a* in the lateral direction Y). The terminal-side connection portion 15*b* is arranged adjacent to the terminal-side connection portion 13*b* of the first mount layer 13A in the lateral direction Y. The terminal-side connection portion 15*b* is arranged adjacent to the terminal seat 82A, that is, the second input terminal 51B, in the longitudinal direction X. The connection portions 51*b* of the second input terminal 51B are connected to the terminal-side connection portion 15*b*. The width-wise dimension of the interlayer connection portion 15*c* (dimension of the interlayer connection portion 15*c* in the lateral direction Y) is greater than the width-wise dimension of the main conductive portion 15*a* (dimension of the main conductive portion 15*a* in the lateral direction Y). An edge of the interlayer connection portion 15*c* in the lateral direction Y located toward the second substrate side surface 11*b* of the first substrate 11 is aligned in the lateral direction Y with an edge of the main conductive portion 15*a* in the lateral direction Y located toward the second substrate side surface 11*b* of the first substrate 11. Thus, the interlayer connection portion 15*c* projects relative to the main conductive portion 15*a* toward the first substrate side surface 11*a* of the first substrate 11.

The second mount layer 14A is located closer to the fourth substrate side surface 11*d* of the first substrate 11 than the terminal-side connection portion 13*b* of the first mount layer 13A and the terminal-side connection portion 15*b* of the conductive layer 15A in the longitudinal direction X. The second mount layer 14A is located between the main mount portion 13*a* of the first mount layer 13A and the main conductive portion 15*a* of the conductive layer 15A in the lateral direction Y. In the present embodiment, the second mount layer 14A is located in a central portion of the first substrate 11 in the lateral direction Y. In the present embodiment, an edge of the second mount layer 14A in the longitudinal direction X located toward the fourth substrate side surface 11*d* of the first substrate 11, an edge of the main mount portion 13*a* of the first mount layer 13A in the longitudinal direction X located toward the fourth substrate side surface 11*d*, and an edge of the main conductive portion 15*a* of the conductive layer 15A in the longitudinal direction X located toward the fourth substrate side surface 11*d* are aligned in the lateral direction Y. The second mount layer 14A includes a main mount portion 14*a* and an interlayer connection portion 14*b*. The main mount portion 14*a* is band-shaped and extends in the longitudinal direction X. The interlayer connection portion 14*b* is formed on an end of the main mount portion 14*a* in the longitudinal direction X located toward the fourth substrate side surface 11*d* of the first substrate 11. In the present embodiment, the second mount layer 14A is a single-piece member in which the main mount portion 14*a* and the interlayer connection portion 14*b* are integrally formed. The width-wise dimension of the main mount portion 14*a* of the second mount layer 14A (dimension of the main mount portion 14*a* in the lateral direction Y) is greater than the width-wise dimension of the main mount portion 13*a* of the first mount layer 13A (dimension of the main mount portion 13*a* in the lateral direction Y) and the width-wise dimension of the main conductive portion 15*a* of the conductive layer 15A (dimension of the main conductive portion 15*a* in the lateral direction Y). The width-wise dimension of the interlayer connection portion 14*b* (dimension of the interlayer connection portion 14*b* in the lateral direction Y) is less than the width-wise dimension of the main mount portion 14*a*. The interlayer connection portion 14*b* is recessed in the lateral direction Y from opposite edges of the main mount portion 14*a* in the lateral direction Y.

The first control layer 21 and the first drive layer 23 are located closer to the first substrate side surface 11*a* of the first substrate 11 than the main mount portion 13*a* of the first mount layer 13A in the lateral direction Y. In addition, the first control layer 21 and the first drive layer 23 are located closer to the fourth substrate side surface 11*d* of the first substrate 11 than the terminal-side connection portion 13*b* of the first mount layer 13A in the longitudinal direction X. The first control layer 21 and the first drive layer 23 are separated from each other in the lateral direction Y. The first drive layer 23 is located closer to the main mount portion 13*a* of the first mount layer 13A than the first control layer 21. In other words, the first control layer 21 is located closer to the first substrate side surface 11*a* of the first substrate 11 than the first drive layer 23. As viewed in the lateral direction Y, the first control layer 21 overlaps the first drive layer 23.

The second control layer 25 and the second drive layer 27 are located closer to the second substrate side surface 11b of the first substrate 11 than the main conductive portion 15a of the conductive layer 15A in the lateral direction Y. In addition, the second control layer 25 and the second drive layer 27 are located closer to the fourth substrate side surface 11d of the first substrate 11 than the terminal-side connection portion 15b of the conductive layer 15A in the longitudinal direction X. The second control layer 25 and the second drive layer 27 are separated from each other in the lateral direction Y. The second drive layer 27 is located closer to the main conductive portion 15a of the conductive layer 15A than the second control layer 25. In other words, the second control layer 25 is located closer to the second substrate side surface 11b of the first substrate 11 than the second drive layer 27. As viewed in the lateral direction Y, the second drive layer 27 overlaps the second control layer 25. As viewed in the lateral direction Y, the second drive layer 27 overlaps the main conductive portion 15a of the conductive layer 15A. Thus, the first control layer 21 and the first drive layer 23 are located at the opposite side of the first mount layer 13A, the second mount layer 14A, and the conductive layer 15A from the second control layer 25 and the second drive layer 27 in the lateral direction Y.

The thermistor mount layer 16 is located closer to the first substrate side surface 11a of the first substrate 11 than the main mount portion 13a of the first mount layer 13A in the lateral direction Y. In addition, the thermistor mount layer 16 is arranged to overlap the terminal-side connection portion 13b of the first mount layer 13A, the first control layer 21, and the first drive layer 23 in the longitudinal direction X. The terminal-side connection portion 13b of the first mount layer 13A is located at the opposite side of the thermistor mount layer 16 from the first control layer 21 and the first drive layer 23 in the longitudinal direction X.

The thermistor mount layer 16 is configured to allow for the mounting of a thermistor 17, which is a temperature detection element. In the present embodiment, the thermistor 17 is mounted on the thermistor mount layer 16. The thermistor mount layer 16 includes two regions separated from each other in the lateral direction Y. One of the regions is electrically connectible to a positive electrode of the thermistor 17, and the other region is electrically connectible to a negative electrode of the thermistor 17.

Figure 12:
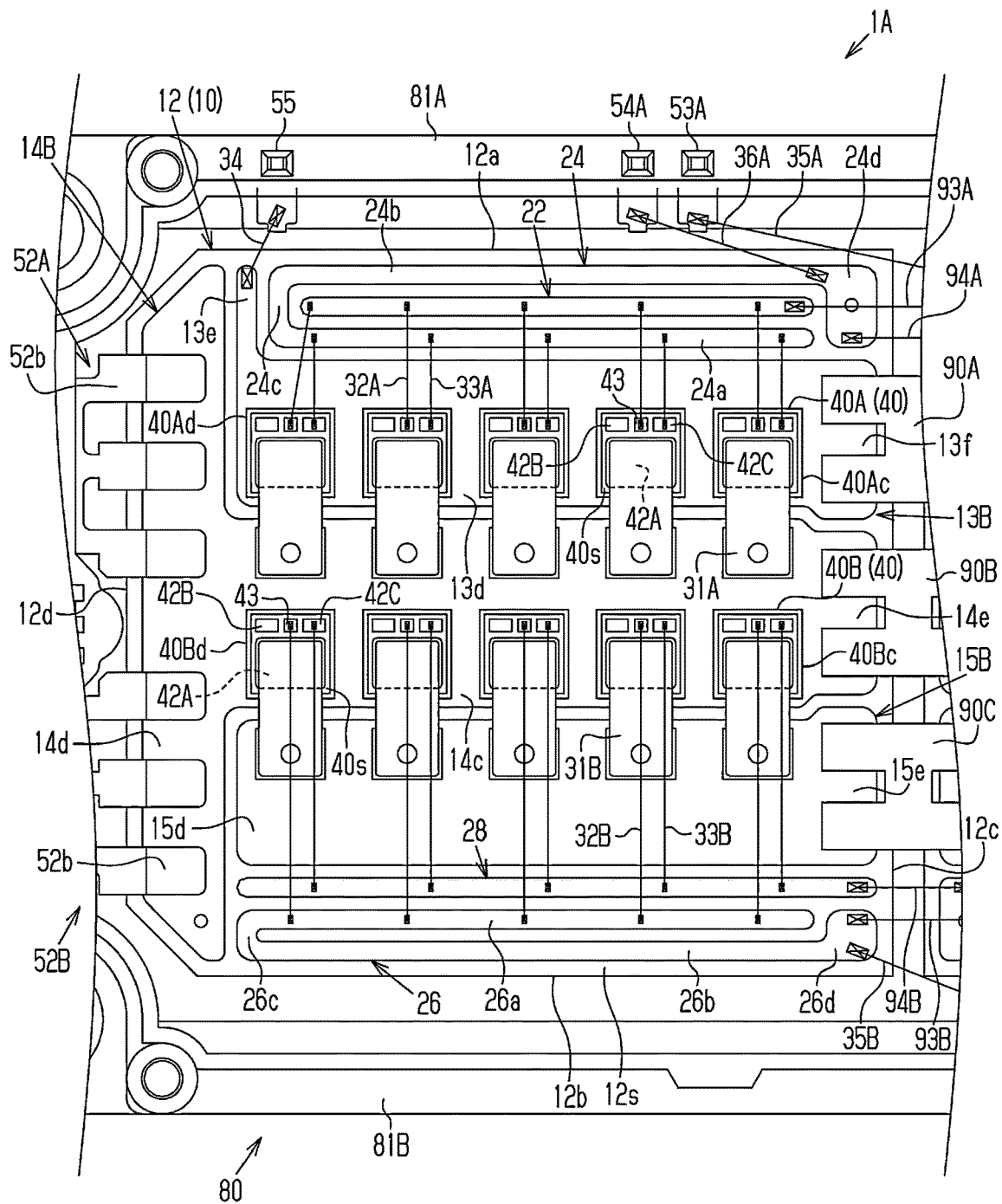
FIG. 12 is a partial enlarged view of FIG. 7.

As shown in FIGS. 7 and 12, in plan view, the second substrate 12 is rectangular so that the long sides extend in the longitudinal direction X and the short sides extend in the lateral direction Y. In the present embodiment, the second substrate 12 and the first substrate 11 are symmetrical about a centerline extending in the lateral direction Y. The second substrate 12 and the first substrate 11 are identical in size in the longitudinal direction X, the lateral direction Y, and the thickness-wise direction Z. The second substrate 12 mainly includes a first substrate side surface 12a, a second substrate side surface 12b, a third substrate side surface 12c, and a fourth substrate side surface 12d. The first substrate side surface 12a and the second substrate side surface 12b face in opposite directions in the lateral direction Y and extend in the longitudinal direction X. The first substrate side surface 12a is a side surface of the second substrate 12 located toward the side wall 81A. The second substrate side surface 12b is a side surface of the second substrate 12 located toward the side wall 81B. The third substrate side surface 12c and the fourth substrate side surface 12d face in opposite directions in the longitudinal direction X and extend in the lateral direction Y. The third substrate side surface 12c is a side surface of the second substrate 12 located toward the terminal seat 82A (refer to FIG. 7). The fourth substrate side surface 12d is a side surface of the second substrate 12 located toward the terminal seat 82B (refer to FIG. 7). The second substrate 12 and the first substrate 11 do not have to be symmetrical. The second substrate 12 and the first substrate 11 may differ in size.

As shown in FIG. 12, a first mount layer 13B, a second mount layer 14B, a conductive layer 15B, a first control layer 22, a second control layer 26, a first drive layer 24, and a second drive layer 28 are arranged on the second substrate main surface 12s of the second substrate 12.

The first mount layer 13B, the second mount layer 14B, and the conductive layer 15B are separated in the lateral direction Y. The first mount layer 13B is located closer to the first substrate side surface 12a of the second substrate 12 than the second mount layer 14B and the conductive layer 15B in the lateral direction Y. The conductive layer 15B is located closer to the second substrate side surface 12b of the second substrate 12 than the first mount layer 13B and the second mount layer 14B in the lateral direction Y. The second mount layer 14B is located between the first mount layer 13B and the conductive layer 15B in the lateral direction Y.

The first mount layer 13B includes a main mount portion 13d, a terminal-side connection portion 13e, and an interlayer connection portion 13f. The main mount portion 13d is band-shaped and extends in the longitudinal direction X. The terminal-side connection portion 13e is formed on an end of the main mount portion 13d in the longitudinal direction X located toward the fourth substrate side surface 12d of the second substrate 12. The interlayer connection portion 13f is formed on an end of the main mount portion 13d in the longitudinal direction X located toward the third substrate side surface 12c of the second substrate 12. In the present embodiment, the first mount layer 13B is a single-piece member in which the main mount portion 13d, the terminal-side connection portion 13e, and the interlayer connection portion 13f are integrally formed. The terminal-side connection portion 13e extends in the lateral direction Y and projects from the main mount portion 13d the first substrate side surface 12a of the second substrate 12 in the lateral direction Y. The width-wise dimension of the terminal-side connection portion 13e (dimension of the terminal-side connection portion 13e in the longitudinal direction X) is less than the width-wise dimension of the main mount portion 13d (dimension of the main mount portion 13d in the lateral direction Y). The width-wise dimension of the terminal-side connection portion 13e is, for example, equal to the width-wise dimension of the first control layer 22 (dimension of the first control layer 22 in the lateral direction Y). The width-wise dimension of the main mount portion 13d (dimension of the main mount portion 13d in the lateral direction Y) is greater than the width-wise dimension of the first control layer 22 (dimension of the first control layer 22 in the lateral direction Y) and is also greater than the width-wise dimension of the first drive layer 24 (dimension in a direction orthogonal to the extension direction of the first drive layer 24 in plan view). The width-wise dimension of the main mount portion 13d is greater than or equal to two times the width-wise dimension of the first control layer 22 and the width-wise dimension of the first drive layer 24 and is preferably greater than or equal to four times. In the present embodiment, the width-wise dimension of the main mount portion 13d is approximately eight times the width-wise dimension of the first control layer 22 and the width-wise dimension of the first drive layer 24. In the present embodiment, the width-wise dimension of the main mount portion 13*d* is equal to the width-wise dimension of the main mount portion 13*a* of the first mount layer 13A (refer to FIG. 11). The width-wise dimension of the interlayer connection portion 13*f* (dimension of the interlayer connection portion 13*f* in the lateral direction Y) is greater than the width-wise dimension of the main mount portion 13*d* (dimension of the main mount portion 13*d* in the lateral direction Y). An edge of the interlayer connection portion 13*f* in the lateral direction Y located toward the first substrate side surface 12*a* of the second substrate 12 is aligned in the lateral direction Y with an edge of the main mount portion 13*d* located toward the first substrate side surface 12*a* of the second substrate 12 in the lateral direction Y. Thus, the interlayer connection portion 13*f* projects relative to the main mount portion 13*d* toward the second substrate side surface 12*b* of the second substrate 12.

The conductive layer 15B includes a main conductive portion 15*d* and an interlayer connection portion 15*e*. The main conductive portion 15*d* is band-shaped and extends in the longitudinal direction X. The interlayer connection portion 15*e* is formed on an end of the main conductive portion 15*d* in the longitudinal direction X located toward the third substrate side surface 12*c* of the second substrate 12. The width-wise dimension of the main conductive portion 15*d* of the conductive layer 15B (dimension of the main conductive portion 15*d* in the lateral direction Y) is equal to the width-wise dimension of the main mount portion 13*d* of the first mount layer 13B (dimension of the main mount portion 13*d* in the lateral direction Y). The width-wise dimension of the interlayer connection portion 15*e* (dimension of the interlayer connection portion 15*e* in the lateral direction Y) is greater than the width-wise dimension of the main conductive portion 15*d* (dimension of the main conductive portion 15*d* in the lateral direction Y). An edge of the interlayer connection portion 15*e* in the lateral direction Y located toward the second substrate side surface 12*b* of the second substrate 12 is aligned in the lateral direction Y with an edge of the main conductive portion 15*d* in the lateral direction Y located toward the second substrate side surface 12*b* of the second substrate 12. Thus, the interlayer connection portion 15*e* projects relative to the main conductive portion 15*d* toward the first substrate side surface 12*a* of the second substrate 12.

The second mount layer 14B includes a main mount portion 14*c*, a terminal-side connection portion 14*d*, and an interlayer connection portion 14*e*. The main mount portion 14*c* is band-shaped and extends in the longitudinal direction X. The terminal-side connection portion 14*d* is formed on an end of the main mount portion 14*c* in the longitudinal direction X located toward the fourth substrate side surface 12*d* of the second substrate 12. The interlayer connection portion 14*e* is formed on an end of the main mount portion 14*c* in the longitudinal direction X located toward the third substrate side surface 12*c* of the second substrate 12. In the present embodiment, the second mount layer 14B is a single-piece member in which the main mount portion 14*c*, the terminal-side connection portion 14*d*, and the interlayer connection portion 14*e* are integrally formed. The main mount portion 14*c* is located between the main mount portion 13*d* of the first mount layer 13B and the conductive layer 15B in the lateral direction Y. In the present embodiment, the main mount portion 14*c* is located in a central portion of the second substrate 12 in the lateral direction Y. The width-wise dimension of the main mount portion 14*c* (dimension of the main mount portion 14*c* in the lateral direction Y) is greater than the width-wise dimension of the main mount portion 13*d* of the first mount layer 13B and the width-wise dimension of the main conductive portion 15*d* of the conductive layer 15B. An edge of the second mount layer 14B in the longitudinal direction X located toward the third substrate side surface 12*c* of the second substrate 12, an edge of the first mount layer 13B in the longitudinal direction X located toward the third substrate side surface 12*c* of the second substrate 12, and an edge of the conductive layer 15B in the longitudinal direction X located toward the third substrate side surface 12*c* of the second substrate 12 are aligned in the lateral direction Y. The terminal-side connection portion 14*d* extends in the lateral direction Y and projects from opposite ends of the main mount portion 14*c* in the lateral direction Y. Thus, the second mount layer 14B is T-shaped in plan view. The terminal-side connection portion 14*d* is located closer to the fourth substrate side surface 12*d* of the second substrate 12 than the first mount layer 13B and the conductive layer 15B. The terminal-side connection portion 14*d* is arranged adjacent to the terminal seat 82B, that is, the first output terminal 52A and the second output terminal 52B, in the longitudinal direction X. The connection portions 52*b* of the output terminals 52A and 52B are connected to the terminal-side connection portion 14*d*. The width-wise dimension of the interlayer connection portion 14*e* (dimension of the interlayer connection portion 14*e* in the lateral direction Y) is less than the width-wise dimension of the main mount portion 14*c*. The interlayer connection portion 14*e* is recessed in the lateral direction Y from opposite edges of the main mount portion 14*c* in the lateral direction Y.

The first control layer 22 and the first drive layer 24 are located closer to the first substrate side surface 12*a* of the second substrate 12 than the main mount portion 13*d* of the first mount layer 13B in the lateral direction Y. In addition, the first control layer 22 and the first drive layer 24 are located closer to the third substrate side surface 12*c* of the second substrate 12 than the terminal-side connection portion 13*e* of the first mount layer 13B in the longitudinal direction X. The first control layer 22 and the first drive layer 24 are separated from each other in the lateral direction Y. The first drive layer 24 is located closer to the main mount portion 13*d* of the first mount layer 13B than the first control layer 22. In other words, the first control layer 22 is located closer to the first substrate side surface 12*a* of the second substrate 12 than the first drive layer 24. As viewed in the lateral direction Y, the first drive layer 24 overlaps the first control layer 22. As viewed in the lateral direction Y, the first drive layer 24 overlaps the main mount portion 13*d* of the first mount layer 13B. As viewed in the longitudinal direction X, the first control layer 22 and the first drive layer 24 overlap the terminal-side connection portion 13*e* of the first mount layer 13B and the terminal-side connection portion 14*d* of the second mount layer 14B.

The second control layer 26 and the second drive layer 28 are located closer to the second substrate side surface 12*b* of the second substrate 12 than the conductive layer 15B in the lateral direction Y. In addition, the second control layer 26 and the second drive layer 28 are located closer to the third substrate side surface 12*c* of the second substrate 12 than the terminal-side connection portion 14*d* of the second mount layer 14B in the longitudinal direction X. The second control layer 26 and the second drive layer 28 are separated from each other the lateral direction Y. The second drive layer 28 is located closer to the conductive layer 15B than the second control layer 26. In other words, the second control layer 26 is located closer to the second substrate side surface 12*b* of the second substrate 12 than the second drive layer 28. As viewed in the lateral direction Y, the second drive layer 28 overlaps the second control layer 26. As viewed in the lateral direction Y, the second control layer 26 overlaps the conductive layer 15B. Thus, the first mount layer 13B, the second mount layer 14B, and the conductive layer 15B are sandwiched between the first control layer 22 and the first drive layer 24 and the second control layer 26 and the second drive layer 28 in the lateral direction Y.

As shown in FIG. 7, the main mount portion 13a and the interlayer connection portion 13c of the first mount layer 13A are aligned with the main mount portion 13d and the interlayer connection portion 13f of the first mount layer 13B in the lateral direction Y and are separated from the main mount portion 13d and the interlayer connection portion 13f of the first mount layer 13B in the longitudinal direction X. The main mount portion 14a and the interlayer connection portion 14b of the second mount layer 14A are aligned with the main mount portion 14c and the interlayer connection portion 14e of the second mount layer 14B in the lateral direction Y and are separated from the main mount portion 14c and the interlayer connection portion 14e of the second mount layer 14B in the longitudinal direction X. The main conductive portion 15a and the interlayer connection portion 15c of the conductive layer 15A are aligned with the main conductive portion 15d and the interlayer connection portion 15e of the conductive layer 15B in the lateral direction Y and are separated from the main conductive portion 15d and the interlayer connection portion 15e of the conductive layer 15B in the longitudinal direction X.

Figure 13:
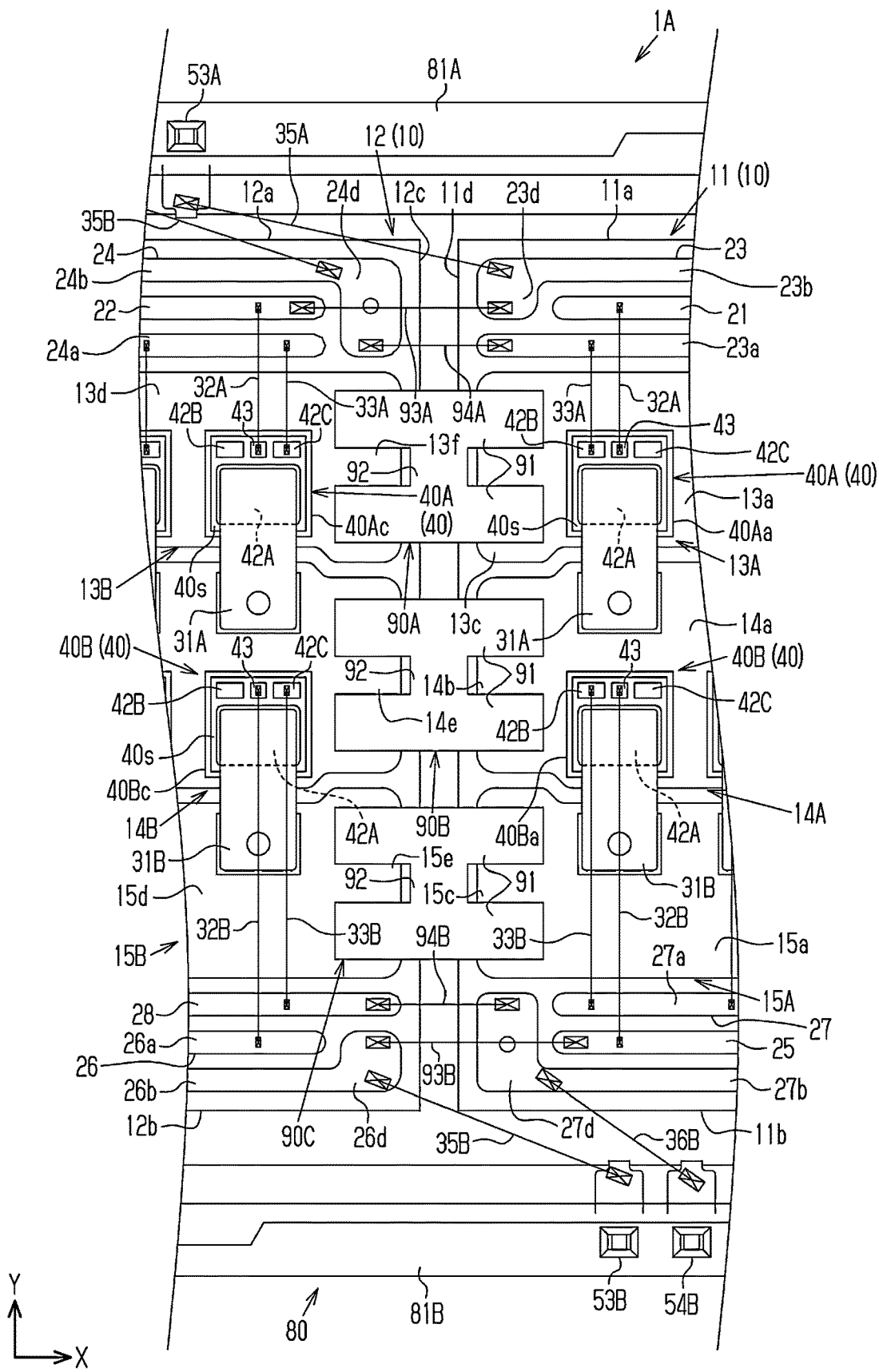
FIG. 13 is a partial enlarged view of FIG. 7.

As shown in FIG. 13, the interlayer connection portion 13c of the first mount layer 13A and the interlayer connection portion 13f of the first mount layer 13B are connected by a plate-shaped joint member 90A, which is an example of a first mount layer connection member. The interlayer connection portion 14b of the second mount layer 14A and the interlayer connection portion 14e of the second mount layer 14B are connected by a plate-shaped joint member 90B, which is an example of a second mount layer connection member. The interlayer connection portion 15c of the conductive layer 15A and the interlayer connection portion 15e of the conductive layer 15B are connected by a plate-shaped joint member 90C.

As shown in FIG. 13, in plan view, the joint members 90A to 90C are identical in shape. In an example, the joint members 90A to 90C are formed of Cu or a Cu alloy. Each of the joint members 90A to 90C includes two connectors 91 extending in the longitudinal direction X and a joint portion 92 that joins the two connectors 91 in the lateral direction Y. In the present embodiment, each of the joint members 90A to 90C is a single-piece member in which the two connectors 91 and the joint portion 92 are integrally formed. The two connectors 91 are separated from each other in the lateral direction Y and extend in the longitudinal direction X. The joint portion 92 joins center portions of the two connectors 91 in the longitudinal direction X. Thus, in plan view, each of the joint members 90A to 90C is H-shaped.

The two connectors 91 of the joint member 90A are connected to the interlayer connection portion 13c of the first mount layer 13A and the interlayer connection portion 13f of the first mount layer 13B. The joint portion 92 of the joint member 90A is located between the interlayer connection portion 13c and the interlayer connection portion 13f in the longitudinal direction X. Thus, the first mount layer 13A and the first mount layer 13B are electrically connected by the joint member 90A.

The two connectors 91 of the joint member 90B are connected to the interlayer connection portion 14b of the second mount layer 14A and the interlayer connection portion 14e of the second mount layer 14B. The joint portion 92 of the joint member 90B is located between the interlayer connection portion 14b and the interlayer connection portion 14e in the longitudinal direction X. Thus, the second mount layer 14A and the second mount layer 14B are electrically connected by the joint member 90B.

The two connectors 91 of the joint member 90C are connected to the interlayer connection portion 15c of the conductive layer 15A and the interlayer connection portion 15e of the conductive layer 15B. The joint portion 92 of the joint member 90C is located between the interlayer connection portion 15c and the interlayer connection portion 15e in the longitudinal direction X. Thus, the conductive layer 15A and the conductive layer 15B are electrically connected by the joint member 90C.

As shown in FIG. 11, the multiple (five in the present embodiment) first power semiconductor elements 40A are arranged on the main mount portion 13a of the first mount layer 13A as the power semiconductor elements 40. The first power semiconductor elements 40A are aligned in the lateral direction Y and are separated from each other in the longitudinal direction X. Therefore, the longitudinal direction X, which is a direction in which the first power semiconductor elements 40A are arranged, corresponds to a first direction recited in CLAIMS. In the present embodiment, the lateral direction Y, which is orthogonal to the longitudinal direction X as viewed in the thickness-wise direction Z, corresponds to a second direction that is orthogonal to the first direction as viewed in a thickness-wise direction. The first power semiconductor elements 40A are located on an end of the main mount portion 13a in the lateral direction Y located toward the second mount layer 14A. In the longitudinal direction X, the first power semiconductor elements 40A are not located on the terminal-side connection portion 13b and the interlayer connection portion 13c.

As shown in FIGS. 9 and 10, each first power semiconductor element 40A includes an element main surface 40s and an element back surface 40r that face in opposite directions in the thickness-wise direction Z. The element main surface 40s of the first power semiconductor element 40A corresponds to a first element main surface recited in CLAIMS. The element back surface 40r of the first power semiconductor element 40A corresponds to a first element back surface in CLAIMS. The first power semiconductor element 40A is disposed on the first mount layer 13A so that the element back surface 40r is opposed to the main mount portion 13a. The element back surface 40r is bonded to the main mount portion 13a by a conductive bonding material. An example of the conductive bonding material is Ag paste or solder. The drain electrode 41 (refer to FIG. 8), which is an example of a first drive electrode, is formed on the element back surface 40r. Thus, the drain electrode 41 is electrically connected to the first mount layer 13A. Since the first mount layer 13A is electrically connected to the first input terminal 51A, the drain electrode 41 is electrically connected to the first input terminal 51A via the first mount layer 13A.

As shown in FIG. 11, the source electrode 42, which is an example of a second drive electrode, and the gate electrode 43, which is an example of a control electrode, are formed on the element main surface 40s. The source electrode 42 includes a main source electrode 42A, a first source electrode 42B, and a second source electrode 42C.

The main source electrode 42A is formed on a portion of the element main surface 40s located toward the second mount layer 14A in the lateral direction Y. In plan view, the main source electrode 42A is rectangular so that the long sides extend in the longitudinal direction X and the short sides extend in the lateral direction Y. The main source electrode 42A occupies one half or more of the area of the element main surface 40s. A first element connection member 31A is connected to the main source electrode 42A as a connection member 30. Thus, in plan view, multiple first element connection members 31A are separated from each other in the longitudinal direction X, which conforms to the arrangement direction of the first power semiconductor elements 40A. Each first element connection member 31A is band-shaped and extends in the lateral direction Y in plan view. The first element connection member 31A is formed of, for example, a thin plate of Cu or a Cu alloy or a thin plate of aluminum (Al) or an Al alloy. The first element connection member 31A is also connected to the second mount layer 14A. More specifically, the first element connection member 31A is connected to an end of the second mount layer 14A in the lateral direction Y located toward the first mount layer 13A. Thus, the first element connection member 31A connects the main source electrode 42A of each first power semiconductor element 40A to the second mount layer 14A. Therefore, the source electrode 42 (refer to FIG. 8) of the first power semiconductor element 40A is electrically connected to the second mount layer 14A.

The first source electrode 42B, the second source electrode 42C, and the gate electrode 43 are located on an end of the element main surface 40s in the lateral direction Y located toward the first drive layer 23. The first source electrode 42B, the second source electrode 42C, and the gate electrode 43 are aligned in the lateral direction Y and are separated from each other in the longitudinal direction X. The gate electrode 43 is located between the first source electrode 42B and the second source electrode 42C in the longitudinal direction X. The gate electrode 43 is rectangular in plan view. The first source electrode 42B is located closer to the fourth substrate side surface 11d of the first substrate 11 than the gate electrode 43. The second source electrode 42C is located closer to the third substrate side surface 11c of the first substrate 11 than the gate electrode 43. In plan view, the first source electrode 42B and the second source electrode 42C are identical in shape so that the long sides extend in the longitudinal direction X and the short sides extend in the lateral direction Y.

In each first power semiconductor element 40A, the first source electrode 42B and the first drive layer 23 are connected by a first drive-side connection member 33A, and the gate electrode 43 and the first control layer 21 are connected by a first control-side connection member 32A. The first drive-side connection member 33A and the first control-side connection member 32A are connection members 30.

The multiple (five in the present embodiment) second power semiconductor elements 40B are arranged on the main mount portion 14a of the second mount layer 14A as the power semiconductor elements 40. The second power semiconductor elements 40B are aligned in the lateral direction Y and are separated from each other in the longitudinal direction X (first direction). The second power semiconductor elements 40B are located on an end of the main mount portion 14a in the lateral direction Y located toward the conductive layer 15A. In the longitudinal direction X, the second power semiconductor elements 40B are not located on the interlayer connection portion 14b.

The second power semiconductor elements 40B have the same structure as the first power semiconductor elements 40A. Therefore, the same reference characters are given to those components that are the same as the corresponding components of the first power semiconductor elements 40A. Such components will not be described in detail. In addition, the bonding structure of each the second power semiconductor element 40B to the main mount portion 14a of the second mount layer 14A is the same as the bonding structure of each first power semiconductor element 40A to the main mount portion 13a of the first mount layer 13A. Thus, the drain electrode 41 (refer to FIG. 8) of the second power semiconductor element 40B is electrically connected to the second mount layer 14A. The second mount layer 14A is connected to the output terminals 52A and 52B via the joint member 90B and the second mount layer 14B. Accordingly, the drain electrode 41 is electrically connected to the output terminals 52A and 52B by the second mount layers 14A and 14B and the joint member 90B. The drain electrode 41 of each second power semiconductor element 40B is electrically connected to the second mount layer 14A. Accordingly, the drain electrode 41 is electrically connected to the source electrode 42 of each first power semiconductor element 40A.

A second element connection member 31B is connected to the main source electrode 42A of the second power semiconductor element 40B as a connection member 30. Thus, in plan view, multiple second element connection members 31B are separated from each other in the longitudinal direction X, which conforms to the arrangement direction of the second power semiconductor elements 40B. Each second element connection member 31B is band-shaped and extends in the lateral direction Y in plan view. The second element connection member 31B is formed of, for example, a thin plate of Cu or a Cu alloy. The second element connection member 31B is also connected to the conductive layer 15A. More specifically, the second element connection member 31B is connected to an end of the main conductive portion 15a of the conductive layer 15A in the lateral direction Y located toward the second mount layer 14A. Therefore, the source electrode 42 (refer to FIG. 8) of the second power semiconductor element 40B is electrically connected to the conductive layer 15A. Since the conductive layer 15A is electrically connected to the second input terminal 51B, the source electrode 42 of each second power semiconductor element 40B is electrically connected to the second input terminal 51B.

In each second power semiconductor element 40B, the first source electrode 42B and the second drive layer 27 are connected by a second drive-side connection member 33B, and the gate electrode 43 and the second control layer 25 are connected by a second control-side connection member 32B. The second drive-side connection member 33B and the second control-side connection member 32B are connection members 30.

As shown in FIG. 12, the multiple (five in the present embodiment) first power semiconductor elements 40A are arranged on the main mount portion 13d of the first mount layer 13B as the power semiconductor elements 40. The first power semiconductor elements 40A are aligned in the lateral direction Y and are separated from each other in the longitudinal direction X (first direction). The first power semiconductor elements 40A are located on an end of the main mount portion 13d in the lateral direction Y located toward the second mount layer 14B. In the longitudinal direction X, the first power semiconductor elements 40A are not located on the terminal-side connection portion 13e and the interlayer connection portion 13f.

The drain electrodes 41 of the first power semiconductor elements 40A are electrically connected to the first mount layer 13B. Since the first mount layer 13B is electrically connected to the first input terminal 51A via the joint member 90A and the first mount layer 13A, the drain electrode 41 of each first power semiconductor element 40A is electrically connected to the first input terminal 51A.

The first element connection member 31A, which is a connection member 30, is connected to the main source electrode 42A of the first power semiconductor elements 40A. The first element connection member 31A is also connected to the second mount layer 14B. More specifically, the first element connection member 31A is connected to an end of the second mount layer 14B in the lateral direction Y located toward the first mount layer 13B. Therefore, the source electrode 42 (refer to FIG. 8) of the first power semiconductor element 40A is electrically connected to the second mount layer 14B.

In each first power semiconductor element 40A, the first source electrode 42B and the first drive layer 24 are connected by a first drive-side connection member 33A, and the gate electrode 43 and the first control layer 22 are connected by a first control-side connection member 32A. The first drive-side connection member 33A and the first control-side connection member 32A are connection members 30.

The multiple (five in the present embodiment) second power semiconductor elements 40B are arranged on the main mount portion 14c of the second mount layer 14B as the power semiconductor elements 40. The second power semiconductor elements 40B are aligned in the lateral direction Y and are separated from each other in the longitudinal direction X. The second power semiconductor elements 40B are located on an end of the main mount portion 14c in the lateral direction Y located toward the conductive layer 15B. In the longitudinal direction X, the second power semiconductor elements 40B are not located on the terminal-side connection portion 14d and the interlayer connection portion 14e.

The drain electrode 41 (refer to FIG. 8) of the second power semiconductor element 40B is electrically connected to the second mount layer 14B. The second mount layer 14B is connected to the output terminals 52A and 52B. Accordingly, the drain electrode 41 is electrically connected to the output terminals 52A and 52B via the second mount layer 14B. The drain electrode 41 of each second power semiconductor element 40B is electrically connected to the second mount layer 14B. Accordingly, the drain electrode 41 is electrically connected to the source electrode 42 of each first power semiconductor element 40A.

A second element connection member 31B is connected to the main source electrode 42A of the second power semiconductor element 40B as a connection member 30. The second element connection member 31B is also connected to the conductive layer 15B. More specifically, the second element connection member 31B is connected to an end of the main conductive portion 15d of the conductive layer 15B in the lateral direction Y located toward the second mount layer 14B. Thus, the first element connection member 31A connects the main source electrode 42A of each first power semiconductor element 40A to the second mount layer 14A. Thus, the source electrode 42 (refer to FIG. 8) of the second power semiconductor element 40B is electrically connected to the conductive layer 15B. Since the conductive layer 15B is electrically connected to the second input terminal 51B via the joint member 90C and the conductive layer 15A, the source electrode 42 of each second power semiconductor element 40B is electrically connected to the second input terminal 51B.

In each second power semiconductor element 40B, the first source electrode 42B and the second drive layer 28 are connected by a second drive-side connection member 33B, and the gate electrode 43 and the second control layer 26 are connected by a second control-side connection member 32B. The second drive-side connection member 33B and the second control-side connection member 32B are connection members 30.

The shapes of the control layers 21, 22, 25, and 26 and the drive layers 23, 24, 27, and 28 will be described. Also, the connecting structures of the power semiconductor elements 40A and 40B to the control terminals 53A and 53B and the detection terminals 54A and 54B will be described.

Figure 14:
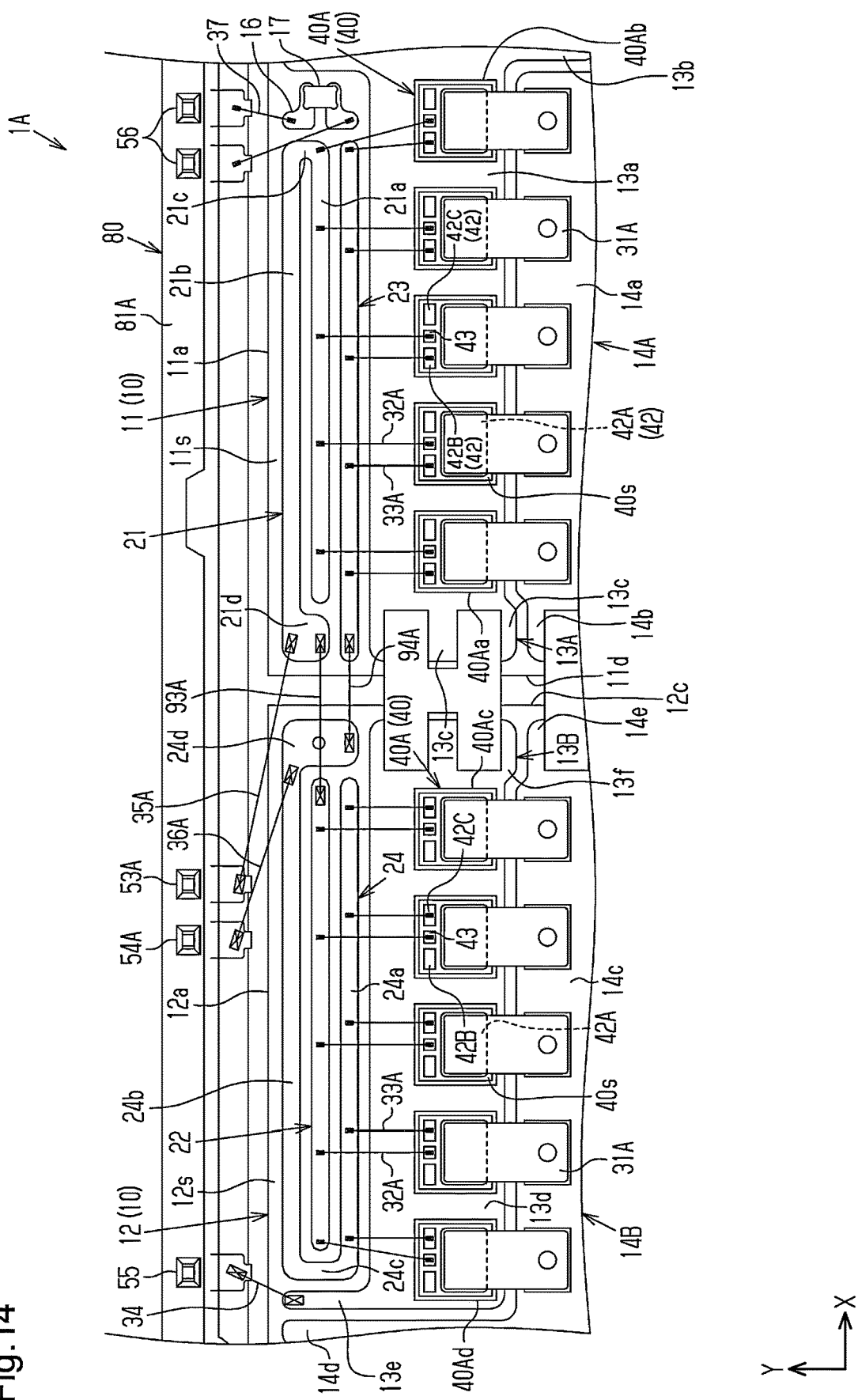
FIG. 14 is a partial enlarged view of FIG. 7.

As shown in FIG. 14, the side wall 81A of the case 80 is arranged adjacent to the first control layer 21, the first drive layer 24, and the thermistor mount layer 16 in the lateral direction Y. Accordingly, the first control terminal 53A, the first detection terminal 54A, the power supply current terminal 55, and the two temperature detection terminals 56 are arranged on the side wall 81A to be adjacent to the first control layer 21, the first drive layer 24, and the thermistor mount layer 16 in the lateral direction Y.

More specifically, the first control terminal 53A and the first detection terminal 54A are located closer to the second substrate 12 than the first control layer 21 and adjacent to the first drive layer 24 in the lateral direction Y. As viewed in the lateral direction Y, the first control terminal 53A and the first detection terminal 54A are arranged to overlap the second substrate 12. The first control terminal 53A and the first detection terminal 54A are arranged adjacent to each other in the longitudinal direction X. The first control terminal 53A and the first detection terminal 54A are located toward the third substrate side surface 12c of the second substrate 12 in the longitudinal direction X. In the longitudinal direction X, the first detection terminal 54A is located closer to the terminal seat 82B than the first control terminal 53A. The first control terminal 53A and the first control layer 21 are connected by a first control terminal-side connection member 35A, which is a connection member 30. The first detection terminal 54A and the first drive layer 23 are connected by a first detection terminal-side connection member 36A, which is a connection member 30.

As described above, the gate electrode 43 of each first power semiconductor element 40A on the first substrate 11 is electrically connected to the first control terminal 53A via the first control-side connection member 32A, the first control layer 21, and the first control terminal-side connection member 35A. The first control layer 22 is electrically connected to the first control layer 21 via a first control layer connection member 93A. Thus, the gate electrode 43 of each first power semiconductor element 40A on the second substrate 12 is electrically connected to the first control terminal 53A via the first control-side connection member 32A, the first control layer 22, the first control layer connection member 93A, the first control layer 21, and the first control terminal-side connection member 35A.

In addition, the first drive layer 23 is electrically connected to the first drive layer 24 via a first drive layer connection member 94A. Thus, the source electrode 42 of each first power semiconductor element 40A on the first substrate 11 is electrically connected to the first detection terminal 54A via the first drive-side connection member 33A, the first drive layer 24, the first drive layer connection member 94A, the first drive layer 23, and the first detection terminal-side connection member 36A. The source electrode 42 of each first power semiconductor element 40A on the second substrate 12 is electrically connected to the first detection terminal 54A via the first drive-side connection member 33A, the first drive layer 23, and the first detection terminal-side connection member 36A.

The power supply current terminal 55 is located closer to the terminal seat 82B than the first control terminal 53A and the first detection terminal 54A in the longitudinal direction X. The power supply current terminal 55 is arranged adjacent to the terminal-side connection portion 13e of the first mount layer 13B in the lateral direction Y. The power supply current terminal 55 and the first mount layer 13B are connected by a power supply detection-side connection member 34. The power supply detection-side connection member 34 is connected to an end of the terminal-side connection portion 13e of the first mount layer 13B in the lateral direction Y located toward the first substrate side surface 12a of the second substrate 12.

One of the two temperature detection terminals 56 is located closer to the third substrate side surface 11c of the first substrate 11 than the first control layer 21. The other temperature detection terminal 56 is arranged to overlap an end of the first control layer 21 located toward the third substrate side surface 11c of the first substrate 11 as viewed in the lateral direction Y. The two temperature detection terminals 56 are located adjacent to the thermistor mount layer 16 in the lateral direction Y. The two temperature detection terminals 56 and the thermistor mount layer 16 are connected by thermistor-side connection members 37, which are connection members 30. The thermistor-side connection members 37 include two wires formed by wire bonding. One of the wires connects one of the two regions of the thermistor mount layer 16 to one of the two temperature detection terminals 56. The other wire connects the other one of the two regions of the thermistor mount layer 16 to the other one of the two temperature detection terminals 56. Thus, the thermistor 17 and the temperature detection terminals 56 are electrically connected by the thermistor-side connection members 37.

Figure 15:
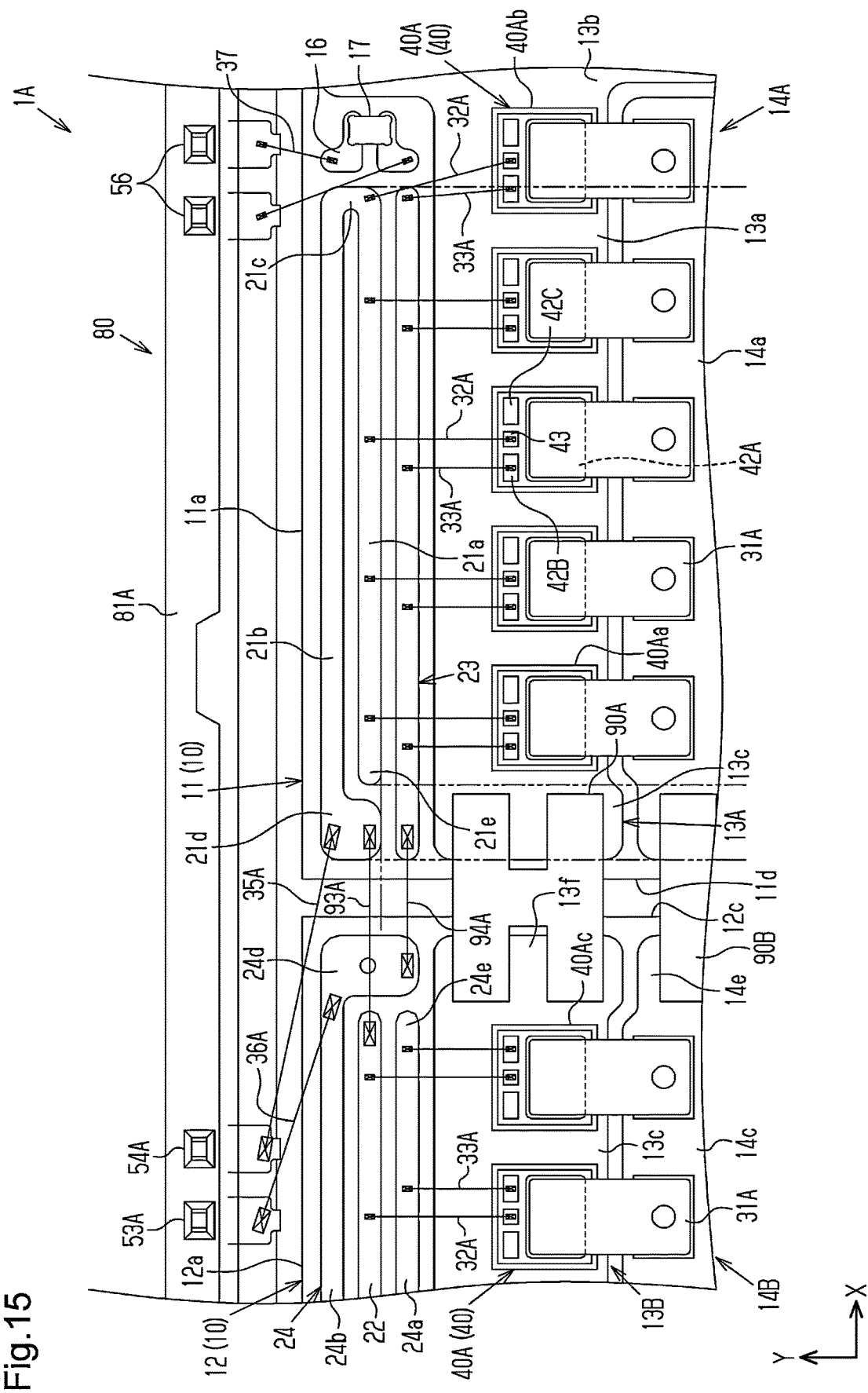
FIG. 15 is a partial enlarged view of FIG. 14.

As shown in FIG. 15, the first control layer 21 includes a first control-side wiring portion 21a, a first control-side detour portion 21b, a first control-side joint portion 21c, and a first control-side connector 21d. In the present embodiment, the first control layer 21 is a single-piece member in which the first control-side wiring portion 21a, the first control-side detour portion 21b, the first control-side joint portion 21c, and the first control-side connector 21d are integrally formed. The first control layer 21 is formed of, for example, a copper foil. In plan view, the first control-side wiring portion 21a, the first control-side detour portion 21b, and the first control-side joint portion 21c are slim-band-shaped.

The first control-side wiring portion 21a extends in the longitudinal direction X. The first control-side wiring portion 21a has an end 21e located toward the fourth substrate side surface 11d of the first substrate 11 in the longitudinal direction X. The end 21e is located closer to the fourth substrate side surface 11d of the first substrate 11 than a first power semiconductor element 40Aa that is one of the first power semiconductor elements 40A located closest to the fourth substrate side surface 11d in the longitudinal direction X. The end 21e overlaps the interlayer connection portion 13c of the first mount layer 13A as viewed in the lateral direction Y. As viewed in the lateral direction Y, the first control-side wiring portion 21a extends in the longitudinal direction X and overlaps four of the first power semiconductor elements 40A excluding a first power semiconductor element 40Ab that is located closest to the third substrate side surface 11c.

The first control-side connection member 32A connected to each first power semiconductor element 40A is connected to the first control-side wiring portion 21a. The first control-side connection members 32A are separated from each other in the longitudinal direction X, which conforms to the arrangement direction of the first power semiconductor elements 40A. The first control-side connection members 32A that are connected to the first power semiconductor elements 40A excluding the first power semiconductor element 40Ab extend in the lateral direction Y in plan view. The first control-side connection member 32A that is connected to the first power semiconductor element 40Ab is connected to the first control-side joint portion 21c. The gate electrode 43 of the first power semiconductor element 40Ab is located closer to the third substrate side surface 11c of the first substrate 11 than the first control-side joint portion 21c in the longitudinal direction X. Hence, the first control-side connection member 32A connected to the first power semiconductor element 40Ab is inclined toward the fourth substrate side surface 11d of the first substrate 11 as the first control-side connection member 32A extends toward the first control-side joint portion 21c.

The first control-side detour portion 21b is separated from the first control-side wiring portion 21a in the lateral direction Y. The first control-side detour portion 21b and the first drive layer 23 are located at opposite sides of the first control-side wiring portion 21a in the lateral direction Y. The first control-side detour portion 21b extends in the longitudinal direction X. The first control-side detour portion 21b is longer than the first control-side wiring portion 21a in the longitudinal direction X. As shown in FIG. 15, the first control-side connection members 32A are not connected at the first control-side detour portion 21b. That is, the first control-side connection members 32A are electrically connected to the first control-side detour portion 21b but are not in physical contact with the first control-side detour portion 21b.

The first control-side joint portion 21c joins the first control-side wiring portion 21a and the first control-side detour portion 21b. More specifically, the first control-side joint portion 21c joins an end of the first control-side wiring portion 21a in the longitudinal direction X located toward the third substrate side surface 11c of the first substrate 11 and an end of the first control-side detour portion 21b in the longitudinal direction X located toward the third substrate side surface 11c. The first control-side joint portion 21c extends in the lateral direction Y. As viewed in the lateral direction Y, the first control-side joint portion 21c is arranged to overlap an end of the first power semiconductor element 40Ab in the longitudinal direction X located toward the fourth substrate side surface 11d of the first substrate 11.

The first control-side connector 21d is formed on a distal end of the first control-side detour portion 21b. The first control-side connector 21d is located closer to the fourth substrate side surface 11d of the first substrate 11 than the first control-side wiring portion 21a in the longitudinal direction X. The first control-side connector 21d extends in the lateral direction Y. The width-wise dimension of the first control-side connector 21d (dimension of the first control-side connector 21d in the longitudinal direction X) is greater than the width-wise dimension of the first control-side detour portion 21b (dimension of the first control-side detour portion 21b in the lateral direction Y). The first control-side connector 21d is separated from the first control-side wiring portion 21a in the longitudinal direction X when the edge of the first control-side connector 21d in the lateral direction Y located toward the first drive layer 23 is aligned in the lateral direction Y with the edge of the first control-side wiring portion 21a in the lateral direction Y located toward the first drive layer 23.

The first drive layer 23 extends in the longitudinal direction X. In plan view, the first drive layer 23 is slim-band-shaped. In the present embodiment, the width-wise dimension of the first drive layer 23 (dimension of the first drive layer 23 in the lateral direction Y) is equal to the width-wise dimension of the first control layer 21 in the first control-side wiring portion 21a (dimension of the first control-side wiring portion 21a in the lateral direction Y). The width-wise dimension of the first drive layer 23 is also equal to the width-wise dimension of the first control layer 21 in the first control-side detour portion 21b (dimension of the first control-side detour portion 21b in the lateral direction Y).

When the difference in the dimension in the lateral direction Y between the first drive layer 23 and the first control-side wiring portion 21a of the first control layer 21 is within, for example, 5% of the dimension of the first control-side wiring portion 21a of the first control layer 21 in the lateral direction Y, the width-wise dimension of the first drive layer 23 may be considered to be equal to the width-wise dimension of the first control-side wiring portion 21a of the first control layer 21. When the difference in the dimension in the lateral direction Y between the first drive layer 23 and the first control-side detour portion 21b of the first control layer 21 is within, for example, 5% of the dimension of the first control-side detour portion 21b of the first control layer 21 in the lateral direction Y, the width-wise dimension of the first drive layer 23 may be considered to be equal to the width-wise dimension of the first control-side detour portion 21b of the first control layer 21.

The first drive layer 23 is longer than the first control-side wiring portion 21a of the first control layer 21 in the longitudinal direction X. The first drive layer 23 is also longer than the first control-side detour portion 21b of the first control layer 21 in the longitudinal direction X. As viewed in the lateral direction Y, the end of the first drive layer 23 in the longitudinal direction X located toward the third substrate side surface 11c of the first substrate 11 is aligned with the first control-side joint portion 21c of the first control layer 21. As viewed in the lateral direction Y, the end of the first drive layer 23 in the longitudinal direction X located toward the fourth substrate side surface 11d of the first substrate 11 is aligned with the first control-side connector 21d of the first control layer 21. Further, as viewed in the lateral direction Y, the first control-side connector 21d of the first control layer 21 and the end of the first drive layer 23 in the longitudinal direction X located toward the fourth substrate side surface 11d of the first substrate 11 are aligned with the interlayer connection portion 13c of the first mount layer 13A.

The first drive-side connection member 33A connected to each first power semiconductor element 40A is connected to the first drive layer 23. The first drive-side connection members 33A are separated from each other in the longitudinal direction X, which conforms to the arrangement direction of the first power semiconductor elements 40A. The first drive-side connection members 33A that are connected to the first power semiconductor elements 40A extend in the lateral direction Y in plan view.

Figure 16:
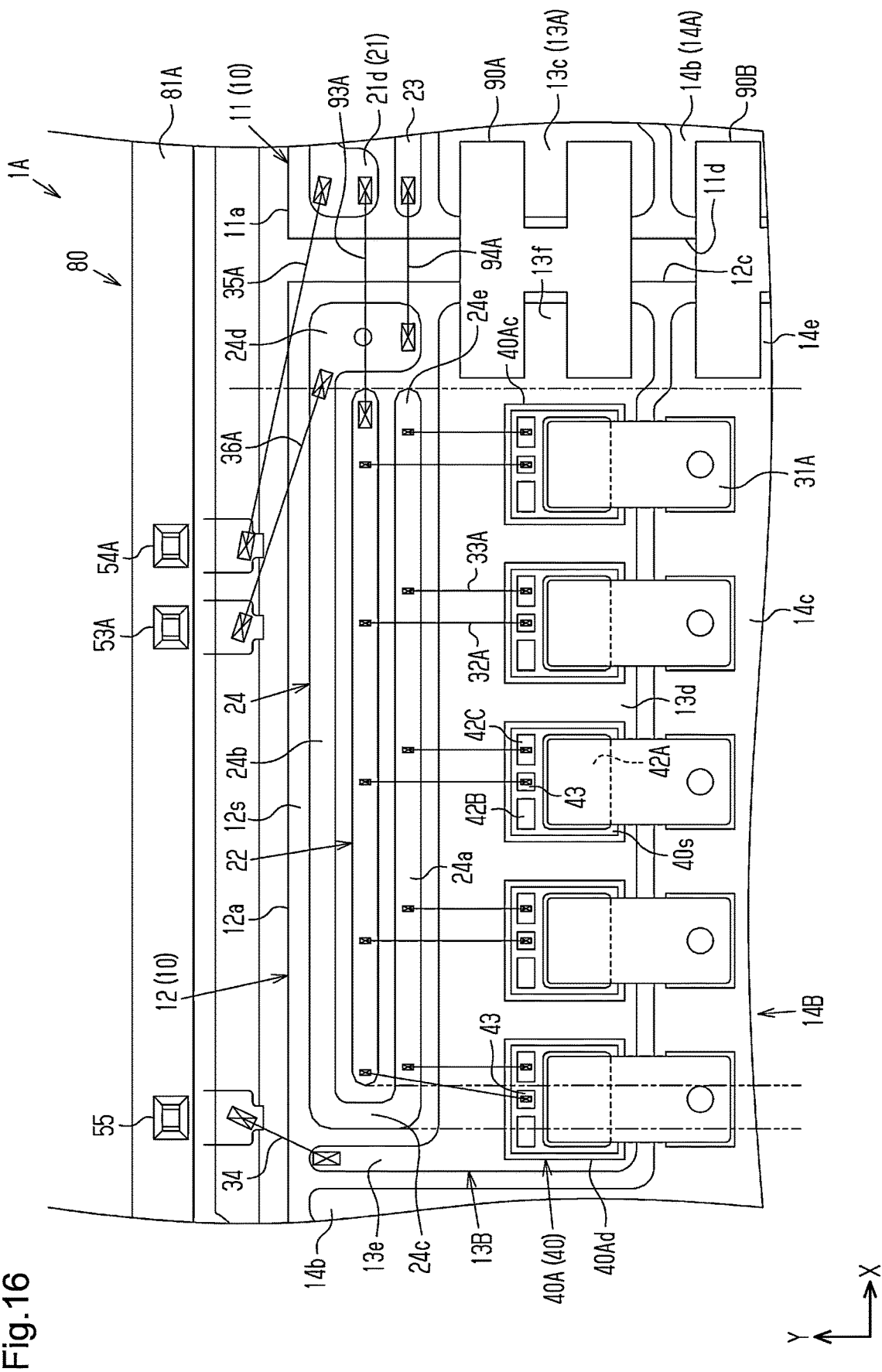
FIG. 16 is a partial enlarged view of FIG. 14.

As shown in FIG. 16, the first drive layer 24 includes a first drive-side wiring portion 24a, a first drive-side detour portion 24b, a first drive-side joint portion 24c, and a first drive-side connector 24d. In the present embodiment, the first drive layer 24 is a single-piece member in which the first drive-side wiring portion 24a, the first drive-side detour portion 24b, the first drive-side joint portion 24c, and the first drive-side connector 24d are integrally formed. The first drive layer 24 is formed of, for example, a copper foil. In plan view, the first drive-side wiring portion 24a, the first drive-side detour portion 24b, and the first drive-side joint portion 24c are slim-band-shaped.

The first drive-side wiring portion 24a extends in the longitudinal direction X. The first drive-side wiring portion 24a has an end 24e located toward the third substrate side surface 12c of the second substrate 12 in the longitudinal direction X. The end 24e is located closer to the third substrate side surface 12c of the second substrate 12 than a first power semiconductor element 40Ac that is one of the first power semiconductor elements 40A located closest to the third substrate side surface 12c in the longitudinal direction X.

The first drive-side connection member 33A connected to each first power semiconductor element 40A is connected to the first drive-side wiring portion 24a. The first drive-side connection members 33A are separated from each other in the longitudinal direction X, which conforms to the arrangement direction of the first power semiconductor elements 40A. The first drive-side connection members 33A that are connected to the first power semiconductor elements 40A extend in the lateral direction Y in plan view.

The first drive-side detour portion 24b is separated from the first drive-side wiring portion 24a in the lateral direction Y. The first drive-side detour portion 24b and the first drive-side wiring portion 24a are located at opposite sides of the first control layer 22 in the lateral direction Y. The first drive-side detour portion 24b extends in the longitudinal direction X. The first drive-side detour portion 24b is slightly longer than the first drive-side wiring portion 24a in the longitudinal direction X. As shown in FIG. 16, the first drive-side connection members 33A are not connected at the first drive-side detour portion 24b. That is, the first drive-side connection members 33A are electrically connected to the first drive-side detour portion 24b but are not in physical contact with the first drive-side detour portion 24b.

The first drive-side joint portion 24c joins the first drive-side wiring portion 24a and the first drive-side detour portion 24b. More specifically, the first drive-side joint portion 24c joins an end of the first drive-side wiring portion 24a in the longitudinal direction X located toward the fourth substrate side surface 12d of the second substrate 12 and an end of the first drive-side detour portion 24b in the longitudinal direction X located toward the fourth substrate side surface 12d. The first drive-side joint portion 24c extends in the lateral direction Y. The first drive-side joint portion 24c is arranged adjacent to the terminal-side connection portion 13e of the first mount layer 13B in the longitudinal direction X. As viewed in the lateral direction Y, the first drive-side joint portion 24c is arranged to overlap a first power semiconductor element 40Ad that is one of the first power semiconductor elements 40A located closest to the fourth substrate side surface 12d of the second substrate 12 in the longitudinal direction X.

The first drive-side connector 24d is formed on a distal end of the first drive-side detour portion 24b. The first drive-side connector 24d is located closer to the third substrate side surface 12c of the second substrate 12 than the first drive-side wiring portion 24a in the longitudinal direction X. The first drive-side connector 24d extends in the lateral direction Y. The first drive-side connector 24*d* is arranged adjacent to the interlayer connection portion 13*f* of the first mount layer 13B in the lateral direction Y. The width-wise dimension of the first drive-side connector 24*d* (dimension of the first drive-side connector 24*d* in the longitudinal direction X) is greater than the width-wise dimension of the first drive-side detour portion 24*b* (dimension of the first drive-side detour portion 24*b* in the lateral direction Y). The first drive-side connector 24*d* is separated from the first drive-side wiring portion 24*a* in the longitudinal direction X when the edge of the first drive-side connector 24*d* in the lateral direction Y located toward the first mount layer 13B is aligned in the lateral direction Y with the edge of the first drive-side wiring portion 24*a* in the lateral direction Y located toward the first mount layer 13B.

The first control layer 22 extends in the longitudinal direction X. In plan view, the first control layer 22 is slim-band-shaped. In the present embodiment, the width-wise dimension of the first control layer 22 (dimension of the first control layer 22 in the lateral direction Y) is equal to the width-wise dimension of the first drive-side wiring portion 24*a* of the first drive layer 24 (dimension of the first drive-side wiring portion 24*a* in the lateral direction Y). The width-wise dimension of the first control layer 22 is also equal to the width-wise dimension of the first drive-side detour portion 24*b* of the first drive layer 24 (dimension of the first drive-side detour portion 24*b* in the lateral direction Y).

When the difference in the dimension in the lateral direction Y between the first control layer 22 and the first drive-side wiring portion 24*a* of the first drive layer 24 is within, for example, 5% of the dimension of the first drive-side wiring portion 24*a* of the first drive layer 24 in the lateral direction Y, the width-wise dimension of the first control layer 22 may be considered to be equal to the width-wise dimension of the first drive-side wiring portion 24*a* of the first drive layer 24. When the difference in the dimension in the lateral direction Y between the first control layer 22 and the first drive-side detour portion 24*b* of the first drive layer 24 is within, for example, 5% of the dimension of the first drive-side detour portion 24*b* of the first drive layer 24 in the lateral direction Y, the width-wise dimension of the first control layer 22 may be considered to be equal to the width-wise dimension of the first drive-side detour portion 24*b* of the first drive layer 24.

The first control layer 22 is slightly shorter than the first drive-side wiring portion 24*a* of the first drive layer 24 in the longitudinal direction X. As viewed in the lateral direction Y, the end of the first control layer 22 in the longitudinal direction X located toward the third substrate side surface 12*c* of the second substrate 12 is aligned with the end 24*e* of the first drive-side wiring portion 24*a* of the first drive layer 24. As viewed in the longitudinal direction X, the first control layer 22 overlaps the first drive-side connector 24*d* of the first drive layer 24.

The first control-side connection member 32A connected to each first power semiconductor element 40A of the second substrate 12 is connected to the first control layer 22. The first control-side connection members 32A are separated from each other in the longitudinal direction X, which conforms to the arrangement direction of the first power semiconductor elements 40A. The first control-side connection member 32A that are connected to the four first power semiconductor elements 40A excluding the first power semiconductor element 40A*d*, which is located closest to the fourth substrate side surface 12*d* of the second substrate 12 among the first power semiconductor elements 40A, extend in the lateral direction Y in plan view. The gate electrode 43 of the first power semiconductor element 40A*d* is located closer to the fourth substrate side surface 12*d* of the second substrate 12 than the first control layer 22. Hence, the first control-side connection member 32A connected to the first power semiconductor element 40A*d* is inclined toward the third substrate side surface 12*c* as the first control-side connection member 32A extends toward the first substrate side surface 12*a* of the second substrate 12.

As shown in FIGS. 14 to 16, the first control terminal-side connection member 35A and the first control layer connection member 93A are connected to the first control-side connector 21*d*. More specifically, the first control terminal-side connection member 35A is connected to an end of the first control-side connector 21*d* in the lateral direction Y located toward the first substrate side surface 11*a* of the first substrate 11.

The first control layer connection member 93A is connected to an end of the first control-side connector 21*d* in the lateral direction Y located toward the first drive layer 23. The first control layer connection member 93A is also connected to an end of the first control layer 22 in the longitudinal direction X located toward the third substrate side surface 12*c* of the second substrate 12. In plan view, the first control layer connection member 93A extends in the longitudinal direction X. As shown in FIG. 16, the first control layer connection member 93A extends over the first drive-side connector 24*d* of the first drive layer 24 in the longitudinal direction X.

The first detection terminal-side connection member 36A and the first drive layer connection member 94A are connected to the first drive-side connector 24*d*. More specifically, the first detection terminal-side connection member 36A is connected to an end of the first drive-side connector 24*d* in the lateral direction Y located toward the first substrate side surface 12*a* of the second substrate 12.

The first drive layer connection member 94A is connected to an end of the first drive layer 23 in the longitudinal direction X located toward the fourth substrate side surface 11*d* of the first substrate 11. The first drive layer connection member 94A is connected to an end of the first drive-side connector 24*d* in the lateral direction Y located toward the first mount layer 13B. In plan view, the first drive layer connection member 94A extends in the longitudinal direction X.

Figure 17:
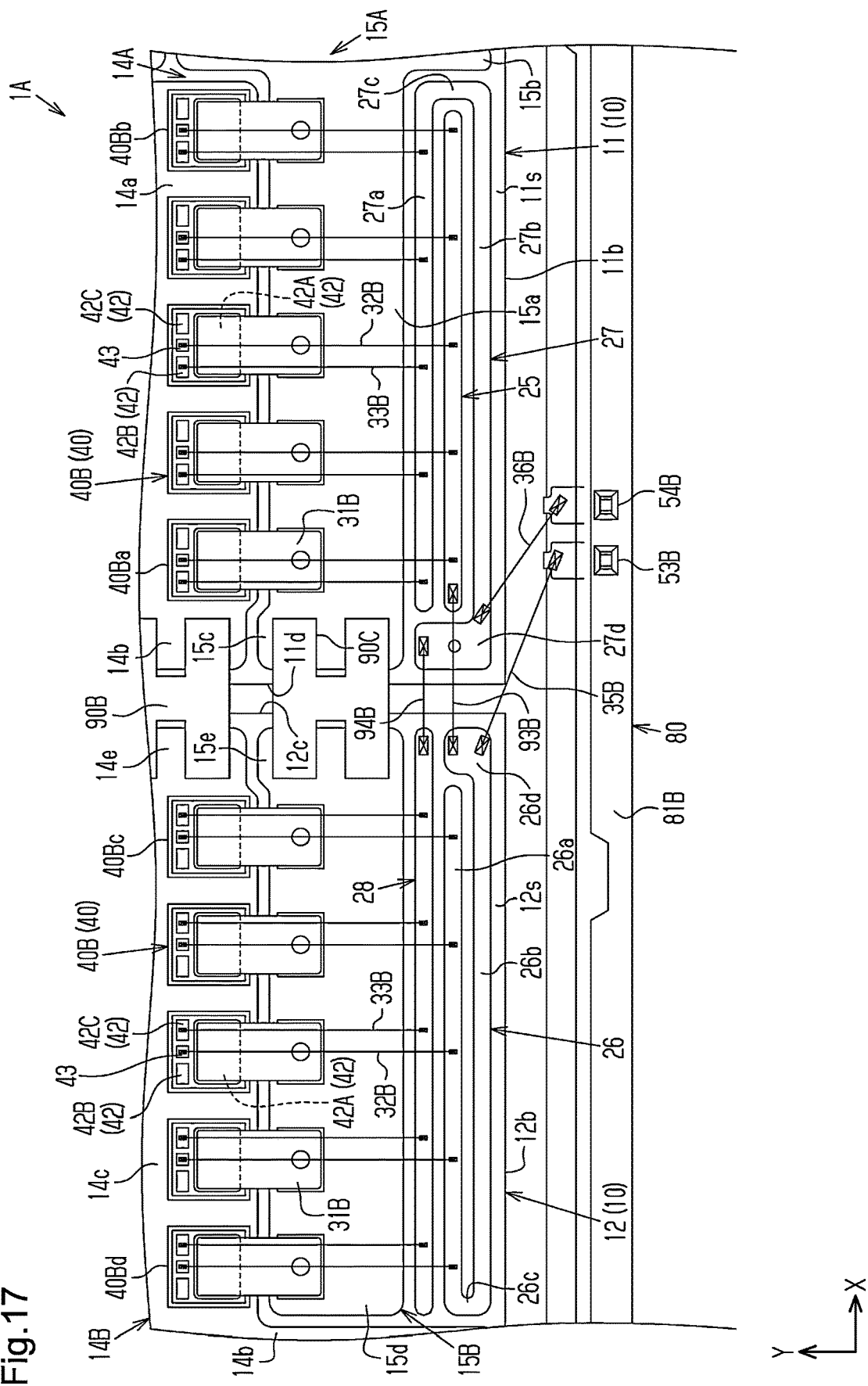
FIG. 17 is a partial enlarged view of FIG. 7.

As shown in FIG. 17, the side wall 81B of the case 80 is arranged adjacent to the second control layer 26 and the second drive layer 27 in the lateral direction Y. Accordingly, the second control terminal 53B and the second detection terminal 54B are arranged on the side wall 81B to be adjacent to the second control layer 26 and the second drive layer 27 in the lateral direction Y.

More specifically, the second control terminal 53B and the second detection terminal 54B are located closer to the first substrate 11 than the second control layer 26 and adjacent to the second drive layer 27 in the lateral direction Y. As viewed in the lateral direction Y, the second control terminal 53B and the second detection terminal 54B are arranged to overlap the first substrate 11. The second control terminal 53B and the second detection terminal 54B are arranged adjacent to each other in the longitudinal direction X. The second control terminal 53B and the second detection terminal 54B are located toward the fourth substrate side surface 11*d* of the first substrate 11 in the longitudinal direction X. In the longitudinal direction X, the second detection terminal 54B is located closer to the terminal seat 82A than the second control terminal 53B. The second control terminal 53B and the second control layer 26 are connected by a second control terminal-side connection member 35B, which is a connection member 30. The second detection terminal 54B and the second drive layer 27 are connected by a second detection terminal-side connection member 36B, which is a connection member 30.

The second control layer 25 is electrically connected to the second control layer 26 by a second control layer connection member 93B. Thus, the gate electrode 43 of each second power semiconductor element 40B on the first substrate 11 is electrically connected to the second control terminal 53B via the second control-side connection member 32B, the second control layer 25, the second control layer connection member 93B, the second control layer 26, and the second control terminal-side connection member 35B. The gate electrode 43 of each second power semiconductor element 40B on the second substrate 12 is electrically connected to the first control terminal 53A via the second control-side connection member 32B, the second control layer 26, and the second control terminal-side connection member 35B.

Also, the source electrode 42 of each second power semiconductor element 40B on the first substrate 11 is electrically connected to the second detection terminal 54B via the second drive-side connection member 33B, the second drive layer 27, and the second detection terminal-side connection member 36B. In addition, the second drive layer 28 is electrically connected to the second drive layer 27 via a second drive layer connection member 94B. Thus, the source electrode 42 of each second power semiconductor element 40B on the second substrate 12 is electrically connected to the second detection terminal 54B via the second drive-side connection member 33B, the second drive layer 27, the second drive layer connection member 94B, the second drive layer 28, and the second detection terminal-side connection member 36B.

Figure 18:
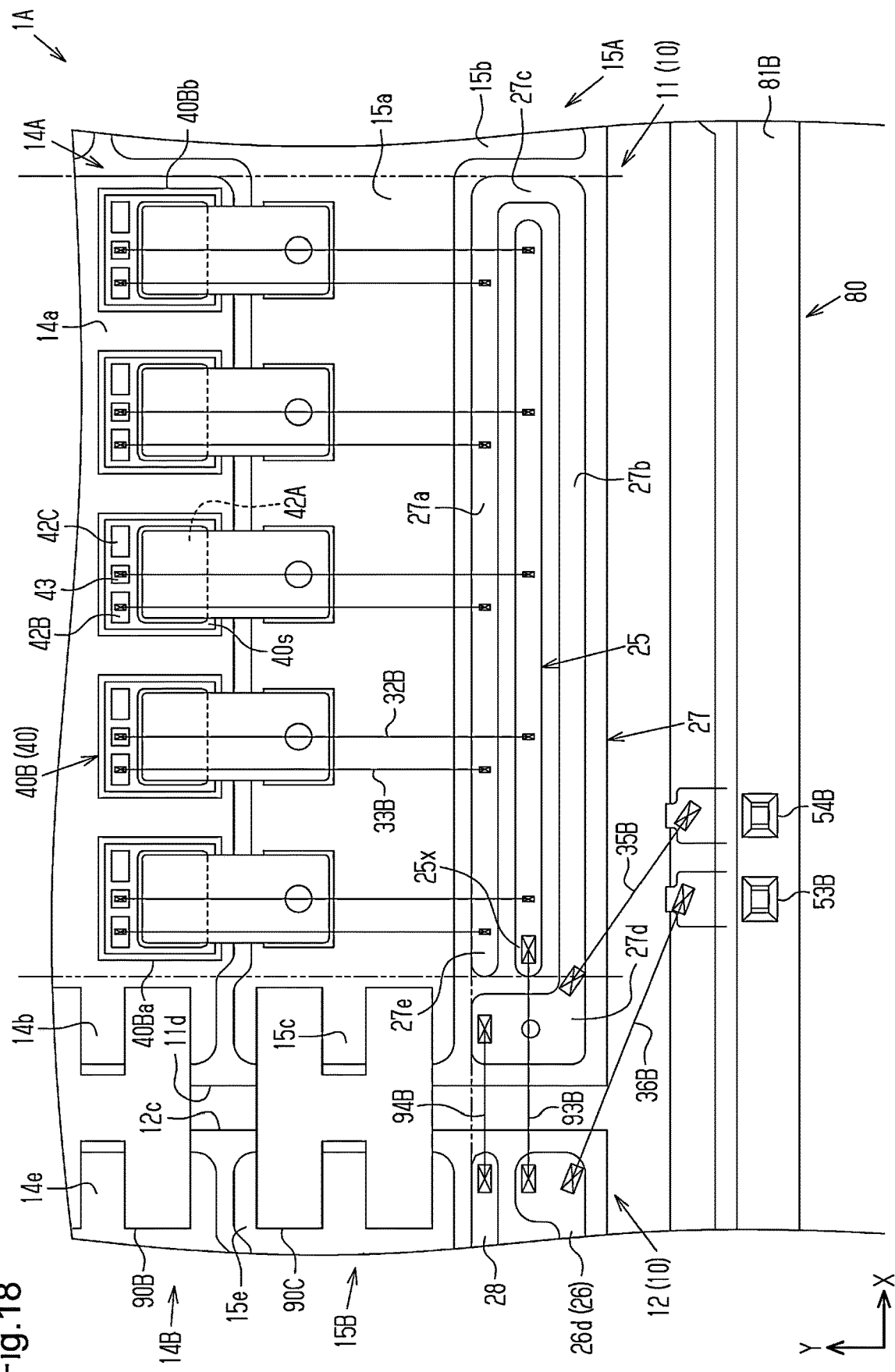
FIG. 18 is a partial enlarged view of FIG. 17.

As shown in FIG. 18, the second drive layer 27 includes a second drive-side wiring portion 27a, a second drive-side detour portion 27b, a second drive-side joint portion 27c, and a second drive-side connector 27d. In the present embodiment, the second drive layer 27 is a single-piece member in which the second drive-side wiring portion 27a, the second drive-side detour portion 27b, the second drive-side joint portion 27c, and the second drive-side connector 27d are integrally formed. The second drive layer 27 is formed of, for example, a copper foil. In plan view, the second drive-side wiring portion 27a, the second drive-side detour portion 27b, and the second drive-side joint portion 27c are slim-band-shaped.

The second drive-side wiring portion 27a extends in the longitudinal direction X. In the lateral direction Y, the second drive-side wiring portion 27a is arranged adjacent to the conductive layer 15A. The second drive-side wiring portion 27a has an end 27e located toward the fourth substrate side surface 11d of the first substrate 11 in the longitudinal direction X. The end 27e is located closer to the fourth substrate side surface 11d of the first substrate 11 than a second power semiconductor element 40Ba that is one of the second power semiconductor elements 40B located closest to the fourth substrate side surface 11d in the longitudinal direction X. As viewed in the lateral direction Y, the second drive-side wiring portion 27a extends in the longitudinal direction X to overlap all of the second power semiconductor elements 40B arranged on the first substrate 11.

The second drive-side connection member 33B connected to each second power semiconductor element 40B is connected to the second drive-side wiring portion 27a. The second drive-side connection members 33B are separated from each other in the longitudinal direction X, which conforms to the arrangement direction of the second power semiconductor elements 40B. The second drive-side connection members 33B that are connected to the second power semiconductor elements 40B extend in the lateral direction Y in plan view.

The second drive-side detour portion 27b is separated from the second drive-side wiring portion 27a in the lateral direction Y. The second drive-side detour portion 27b and the second drive-side wiring portion 27a are located at opposite sides of the second control layer 25 in the lateral direction Y. The second drive-side detour portion 27b is located closer to the second substrate side surface 11b of the first substrate 11 than the second control layer 25 in the lateral direction Y. In the lateral direction Y, the second drive-side detour portion 27b is arranged adjacent to the second substrate side surface 11b of the first substrate 11. The second drive-side detour portion 27b extends in the longitudinal direction X. The second drive-side detour portion 27b is slightly longer than the second drive-side wiring portion 27a in the longitudinal direction X. As shown in FIG. 18, the second drive-side connection members 33B are not connected at the second drive-side detour portion 27b. That is, the second drive-side connection members 33B are electrically connected to the second drive-side detour portion 27b but are not in physical contact with the second drive-side detour portion 27b.

The second drive-side joint portion 27c joins the second drive-side wiring portion 27a and the second drive-side detour portion 27b. More specifically, the second drive-side joint portion 27c joins an end of the second drive-side wiring portion 27a in the longitudinal direction X located toward the third substrate side surface 11c of the first substrate 11 and an end of the second drive-side detour portion 27b in the longitudinal direction X located toward the third substrate side surface 11c. The second drive-side joint portion 27c extends in the lateral direction Y. A second power semiconductor element 40Bb is one of the second power semiconductor elements 40B located closest to the third substrate side surface 11c. As viewed in the lateral direction Y, the second drive-side joint portion 27c is arranged to overlap an end of the second power semiconductor element 40Bb in the longitudinal direction X located toward the third substrate side surface 11c of the first substrate 11.

The second drive-side connector 27d is formed on a distal end of the second drive-side detour portion 27b. The second drive-side connector 27d is located closer to the fourth substrate side surface 11d of the first substrate 11 than the second drive-side wiring portion 27a in the longitudinal direction X. The second drive-side connector 27d extends in the lateral direction Y. The width-wise dimension of the second drive-side connector 27d (dimension of the second drive-side connector 27d in the longitudinal direction X) is greater than the width-wise dimension of the second drive-side detour portion 27b (dimension of the second drive-side detour portion 27b in the lateral direction Y). The second drive-side connector 27d is separated from the second drive-side wiring portion 27a in the longitudinal direction X when the edge of the second drive-side connector 27d in the lateral direction Y located toward the conductive layer 15A is aligned in the lateral direction Y with the edge of the second drive-side wiring portion 27a in the lateral direction Y located toward the conductive layer 15A.

The second control layer 25 extends in the longitudinal direction X. In plan view, the second control layer 25 is slim-band-shaped. In the present embodiment, the width-wise dimension of the second control layer 25 (dimension of the second control layer 25 in the lateral direction Y) is equal to the width-wise dimension of the second drive-side wiring portion 27a of the second drive layer 27 (dimension of the second drive-side wiring portion 27a in the lateral direction Y). The width-wise dimension of the second control layer 25 is also equal to the width-wise dimension of the second drive-side detour portion 27b of the second drive layer 27 (dimension of the second drive-side detour portion 27b in the lateral direction Y).

When the difference in the dimension in the lateral direction Y between the second control layer 25 and the second drive-side wiring portion 27a of the second drive layer 27 is within, for example, 5% of the dimension of the second drive-side wiring portion 27a of the second drive layer 27 in the lateral direction Y, the width-wise dimension of the second control layer 25 may be considered to be equal to the width-wise dimension of the second drive-side wiring portion 27a of the second drive layer 27. When the difference in the dimension in the lateral direction Y between the second control layer 25 and the second drive-side detour portion 27b of the second drive layer 27 is within, for example, 5% of the dimension of the second drive-side detour portion 27b of the second drive layer 27 in the lateral direction Y, the width-wise dimension of the second control layer 25 may be considered to be equal to the width-wise dimension of the second drive-side detour portion 27b of the second drive layer 27.

The second control layer 25 is slightly shorter than the second drive-side wiring portion 27a of the second drive layer 27 in the longitudinal direction X. The second control layer 25 has an end 25x located toward the fourth substrate side surface 11d of the first substrate 11 in the longitudinal direction X. As viewed in the lateral direction Y, the end 25x is aligned with the end 27e of the second drive-side wiring portion 27a of the second drive layer 27.

The second control-side connection member 32B connected to each second power semiconductor element 40B is connected to the second control layer 25. The second control-side connection members 32B are separated from each other in the longitudinal direction X, which conforms to the arrangement direction of the second power semiconductor elements 40B. The second control-side connection members 32B that are connected to the second power semiconductor elements 40B extend in the lateral direction Y in plan view. The first drive layer connection member 94A is connected to the end of the first drive layer 23 in the longitudinal direction X located toward the fourth substrate side surface 11d of the first substrate 11.

Figure 19:
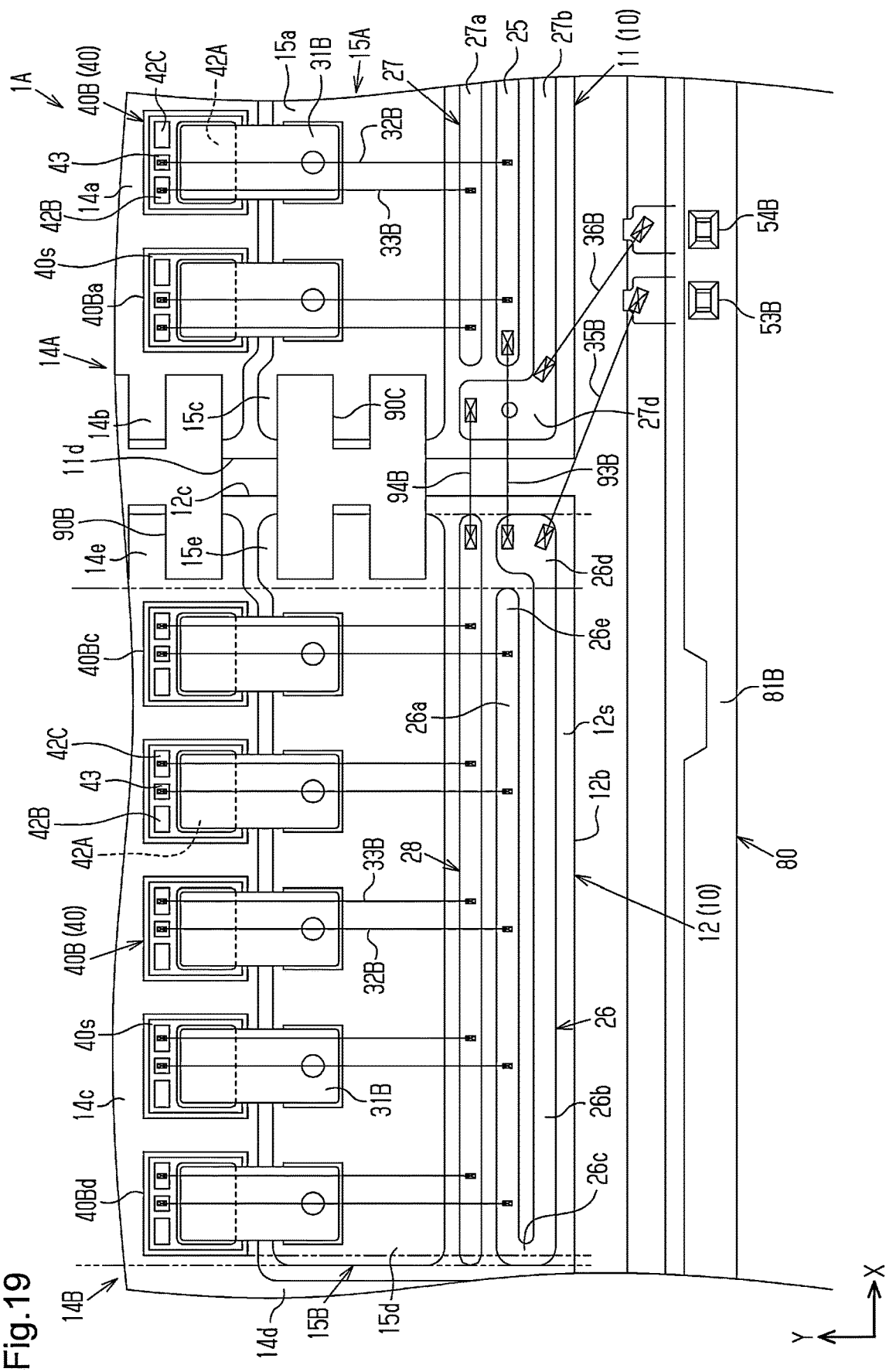
FIG. 19 is a partial enlarged view of FIG. 17.

As shown in FIG. 19, the second control layer 26 includes a second control-side wiring portion 26a, a second control-side detour portion 26b, a second control-side joint portion 26c, and a second control-side connector 26d. In the present embodiment, the second control layer 26 is a single-piece member in which the second control-side wiring portion 26a, the second control-side detour portion 26b, the second control-side joint portion 26c, and the second control-side connector 26d are integrally formed. The second control layer 26 is formed of, for example, a copper foil. In plan view, the second control-side wiring portion 26a, the second control-side detour portion 26b, and the second control-side joint portion 26c are slim-band-shaped.

The second control-side wiring portion 26a extends in the longitudinal direction X. The second control-side wiring portion 26a has an end 26e located toward the third substrate side surface 12c of the second substrate 12 in the longitudinal direction X. The end 26e is located closer to the third substrate side surface 12c of the second substrate 12 than a second power semiconductor element 40Bc that is one of the second power semiconductor elements 40B located closest to the third substrate side surface 12c in the longitudinal direction X.

The second control-side connection member 32B connected to each second power semiconductor element 40B is connected to the second control-side wiring portion 26a. The second control-side connection members 32B are separated from each other in the longitudinal direction X, which conforms to the arrangement direction of the second power semiconductor elements 40B. The second control-side connection members 32B that are connected to the second power semiconductor elements 40B extend in the lateral direction Y in plan view.

The second control-side detour portion 26b is separated from the second control-side wiring portion 26a in the lateral direction Y. The second control-side detour portion 26b and the second drive layer 28 are located at opposite sides of the second control-side wiring portion 26a in the lateral direction Y. The second control-side detour portion 26b is arranged adjacent to the second substrate side surface 12b of the second substrate 12 in the lateral direction Y. The second control-side detour portion 26b extends in the longitudinal direction X. The second control-side detour portion 26b is slightly longer than the second control-side wiring portion 26a in the longitudinal direction X. As shown in FIG. 19, the second control-side connection members 32B are not connected at the second control-side detour portion 26b. That is, the second control-side connection members 32B are electrically connected to the second control-side detour portion 26b but are not in physical contact with the second control-side detour portion 26b.

The second control-side joint portion 26c joins the second control-side wiring portion 26a and the second control-side detour portion 26b. More specifically, the second control-side joint portion 26c joins an end of the second control-side wiring portion 26a in the longitudinal direction X located toward the fourth substrate side surface 12d of the second substrate 12 and an end of the second control-side detour portion 26b in the longitudinal direction X located toward the fourth substrate side surface 12d. The second control-side joint portion 26c extends in the lateral direction Y. In the longitudinal direction X, the second control-side joint portion 26c is arranged adjacent to the terminal-side connection portion 14d of the second mount layer 14B. As viewed in the lateral direction Y, the second control-side joint portion 26c is arranged to overlap a second power semiconductor element 40Bd that is one of the second power semiconductor elements 40B located closest to the fourth substrate side surface 12d of the second substrate 12 in the longitudinal direction X.

The second control-side connector 26d is formed on a distal end of the second control-side detour portion 26b. The second control-side connector 26d is located closer to the third substrate side surface 12c of the second substrate 12 than the second control-side wiring portion 26a in the longitudinal direction X. The second control-side connector 26d extends in the lateral direction Y. In the lateral direction Y, the second control-side connector 26d is arranged adjacent to the second drive layer 28. The width-wise dimension of the second control-side connector 26d (dimension of the second control-side connector 26d in the longitudinal direction X) is greater than the width-wise dimension of the second control-side detour portion 26b (dimension of the second control-side detour portion 26b in the lateral direction Y). The second control-side connector 26d is separated from the second control-side wiring portion 26a in the longitudinal direction X when the edge of the second control-side connector 26d in the lateral direction Y located toward the second drive layer 28 is aligned in the lateral direction Y with the edge of the second control-side wiring portion 26a in the lateral direction Y located toward the second drive layer 28.

The second drive layer 28 extends in the longitudinal direction X. In plan view, the second drive layer 28 is slim-band-shaped. In the present embodiment, the width-wise dimension of the second drive layer 28 (dimension of the second drive layer 28 in the lateral direction Y) is equal to the width-wise dimension of the second control-side wiring portion 26a of the second control layer 26 (dimension of the second control-side wiring portion 26a in the lateral direction Y). The width-wise dimension of the second drive layer 28 is equal to the width-wise dimension of the second control-side detour portion 26b of the second control layer 26 (dimension of the second control-side detour portion 26b in the lateral direction Y).

When the difference in the dimension in the lateral direction Y between the second drive layer 28 and the second control-side wiring portion 26a of the second control layer 26 is within, for example, 5% of the dimension of the second control-side wiring portion 26a of the second control layer 26 in the lateral direction Y, the width-wise dimension of the second drive layer 28 may be considered to be equal to the width-wise dimension of the second control-side wiring portion 26a of the second control layer 26. When the dimension in the lateral direction Y between the second drive layer 28 and the second control-side detour portion 26b of the second control layer 26 is within, for example, 5% of the dimension of the second control-side detour portion 26b of the second control layer 26 in the lateral direction Y, the width-wise dimension of the second drive layer 28 may be considered to be equal to the width-wise dimension of the second control-side detour portion 26b of the second control layer 26.

The second drive layer 28 is longer than the second control-side wiring portion 26a of the second control layer 26 in the longitudinal direction X. As viewed in the lateral direction Y, an end of the second drive layer 28 in the longitudinal direction X located toward the fourth substrate side surface 12d of the second substrate 12 is aligned with the second control-side joint portion 26c of the second control layer 26. As viewed in the lateral direction Y, an end of the second drive layer 28 in the longitudinal direction X located toward the third substrate side surface 12c of the second substrate 12 is aligned with the second control-side connector 26d of the second control layer 26.

The second drive-side connection member 33B connected to each second power semiconductor element 40B of the second substrate 12 is connected to the second drive layer 28. The second drive-side connection members 33B are separated from each other in the longitudinal direction X, which conforms to the arrangement direction of the second power semiconductor elements 40B. The second drive-side connection members 33B that are connected to the second power semiconductor elements 40B extend in the lateral direction Y in plan view.

As shown in FIGS. 17 to 19, the second detection terminal-side connection member 36B is connected to the second drive-side detour portion 27b. More specifically, the second detection terminal-side connection member 36B is connected to an end of the second drive-side detour portion 27b located toward the second drive-side connector 27d.

The second drive layer connection member 94B is connected to the second drive-side connector 27d. More specifically, the second drive layer connection member 94B is connected to an end of the second drive-side connector 27d in the lateral direction Y located toward the conductive layer 15A. The second drive layer connection member 94B is also connected to an end of the second drive layer 28 in the longitudinal direction X located toward the third substrate side surface 12c of the second substrate 12. In plan view, the second drive layer connection member 94B extends in the longitudinal direction X.

The second control layer connection member 93B is connected to the end 25x of the second control layer 25 located toward the fourth substrate side surface 11d of the first substrate 11. The second control layer connection member 93B is connected to the second control-side connector 26d of the second control layer 26. The second control layer connection member 93B is connected to an end of the second control-side connector 26d in the lateral direction Y located toward the second drive layer 28. In plan view, the second control layer connection member 93B extends in the longitudinal direction X. As shown in FIG. 18, the second control layer connection member 93B extends over the second drive-side connector 27d of the second drive layer 27 in the longitudinal direction X.

The second control terminal-side connection member 35B is connected to the second control-side connector 26d. More specifically, the second control terminal-side connection member 35B is connected to an end of the second control-side connector 26d in the lateral direction Y located toward the second substrate side surface 12b of the second substrate 12.

As shown in FIGS. 11 to 19, the control-side connection members 32A and 32B, the drive-side connection members 33A and 33B, the power supply detection-side connection member 34, the control terminal-side connection members 35A and 35B, the detection terminal-side connection members 36A and 36B, the thermistor-side connection members 37, the control layer connection members 93A and 93B, and the drive layer connection members 94A and 94B are wires formed from gold (Au), a Au alloy, Al, an Al alloy, Cu, or a Cu alloy.

Conductive Path

A control-side conductive path and a drive-side conductive path will now be described. The control-side conductive path is a first conductive path extending from each of the power semiconductor elements 40A and 40B to the respective control terminals 53A and 53B. The drive-side conductive path is a second conductive path extending from each of the power semiconductor elements 40A and 40B to the respective detection terminals 54A and 54B.

As shown in FIG. 14, a first control-side conductive path extending from the gate electrode 43 of each first power semiconductor element 40A on the first substrate 11 to the first control terminal 53A is formed by the first control-side connection member 32A, the first control layer 21, and the first control terminal-side connection member 35A. Thus, the first control-side conductive path for each first power semiconductor element 40A on the first substrate 11 becomes longer from the first power semiconductor element 40Ab toward the first power semiconductor element 40Aa. In other words, the difference in length of the first control-side conductive paths is the largest between the first power semiconductor element 40Aa and the first power semiconductor element 40Ab, which respectively correspond to a first end power semiconductor element and a second end power semiconductor element of the first power semiconductor elements 40A that are located at opposite ends in the arrangement direction of the first power semiconductor elements 40A (the longitudinal direction X). In this case, the first control-side conductive path of the first power semiconductor element 40Aa is longest and corresponds to the first end control-side conductive path. The first control-side conductive path of the first power semiconductor element 40Ab is shortest and corresponds to the second end control-side conductive path.

A first drive-side conductive path extending from the source electrode 42 of each first power semiconductor element 40A on the first substrate 11 to the first detection terminal 54A is formed by the first drive-side connection member 33A, the first drive layer 23, the first drive layer connection member 94A, the first drive-side connector 24d of the first drive layer 24, and the first detection terminal-side connection member 36A. Thus, the first drive-side conductive path for each first power semiconductor element 40A on the first substrate 11 becomes longer from the first power semiconductor element 40Aa toward the first power semiconductor element 40Ab. In other words, the difference in length of the first drive-side conductive paths is the largest between the first power semiconductor element 40Aa and the first power semiconductor element 40Ab, which respectively correspond to a first end power semiconductor element and a second end power semiconductor element of the first power semiconductor elements 40A that are located opposite ends in the arrangement direction of the first power semiconductor elements 40A (the longitudinal direction X). In this case, the first drive-side conductive path of the first power semiconductor element 40Aa is shortest and corresponds to the first end drive-side conductive path. The first drive-side conductive path of the first power semiconductor element 40Ab is longest and corresponds to the second end drive-side conductive path.

A first control-side conductive path extending from the gate electrode 43 of each first power semiconductor element 40A on the second substrate 12 to the first control terminal 53A is formed by the first control-side connection member 32A, the first control layer 22, the first control layer connection member 93A, the first control-side connector 21d of the first control layer 21, and the first control terminal-side connection member 35A. Thus, the first control-side conductive path for each first power semiconductor element 40A on the second substrate 12 becomes longer from the first power semiconductor element 40Ac toward the first power semiconductor element 40Ad. In other words, the difference in length of the first control-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction of the first power semiconductor elements 40A (the longitudinal direction X). In this case, the first control-side conductive path of the first power semiconductor element 40Ac is shortest and corresponds to the first end control-side conductive path. The first control-side conductive path of the first power semiconductor element 40Ad is longest and corresponds to the second end control-side conductive path.

A first drive-side conductive path extending from the source electrode 42 of each first power semiconductor element 40A on the second substrate 12 to the first detection terminal 54A is formed by the first drive-side connection member 33A, the first drive layer 24, and the first detection terminal-side connection member 36A. Thus, the first drive-side conductive path for each first power semiconductor element 40A on the second substrate 12 becomes longer from the first power semiconductor element 40Ad toward the first power semiconductor element 40Ac. In other words, the difference in length of the first drive-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction of the first power semiconductor elements 40A (the longitudinal direction X). In this case, the first drive-side conductive path of the first power semiconductor element 40Ac is longest and corresponds to the first end drive-side conductive path. The first drive-side conductive path of the first power semiconductor element 40Ad is shortest and corresponds to the second end drive-side conductive path.

As described above, in the present embodiment, the first control-side detour portion 21b and the first drive-side detour portion 24b are formed to reduce the difference in the sum of the length of the first control-side conductive path and the length of the first drive-side conductive path between the first power semiconductor elements 40A. That is, the power module 1A of the present embodiment is formed so that the difference between the first power semiconductor elements 40A in the sum of the length of the first control-side conductive path, which is an example of the first conductive path, and the length of the first drive-side conductive path, which is an example of the second conductive path, is reduced by the first control-side detour portion 21b and the first drive-side detour portion 24b.

In addition, in the present embodiment, the first control-side detour portion 21b and the first drive-side detour portion 24b are formed to reduce the difference between the sum of the length of the first end control-side conductive path and the length of the first end drive-side conductive path and the sum of the length of the second end control-side conductive path and the length of the second end drive-side conductive path.

The sum of the length of the first end control-side conductive path and the length of the first end drive-side conductive path is an example of a first sum recited in CLAIMS. The sum of the length of the second end control-side conductive path and the length of the second end drive-side conductive path is an example of a second sum recited in CLAIMS. Thus, the power module 1A of the present embodiment is formed so that the difference between the first sum and the second sum is reduced by the first control-side detour portion 21b and the first drive-side detour portion 24b.

As shown in FIG. 17, a second control-side conductive path extending from the gate electrode 43 of each second power semiconductor element 40B on the first substrate 11 to the second control terminal 53B is formed by the second control-side connection member 32B, the second control layer 25, the second control layer connection member 93B, the second control-side connector 26d of the second control layer 26, and the second control terminal-side connection member 35B. Thus, the second control-side conductive path for each second power semiconductor element 40B on the first substrate 11 becomes longer from the second power semiconductor element 40Ba toward the second power semiconductor element 40Bb. The second control-side conductive path is an example of a third conductive path. In other words, the difference in length of the second control-side conductive paths is the largest between the second power semiconductor element 40Ba and the second power semiconductor element 40Bb, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second control-side conductive path of the second power semiconductor element 40Ba is shortest and corresponds to the third end control-side conductive path. The second control-side conductive path of the second power semiconductor element 40Bb is longest and corresponds to the fourth end control-side conductive path.

A second drive-side conductive path extending from the source electrode 42 of each second power semiconductor element 40B on the first substrate 11 to the second detection terminal 54B is formed by the second drive-side connection member 33B, the second drive layer 27, and the second detection terminal-side connection member 36B. Thus, the second drive-side conductive path for each second power semiconductor element 40B on the first substrate 11 becomes longer from the second power semiconductor element 40Bb toward the second power semiconductor element 40Ba. The second drive-side conductive path is an example of a fourth conductive path. In other words, the difference in length of the second drive-side conductive paths is the largest between the second power semiconductor element 40Ba and the second power semiconductor element 40Bb, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second drive-side conductive path of the second power semiconductor element 40Ba is longest and corresponds to a third end drive-side conductive path. The second drive-side conductive path of the second power semiconductor element 40Bb is shortest and corresponds to a fourth end drive-side conductive path.

A second control-side conductive path extending from the gate electrode 43 of each second power semiconductor element 40B on the second substrate 12 to the second control terminal 53B is formed by the second control-side connection member 32B, the second control layer 26, and the second control terminal-side connection member 35B. Thus, the second control-side conductive path for each second power semiconductor element 40B of the second substrate 12 becomes longer from the second power semiconductor element 40Bd toward the second power semiconductor element 40Bc. The second control-side conductive path is an example of a third conductive path. In other words, the difference in length of the second control-side conductive paths is the largest between the second power semiconductor element 40Bc and the second power semiconductor element 40Bd, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second control-side conductive path of the second power semiconductor element 40Bc is longest and corresponds to the third end control-side conductive path. The second control-side conductive path of the second power semiconductor element 40Bd is shortest and corresponds to the fourth end control-side conductive path.

A second drive-side conductive path extending from the source electrode 42 of each second power semiconductor element 40B on the second substrate 12 to the second detection terminal 54B is formed by the second drive-side connection member 33B, the second drive layer 28, the second drive layer connection member 94B, the second drive-side connector 27d of the second drive layer 27, and the second detection terminal-side connection member 36B. Thus, the second drive-side conductive path for each second power semiconductor element 40B on the second substrate 12 becomes longer from the second power semiconductor element 40Bc toward the second power semiconductor element 40Bd. The second drive-side conductive path is an example of a fourth conductive path. In other words, the difference in length of the second drive-side conductive paths is the largest between the second power semiconductor element 40Bc and the second power semiconductor element 40Bd, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second drive-side conductive path of the second power semiconductor element 40Bc is shortest and corresponds to a third end drive-side conductive path. The second drive-side conductive path of the second power semiconductor element 40Bd is longest and corresponds to a fourth end drive-side conductive path.

As described above, in the present embodiment, the second control-side detour portion 26b and the second drive-side detour portion 27b are formed to reduce the difference between the second power semiconductor elements 40B in the sum of the length of the second control-side conductive path and the length of the second drive-side conductive path. That is, the power module 1A of the present embodiment is formed so that the difference between the second power semiconductor elements 40B in the sum of the length of the second control-side conductive path, which is an example of a third conductive path, and the length of the second drive-side conductive path, which is an example of a fourth conductive path, is reduced by the second control-side detour portion 26b and the second drive-side detour portion 27b.

In addition, in the present embodiment, the first control-side detour portion 21b and the first drive-side detour portion 24b are formed to reduce differences between the sum of the length of the third end control-side conductive path and the length of the third end drive-side conductive path and the sum of the length of the fourth end control-side conductive path and the length of the fourth end drive-side conductive path.

The sum of the length of the third end control-side conductive path and the length of the third end drive-side conductive path is an example of a third sum recited in CLAIMS. The sum of the length of the fourth end control-side conductive path and the length of the fourth end drive-side conductive path is an example of a fourth sum recited in CLAIMS. Thus, the power module 1A of the present embodiment is formed so that the difference between the third sum and the fourth sum is reduced by the second control-side detour portion 26b and the second drive-side detour portion 27b.

Operation

Figure 20:
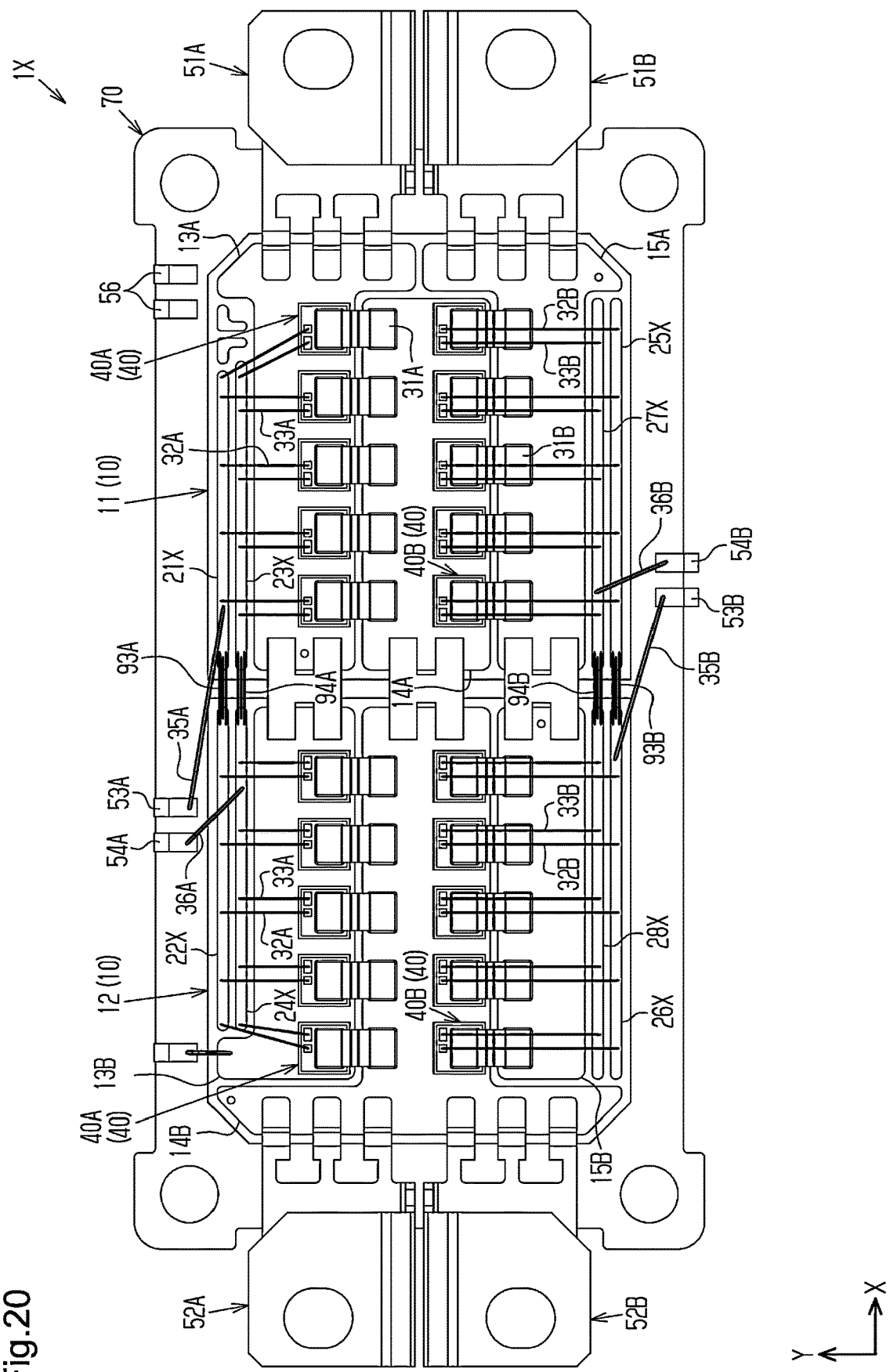
FIG. 20 is a plan view showing an internal structure of a comparative example of a power module.

The operation of the power module 1A of the present embodiment will now be described. FIG. 20 shows an internal structure of a comparative example of a power module 1X. For the sake of convenience, the case 80 is not shown in FIG. 20. The structure of the power module 1X of the comparative example will be described below.

As shown in FIG. 20, the power module 1X differs from the power module 1A of the present embodiment in structures of each control layer and each drive layer. For the sake of convenience, the control layers and the drive layers of the power module 1X are given the reference characters of the corresponding control layers 21, 22, 25, and 26, and drive layers 23, 24, 27, and 28 of the power module 1A provided with an "X" suffix.

Figure 21:
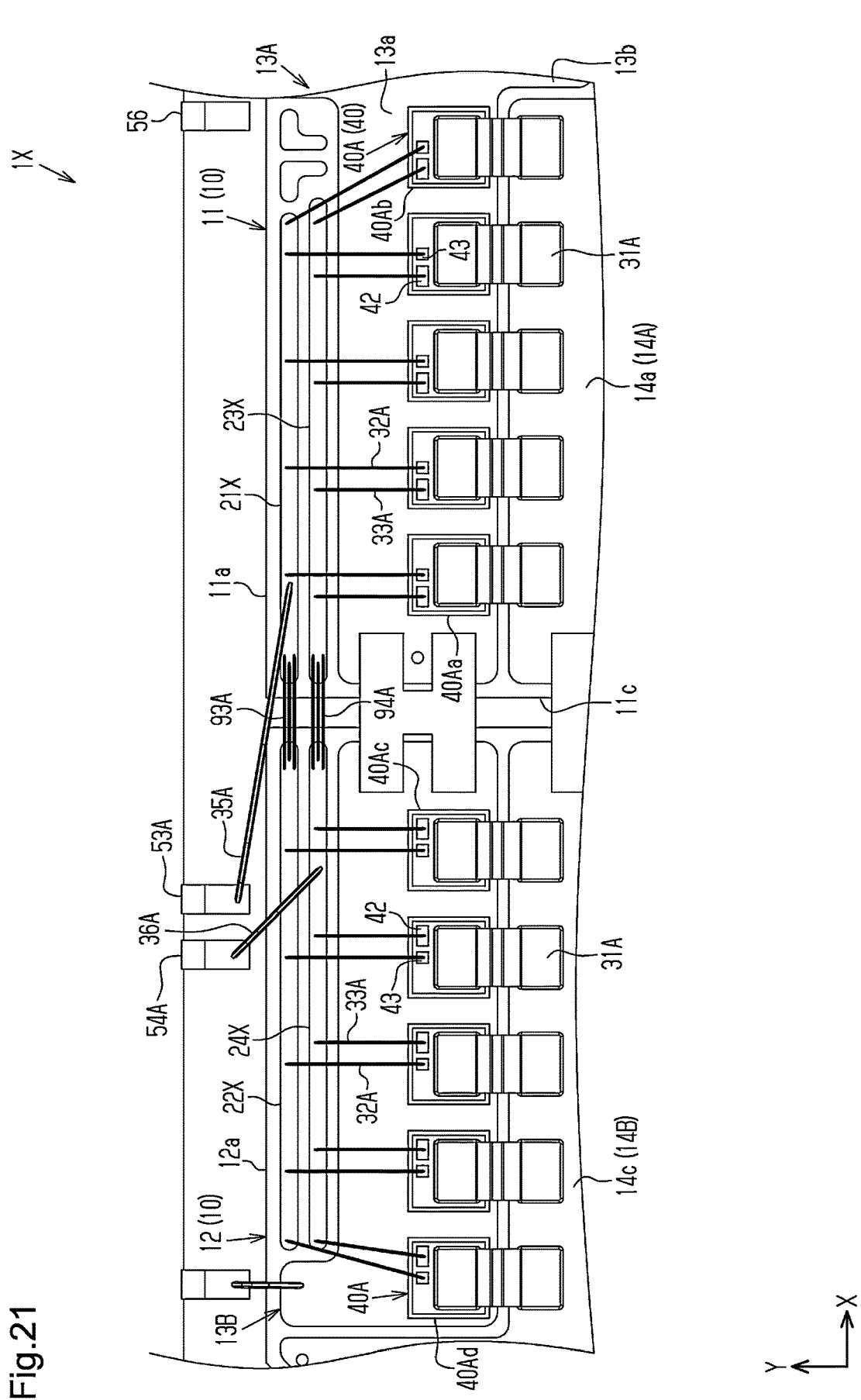
FIG. 21 is a partial enlarged view of FIG. 20.

As shown in FIG. 21, a first control layer 21X and a first drive layer 23X are separated from each other in the lateral direction Y. The first drive layer 23X is located closer to the first mount layer 13A than the first control layer 21X. The first control layer 21X and the first drive layer 23X extend in the longitudinal direction X. The first control layer 21X and the first control terminal 53A are electrically connected by the first control terminal-side connection member 35A. The first control layer 21X and the gate electrode 43 of each first power semiconductor element 40A on the first substrate 11 are electrically connected by the first control-side connection member 32A. The first drive layer 23X and the source electrode 42 of each first power semiconductor element 40A on the first substrate 11 are electrically connected by the first drive-side connection member 33A.

A first control layer 22X and a first drive layer 24X are separated from each other in the lateral direction Y. The first drive layer 24X is located closer to the first mount layer 13B than the first control layer 22X. The first control layer 22X and the first drive layer 24X extend in the longitudinal direction X. The first control layer 22X and the first control layer 21X are electrically connected by the first control layer connection member 93A. The first drive layer 24X and the first drive layer 23X are electrically connected by the first drive layer connection member 94A. The first drive layer 24X and the first detection terminal 54A are electrically connected by the first detection terminal-side connection member 36A. The first control layer 22X and the gate electrode 43 of each first power semiconductor element 40A on the second substrate 12 are electrically connected by the first control-side connection member 32A. The first drive layer 24X and the source electrode 42 of each first power semiconductor element 40A on the second substrate 12 are electrically connected by the first drive-side connection member 33A.

A first control-side conductive path extending from the gate electrode 43 of each first power semiconductor element 40A on the first substrate 11 to the first control terminal 53A is formed by the first control-side connection member 32A, the first control layer 21X, and the first control terminal-side connection member 35A. Thus, the first control-side conductive path for each first power semiconductor element 40A on the first substrate 11 becomes longer from the first power semiconductor element 40Aa toward the first power semiconductor element 40Ab. In other words, the difference in length of the first control-side conductive paths is the largest between the first power semiconductor element 40Aa and the first power semiconductor element 40Ab, which respectively correspond to a first end power semiconductor element and a second end power semiconductor element of the first power semiconductor elements 40A that are located at opposite ends in the arrangement direction of the first power semiconductor elements 40A (the longitudinal direction X). In this case, the first control-side conductive path of the first power semiconductor element 40Aa is shortest and corresponds to the first end control-side conductive path. The first control-side conductive path of the first power semiconductor element 40Ab is longest and corresponds to the second end control-side conductive path.

A first drive-side conductive path extending from the source electrode 42 of each first power semiconductor element 40A on the first substrate 11 to the first detection terminal 54A is formed by the first drive-side connection member 33A, the first drive layer 23X, the first drive layer connection member 94A, the first drive layer 24X, and the first detection terminal-side connection member 36A. Thus, the first drive-side conductive path for each first power semiconductor element 40A on the first substrate 11 becomes longer from the first power semiconductor element 40Aa toward the first power semiconductor element 40Ab. In other words, the difference in length of the first drive-side conductive paths is the largest between the first power semiconductor element 40Aa and the first power semiconductor element 40Ab, which respectively correspond to a first end power semiconductor element and a second end power semiconductor element of the first power semiconductor elements 40A that are located opposite ends in the arrangement direction of the first power semiconductor elements 40A (the longitudinal direction X). In this case, the first drive-side conductive path of the first power semiconductor element 40Aa is shortest and corresponds to the first end drive-side conductive path. The first drive-side conductive path of the first power semiconductor element 40Ab is longest and corresponds to the second end drive-side conductive path.

A first control-side conductive path extending from the gate electrode 43 of each first power semiconductor element 40A on the second substrate 12 to the first control terminal 53A is formed by the first control-side connection member 32A, the first control layer 22X, the first control layer connection member 93A, the first control layer 21X, and the first control terminal-side connection member 35A. Thus, the first control-side conductive path for each first power semiconductor element 40A on the second substrate 12 becomes longer from the first power semiconductor element 40Ac toward the first power semiconductor element 40Ad. In other words, the difference in length of the first control-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction of the first power semiconductor elements 40A (the longitudinal direction X). In this case, the first control-side conductive path of the first power semiconductor element 40Ac is shortest and corresponds to the first end control-side conductive path. The first control-side conductive path of the first power semiconductor element 40Ad is longest and corresponds to the second end control-side conductive path.

A first drive-side conductive path extending from the source electrode 42 of each first power semiconductor element 40A on the second substrate 12 to the first detection terminal 54A is formed by the first drive-side connection member 33A, the first drive layer 24X, and the first detection terminal-side connection member 36A. Thus, the first drive-side conductive path for each first power semiconductor element 40A on the second substrate 12 becomes longer from the first power semiconductor element 40Ac toward the first power semiconductor element 40Ad. In other words, the difference in length of the first drive-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction (the longitudinal direction X) of the first power semiconductor elements 40A. In this case, the first drive-side conductive path of the first power semiconductor element 40Ac is shortest and corresponds to the first end drive-side conductive path. The first drive-side conductive path of the first power semiconductor element 40Ad is longest and corresponds to the second end drive-side conductive path.

As described above, in the power module 1X, both the first control-side conductive path and the first drive-side conductive path for each first power semiconductor element 40A on the first substrate 11 become longer from the first power semiconductor element 40Aa toward the first power semiconductor element 40Ab. This increases the difference between the first power semiconductor elements 40A on the first substrate 11 in the sum of the length of the first control-side conductive path and the length of the first drive-side conductive path. In particular, the first power semiconductor element 40Aa has the shortest first control-side conductive path and the shortest first drive-side conductive path. The first power semiconductor element 40Ab has the longest first control-side conductive path and the longest first drive-side conductive path. Therefore, the sum of the length of the first control-side conductive path and the length of the first drive-side conductive path greatly differs between the first power semiconductor element 40Aa and the first power semiconductor element 40Ab.

Also, both the first control-side conductive path and the first drive-side conductive path for each first power semiconductor element 40A on the second substrate 12 become longer from the first power semiconductor element 40Ac toward the first power semiconductor element 40Ad. This increases the difference between the first power semiconductor elements 40A on the second substrate 12 in the sum of the length of the first control-side conductive path and the length of the first drive-side conductive path. In particular, the first power semiconductor element 40Ac has the shortest first control-side conductive path and the shortest first drive-side conductive path. The first power semiconductor element 40Ad has the longest first control-side conductive path and the longest first drive-side conductive path. Therefore, the sum of the length of the first control-side conductive path and the length of the first drive-side conductive path greatly differs between the first power semiconductor element 40Ac and the first power semiconductor element 40Ad.

Figure 22:
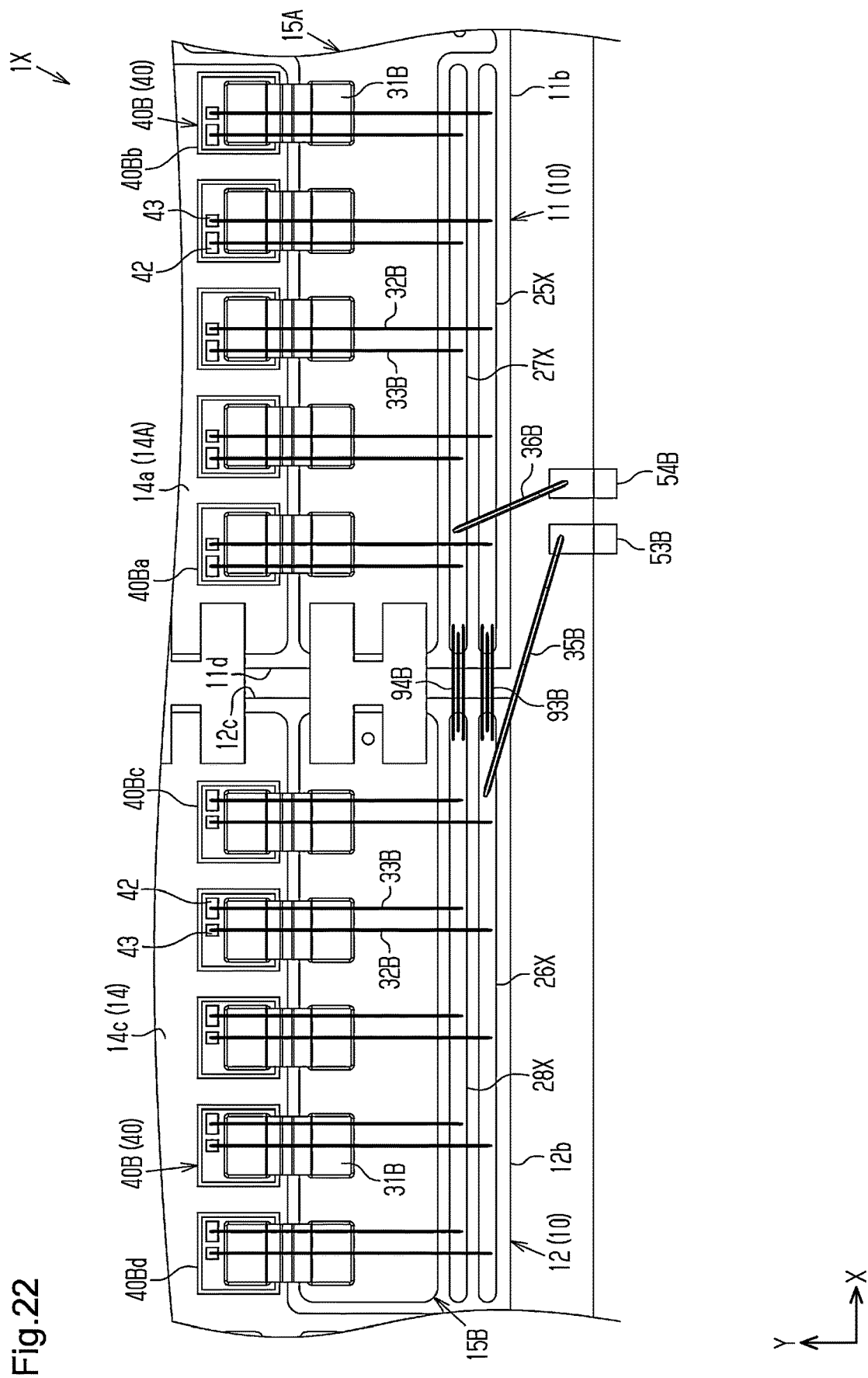
FIG. 22 is a partial enlarged view of FIG. 20.

As shown in FIG. 22, a second control-side conductive path extending from the gate electrode 43 of each second power semiconductor element 40B on the first substrate 11 to the second control terminal 53B is formed by the second control-side connection member 32B, the second control layer 25X, the second control layer connection member 93B, the second control layer 26X, and the second control terminal-side connection member 35B. Thus, the second control-side conductive path for each second power semiconductor element 40B on the first substrate 11 becomes longer from the second power semiconductor element 40Ba toward the second power semiconductor element 40Bb. In other words, the difference in length of the second control-side conductive paths is the largest between the second power semiconductor element 40Ba and the second power semiconductor element 40Bb, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second control-side conductive path of the second power semiconductor element 40Ba is shortest and corresponds to the third end control-side conductive path. The second control-side conductive path of the second power semiconductor element 40Bb is longest and corresponds to the fourth end control-side conductive path.

A second drive-side conductive path extending from the source electrode 42 of each second power semiconductor element 40B on the first substrate 11 to the second detection terminal 54B is formed by the second drive-side connection member 33B, the second drive layer 27X, and the second detection terminal-side connection member 36B. Thus, the second drive-side conductive path for each second power semiconductor element 40B on the first substrate 11 becomes longer from the second power semiconductor element 40Ba toward the second power semiconductor element 40Bb. In other words, the difference in length of the second drive-side conductive paths is the largest between the second power semiconductor element 40Ba and the second power semiconductor element 40Bb, which respectively correspond to a first end power semiconductor element and a second end power semiconductor element of the second power semiconductor elements 40B that are located at opposite ends in the arrangement direction (the longitudinal direction X) of the second power semiconductor elements 40B. In this case, the second drive-side conductive path of the second power semiconductor element 40Ba is shortest and corresponds to a third end drive-side conductive path. The second drive-side conductive path of the second power semiconductor element 40Bb is longest and corresponds to a fourth end drive-side conductive path.

A second control-side conductive path extending from the gate electrode 43 of each second power semiconductor element 40B on the second substrate 12 to the second control terminal 53B is formed by the second control-side connection member 32B, the second control layer 26X, and the second control terminal-side connection member 35B. Thus, the second control-side conductive path for each second power semiconductor element 40B on the second substrate 12 becomes longer from the second power semiconductor element 40Bc toward the second power semiconductor element 40Bd. In other words, the difference in length of the second control-side conductive paths is the largest between the second power semiconductor element 40Bc and the second power semiconductor element 40Bd, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second control-side conductive path of the second power semiconductor element 40Bc is shortest and corresponds to the third end control-side conductive path. The second control-side conductive path of the second power semiconductor element 40Bd is longest and corresponds to the fourth end control-side conductive path.

A second drive-side conductive path extending from the source electrode 42 of each second power semiconductor element 40B on the second substrate 12 to the second detection terminal 54B is formed by the second drive-side connection member 33B, the second drive layer 28X, the second drive layer connection member 94B, the second drive layer 27X, and the second detection terminal-side connection member 36B. Thus, the second drive-side conductive path for each second power semiconductor element 40B on the second substrate 12 becomes longer from the second power semiconductor element 40Bc toward the second power semiconductor element 40Bd. In other words, the difference in length of the second drive-side conductive paths is the largest between the second power semiconductor element 40Bc and the second power semiconductor element 40Bd, which respectively correspond to a first end power semiconductor element and a second end power semiconductor element of the second power semiconductor elements 40B that are located at opposite ends in the arrangement direction of the second power semiconductor elements 40B (the longitudinal direction X). In this case, the second drive-side conductive path of the second power semiconductor element 40Bc is shortest and corresponds to a third end drive-side conductive path. The second drive-side conductive path of the second power semiconductor element 40Bd is longest and corresponds to a fourth end drive-side conductive path.

As described above, in the power module 1X, both the second control-side conductive path and the second drive-side conductive path for each second power semiconductor element 40B on the first substrate 11 become longer from the second power semiconductor element 40Ba toward the second power semiconductor element 40Bb. This increases the difference between the second power semiconductor elements 40B on the first substrate 11 in the sum of the length of the second control-side conductive path and the length of the second drive-side conductive path. In particular, the second power semiconductor element 40Ba has the shortest second control-side conductive path and the shortest second drive-side conductive path. The second power semiconductor element 40Bb has the longest second control-side conductive path and the longest second drive-side conductive path. Therefore, the sum of the length of the second control-side conductive path and the length of the second drive-side conductive path greatly differs between the second power semiconductor element 40Ba and the second power semiconductor element 40Bb.

Also, both the second control-side conductive path and the second drive-side conductive path for each second power semiconductor element 40B on the second substrate 12 become longer from the second power semiconductor element 40Bc toward the second power semiconductor element 40Bd. This increases the difference between the second power semiconductor elements 40B on the second substrate 12 in the sum of the length of the second control-side conductive path and the length of the second drive-side conductive path. In particular, the second power semiconductor element 40Bc has the shortest second control-side conductive path and the shortest second drive-side conductive path. The second power semiconductor element 40Bd has the longest second control-side conductive path and the longest second drive-side conductive path. Therefore, the sum of the length of the second control-side conductive path and the length of the second drive-side conductive path greatly differs between the second power semiconductor element 40Bc and the second power semiconductor element 40Bd.

Figure 23:
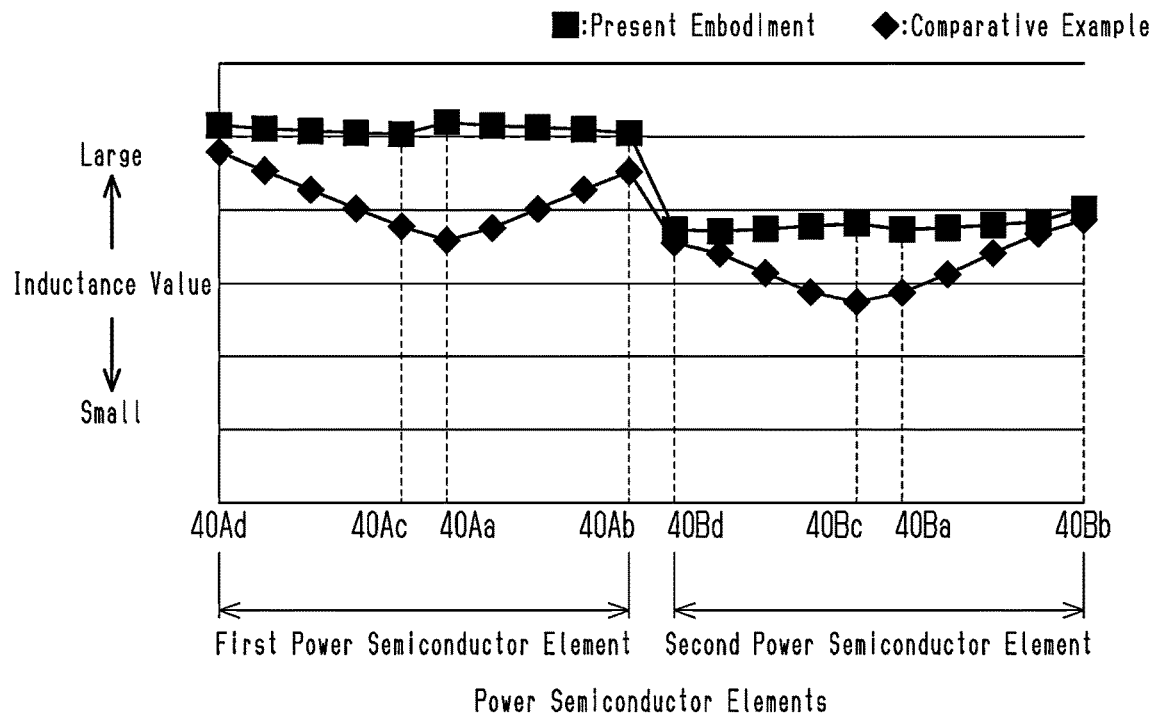
FIG. 23 is a graph showing the relationship between each power semiconductor element and inductance value of the power semiconductor element in the power module of the first embodiment and the power module of the comparative example.

Consequently, as shown in FIG. 23, the first power semiconductor elements 40A vary in the sum of the inductance value between each first power semiconductor element 40A and the first control terminal 53A and the inductance value between the first power semiconductor element 40A and the first detection terminal 54A. As shown in FIG. 23, among the first power semiconductor elements 40A mounted on the first mount layer 13A, the first power semiconductor element 40Aa has the smallest inductance value, and the first power semiconductor element 40Ab has the largest inductance value. That is, the difference in inductance value is the largest between the first power semiconductor element 40Aa and the first power semiconductor element 40Ab. Among the first power semiconductor elements 40A mounted on the first mount layer 13B, the first power semiconductor element 40Ac has the smallest inductance value, and the first power semiconductor element 40Ad has the largest inductance value. That is, the difference in inductance value is the largest between the first power semiconductor element 40Ac and the first power semiconductor element 40Ad.

The second power semiconductor elements 40B also vary in the sum of the inductance value between each second power semiconductor element 40B and the second control terminal 53B and the inductance value between the second power semiconductor element 40B and the second detection terminal 54B. As shown in FIG. 23, among the second power semiconductor elements 40B mounted on the second mount layer 14A, the second power semiconductor element 40Ba has the smallest inductance value, and the second power semiconductor element 40Bb has the largest inductance value. That is, the difference in inductance value is the largest between the second power semiconductor element 40Ba and the second power semiconductor element 40Bb. Among the second power semiconductor elements 40B mounted on the second mount layer 14B, the second power semiconductor element 40Bc has the smallest inductance value, and the second power semiconductor element 40Bd has the largest inductance value. That is, the difference in inductance value is the largest between the second power semiconductor element 40Bc and the second power semiconductor element 40Bd.

Figure 24:
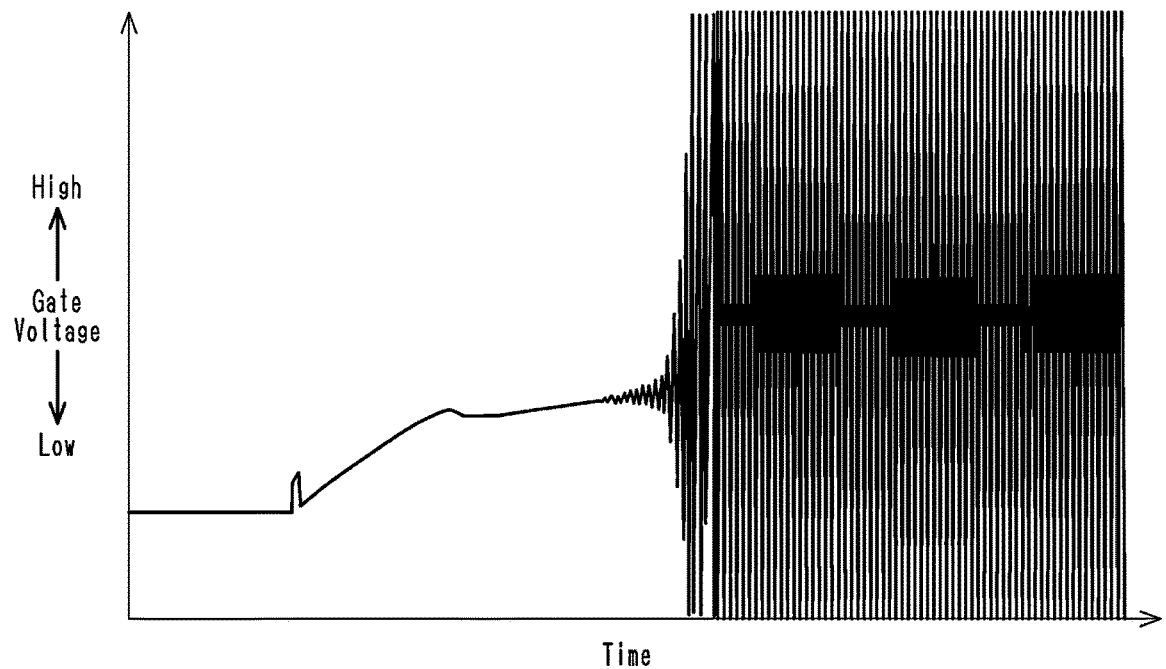
FIG. 24 is a graph showing an example of voltage applied to the gate electrode of a predetermined one of the power semiconductor elements in the power module of the comparative example.

When a gate voltage Vg is applied to the first power semiconductor elements 40A and the second power semiconductor elements 40B, the waveform of the gate voltage Vg may fluctuate due to variations in inductance value. In particular, in the power module 1X, when silicon carbide (SiC) MOSFETs are used as the first power semiconductor elements 40A and the second power semiconductor elements 40B and perform high-speed switching, ringing may occur as shown in FIG. 24.

In this regard, in the present embodiment, as described above, the first control-side detour portion 21b and the first drive-side detour portion 24b are formed to reduce the difference between the first power semiconductor elements 40A in the sum of the length of the first control-side conductive path and the length of the first drive-side conductive path. In addition, the second control-side detour portion 26b and the second drive-side detour portion 27b are formed to reduce the difference between the second power semiconductor elements 40B in the sum of the length of the second control-side conductive path and the length of the second drive-side conductive path. Thus, as shown in FIG. 23, the variations in the sum of the inductance value between each first power semiconductor element 40A and the first control terminal 53A and the inductance value between the first power semiconductor element 40A and the first detection terminal 54A are reduced in the first power semiconductor elements 40A. Also, the variations in the sum of the inductance value between each second power semiconductor element 40B and the second control terminal 53B and the inductance value between the second power semiconductor element 40B and the second detection terminal 54B are reduced in the second power semiconductor elements 40B.

Figure 25:
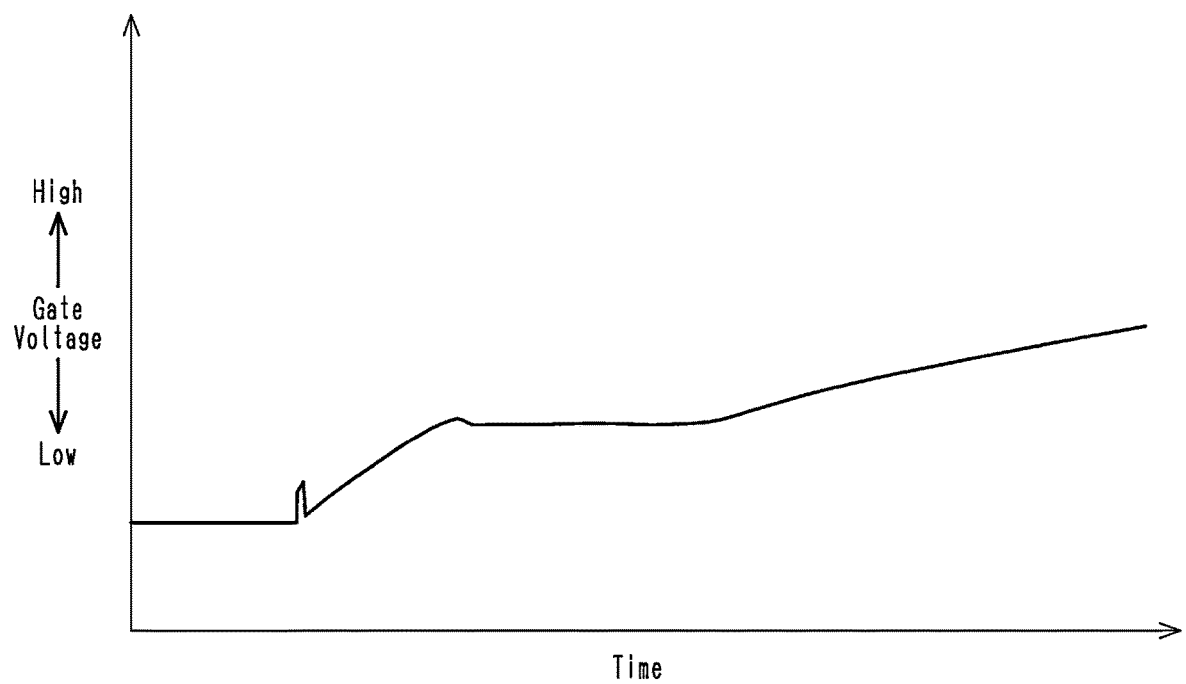
FIG. 25 is a graph showing an example of voltage applied to the gate electrode of a predetermined one of the power semiconductor elements in the power module of the present embodiment.

Accordingly, in the power module 1A of the present embodiment, when SiC MOSFETs are used as the first power semiconductor elements 40A and the second power semiconductor elements 40B and perform high-speed switching, ringing is reduced as shown in FIG. 25.

Advantage

The power module 1A of the present embodiment has the following advantages.
- (1-1) The first control layer 21 includes the first control-side detour portion 21b. The first drive layer 24 includes the first drive-side detour portion 24b. This reduces the difference in the sum of the length of the first control-side conductive path and the length of the first drive-side conductive path for the first power semiconductor elements 40A, thereby reducing variations in the inductance value caused by the differences in length. As a result, ringing is reduced in the first power semiconductor elements 40A, and the power module 1A stably operates.
- (1-2) In plan view, the power module 1A has a long side extending in the longitudinal direction X and a short side extending in the lateral direction Y. The first control-side detour portion 21b of the first control layer 21 is separated from the first control-side wiring portion 21a in the lateral direction Y and extends in the longitudinal direction X. The first drive-side detour portion 24b of the first drive layer 24 is separated from the first drive-side wiring portion 24a in the lateral direction Y and extends in the longitudinal direction X. The second drive-side detour portion 27b of the second drive layer 27 is separated from the second drive-side wiring portion 27a in the lateral direction Y and extends in the longitudinal direction X. The second control-side detour portion 26b of the second control layer 26 is separated from the second control-side wiring portion 26a in the lateral direction Y and extends in the longitudinal direction X. As described above, the detour portions 21b, 24b, 26b, 27b extend in the longitudinal direction X, which conforms to the long side direction of the power module 1A, so that increases in size of the power module 1A in the lateral direction Y are limited.
- (1-3) The first control layer 21 is formed of a single-piece member in which the first control-side wiring portion 21a, the first control-side detour portion 21b, and the first control-side joint portion 21c are integrally formed. This structure facilitates formation of the first control layer 21 on the first substrate 11 as compared to a structure in which, for example, the first control-side wiring portion 21a, the first control-side detour portion 21b, and the first control-side joint portion 21c are separately formed and connected to each other by wires.

The first drive layer 24 is also formed of a single-piece member in which the first drive-side wiring portion 24a, the first drive-side detour portion 24b, and the first drive-side joint portion 24c are integrally formed. This structure facilitates formation of the first drive layer 24 on the second substrate 12 as compared to a structure in which, for example, the first drive-side wiring portion 24a, the first drive-side detour portion 24b, and the first drive-side joint portion 24c are separately formed and connected to each other by wires.

The second drive layer 27 is also formed of a single-piece member in which the second drive-side wiring portion 27a, the second drive-side detour portion 27b, and the second drive-side joint portion 27c are integrally formed. This structure facilitates formation of the second drive layer 27 on the first substrate 11 as compared to a structure in which, for example, the second drive-side wiring portion 27a, the second drive-side detour portion 27b, and the second drive-side joint portion 27c are separately formed and connected to each other by wires.

The second control layer 26 is also formed of a single-piece member in which the second control-side wiring portion 26a, the second control-side detour portion 26b, and the second control-side joint portion 26c are integrally formed. This structure facilitates formation of the second control layer 26 on the second substrate 12 as compared to a structure in which, for example, the second control-side wiring portion 26a, the second control-side detour portion 26b, and the second control-side joint portion 26c are separately formed and connected to each other by wires.

- (1-4) In the lateral direction Y, the first drive layer 23 is located closer to the first mount layer 13A than the first control layer 21. This structure shortens the first drive-side connection member 33A, which connects the first drive layer 23 to the source electrode 42 of each first power semiconductor element 40A on the first substrate 11. As a result, inductance caused by the first drive-side connection member 33A is reduced.

In the lateral direction Y, the first drive layer 24 is located closer to the first mount layer 13B than the first control layer 22. This structure shortens the first drive-side connection member 33A, which connects the first drive layer 24 and the source electrode 42 of each first power semiconductor element 40A on the second substrate 12. As a result, inductance caused by the first drive-side connection member 33A is reduced.

In the lateral direction Y, the second drive layer 27 is located closer to the conductive layer 15A than the second control layer 25. This structure shortens the second drive-side connection member 33B, which connects the second drive layer 27 to the source electrode 42 of each second power semiconductor element 40B on the first substrate 11. As a result, inductance caused by the second drive-side connection member 33B is reduced.

In the lateral direction Y, the second drive layer 28 is located closer to the conductive layer 15B than the second control layer 26. This structure shortens the second drive-side connection member 33B, which connects the second drive layer 28 to the source electrode 42 of each second power semiconductor element 40B on the second substrate 12. As a result, inductance caused by the second drive-side connection member 33B is reduced.

- (1-5) The first control-side detour portion 21b of the first control layer 21 and the first drive layer 23 are located at opposite sides of the first control-side wiring portion 21a in the lateral direction Y. In this structure, the first control-side detour portion 21b is located close to the side wall 81A of the case 80, that is, close to the first control terminal 53A, in the lateral direction Y. This shortens the first control terminal-side connection member 35A, which connects the first control terminal 53A to the first control-side connector 21d formed on the distal end of the first control-side detour portion 21b. As a result, inductance caused by the first control terminal-side connection member 35A is reduced.

The second control-side detour portion 26b of the second control layer 26 and the second drive layer 28 are located at opposite sides of the second control-side wiring portion 26a in the lateral direction Y. In this structure, the second control-side detour portion 26b is located close to the side wall 81B of the case 80, that is, close to the second control terminal 53B, in the lateral direction Y. This shortens the second control terminal-side connection member 35B, which connects the second control terminal 53B to the second control-side connector 26d formed on the distal end of the second control-side detour portion 26b. As a result, inductance caused by the second control terminal-side connection member 35B is reduced.

(1-6) The first drive-side detour portion 24b of the first drive layer 24 and the first drive-side wiring portion 24a are located at opposite sides of the first control layer 22 in the lateral direction Y. In this structure, the first drive-side detour portion 24b is located close to the side wall 81A of the case 80, that is, close to the first detection terminal 54A, in the lateral direction Y. This shortens the first detection terminal-side connection member 36A, which connects the first detection terminal 54A to the first drive-side connector 24d formed on the distal end of the first drive-side detour portion 24b. As a result, inductance caused by the first detection terminal-side connection member 36A is reduced.

The second drive-side detour portion 27b of the second drive layer 27 and the second drive-side wiring portion 27a are located at opposite sides of the second control layer 25 in the lateral direction Y. In this structure, the second drive-side detour portion 27b is located close to the side wall 81A of the case 80, that is, close to the second detection terminal 54B, in the lateral direction Y. This shortens the second detection terminal-side connection member 36B, which connects the second detection terminal 54B to the second drive-side connector 27d formed on the distal end of the second drive-side detour portion 27b. As a result, inductance caused by the second detection terminal-side connection member 36B is reduced.

(1-7) The first control-side connection member 32A is not connected at the first control-side detour portion 21b of the first control layer 21. The first control-side connection member 32A is connected to the first control-side wiring portion 21a. In this structure, the first control-side conductive path extending between the gate electrode 43 of each first power semiconductor element 40A on the first substrate 11 and the first control terminal 53A becomes longer from the first power semiconductor element 40Ab, which is the first power semiconductor element 40A located on the first substrate 11 closest to the third substrate side surface 11c, toward the first power semiconductor element 40Aa, which one of the first power semiconductor elements 40A on the first substrate 11 closest to the fourth substrate side surface 11d. In contrast, the first drive-side conductive path extending between the source electrode 42 of each first power semiconductor element 40A on the first substrate 11 and the first detection terminal 54A becomes longer from the first power semiconductor element 40Aa toward the first power semiconductor element 40Ab. This reduces the difference between the first power semiconductor elements 40A on the first substrate 11 in the sum of the length of the first control-side conductive path and the length of the first drive-side conductive.

The first drive-side connection member 33A is not connected at the first drive-side detour portion 24b of the first drive layer 24. The first drive-side connection member 33A is connected to the first drive-side wiring portion 24a. In this structure, the first drive-side conductive path extending between the source electrode 42 of each first power semiconductor element 40A and the first detection terminal 54A becomes longer from the first power semiconductor element 40Ad, which is the first power semiconductor element 40A located on the second substrate 12 closest to the fourth substrate side surface 12d, toward the first power semiconductor element 40Ac, which is the first power semiconductor element 40A located on the second substrate 12 closest to the third substrate side surface 12c. In contrast, the first control-side conductive path extending between the gate electrode 43 of each first power semiconductor element 40A on the second substrate 12 and the first control terminal 53A becomes longer from the first power semiconductor element 40Ac toward the first power semiconductor element 40Ad. This reduces the difference between the first power semiconductor elements 40A on the second substrate 12 in the sum of the length of the first control-side conductive path and the length of the first drive-side conductive path.

The second drive-side connection member 33B is not connected at the second drive-side detour portion 27b of the second drive layer 27. The second drive-side connection member 33B is connected to the second drive-side wiring portion 27a. In this structure, the second drive-side conductive path extending between the source electrode 42 of each second power semiconductor element 40B on the first substrate 11 and the second detection terminal 54B becomes longer from the second power semiconductor element 40Bb, which is the second power semiconductor element 40B located on the first substrate 11 closest to the third substrate side surface 11c, toward the second power semiconductor element 40Ba, which is the second power semiconductor element 40B located on the first substrate 11 closest to the fourth substrate side surface 11d. In contrast, the second control-side conductive path extending between the gate electrode 43 of each second power semiconductor element 40B on the first substrate 11 and the second control terminal 53B becomes longer from the second power semiconductor element 40Ba toward the second power semiconductor element 40Bb. This reduces the difference between the second power semiconductor elements 40B on the first substrate 11 in the sum of the length of the second control-side conductive path and the length of the second drive-side conductive path.

The second control-side connection member 32B is not connected at the second control-side detour portion 26b of the second control layer 26. The second control-side connection member 32B is connected to the second control-side wiring portion 26a. In this structure, the second control-side conductive path extending between the gate electrode 43 of each second power semiconductor element 40B on the second substrate 12 and the second control terminal 53B becomes longer from the second power semiconductor element 40Bd, which is the second power semiconductor element 40B located on the second substrate 12 closest to the fourth substrate side surface 12d, toward the second power semiconductor element 40Bc, which is the second power semiconductor element 40B located on the second substrate 12 closest to the third substrate side surface 12c. In contrast, the second drive-side conductive path extending between the source electrode 42 of each second power semiconductor element 40B on the second substrate 12 and the second detection terminal 54B becomes longer from the second power semiconductor element 40Bc toward the second power semiconductor element 40Bd. This reduces the difference between the second power semiconductor elements 40B on the second substrate 12 in the sum of the length of the second control-side conductive path and the length of the second drive-side conductive path.

(1-8) The first control-side connection members 32A connected to the first power semiconductor elements 40A extend in the lateral direction Y. The first drive-side connection members 33A connected to the first power semiconductor elements 40A extend in the lateral direction Y. The second control-side connection members 32B connected to the second power semiconductor elements 40B extend in the lateral direction Y. The second drive-side connection members 33B connected to the second power semiconductor elements 40B extend in the lateral direction Y. In these structures, the connection members 32A, 32B, 33A, and 33B are readily formed by wire bonding.

(1-9) The first control-side connector 21d of the first control layer 21 extends in the lateral direction Y and overlaps the first control layer 22 as viewed in the longitudinal direction X. Hence, the first control layer connection member 93A, which connects the first control-side connector 21d and the first control layer 22, is readily formed in the longitudinal direction X.

The first drive-side connector 24d of the first drive layer 24 extends in the lateral direction Y and overlaps the first drive layer 23 as viewed in the longitudinal direction X. Hence, the first drive layer connection member 94A, which connects the first drive-side connector 24d and the first drive layer 23, is readily formed in the longitudinal direction X.

The second drive-side connector 27d of the second drive layer 27 extends in the lateral direction Y and overlaps the second drive layer 28 as viewed in the longitudinal direction X. Hence, the second drive layer connection member 94B, which connects the second drive-side connector 27d and the second drive layer 28, is readily formed in the longitudinal direction X.

The second control-side connector 26d of the second control layer 26 extends in the lateral direction Y and overlaps the second control layer 25 as viewed in the longitudinal direction X. Hence, the second control layer connection member 93B, which connects the second control-side connector 26d and the second control layer 25, is readily formed in the longitudinal direction X.

Second Embodiment

A second embodiment of a power module 1B will now be described with reference to FIGS. 26 to 32. The power module 1B of the present embodiment differs from the power module 1A of the first embodiment mainly in structure of control layers and drive layers. The differences from the power module 1A of the first embodiment are will be described below in detail. The same reference characters are given to those components that are the same as the corresponding components of the power module 1A in the first embodiment. Such components may not be described. In FIGS. 28, 29, 31, and 32, double-dashed lines are auxiliary lines for defining the positional relationship between each control layer and each drive layer.

Figure 26:
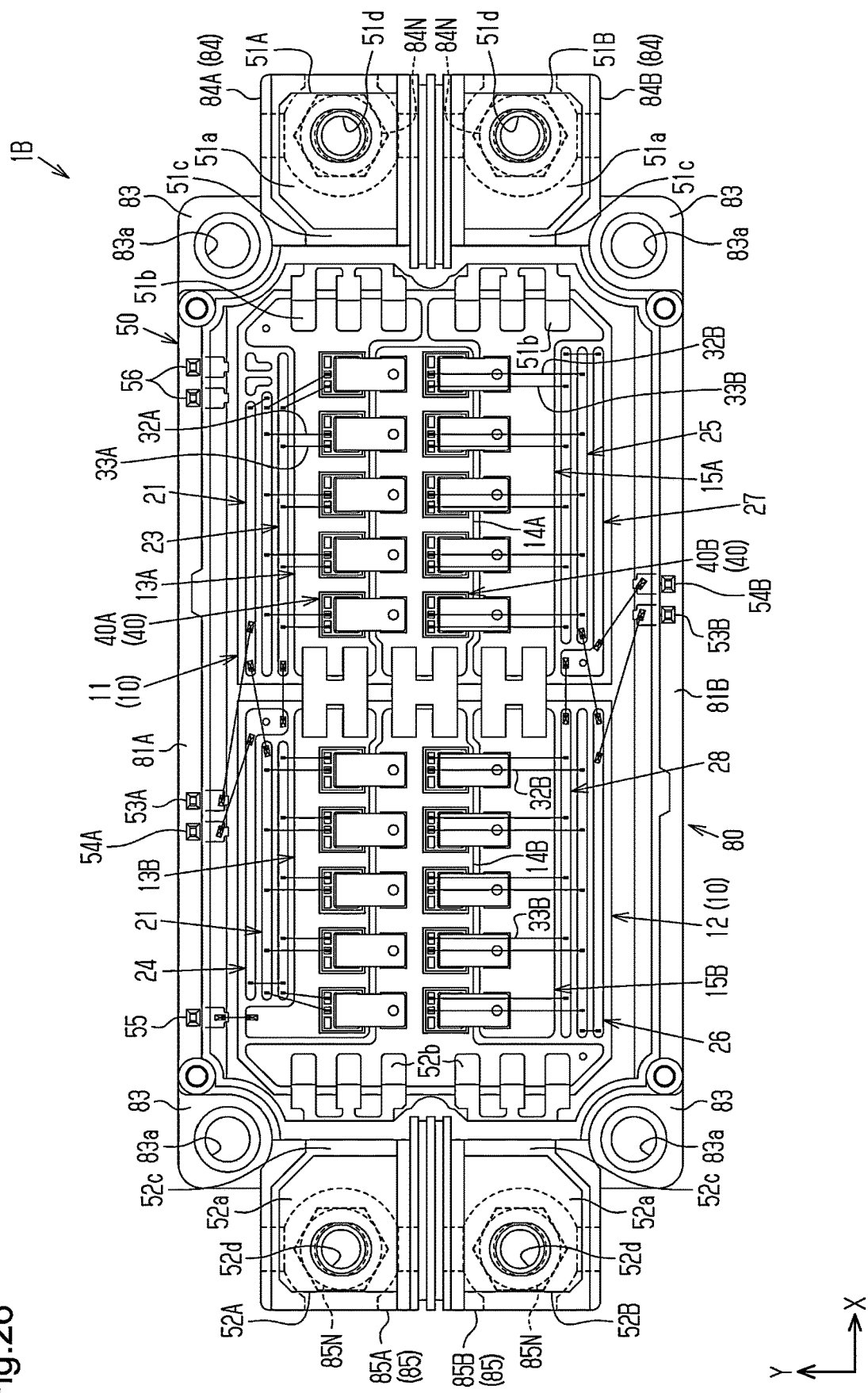
FIG. 26 is a plan view showing an internal structure of a second embodiment of a power module.
Figure 27:
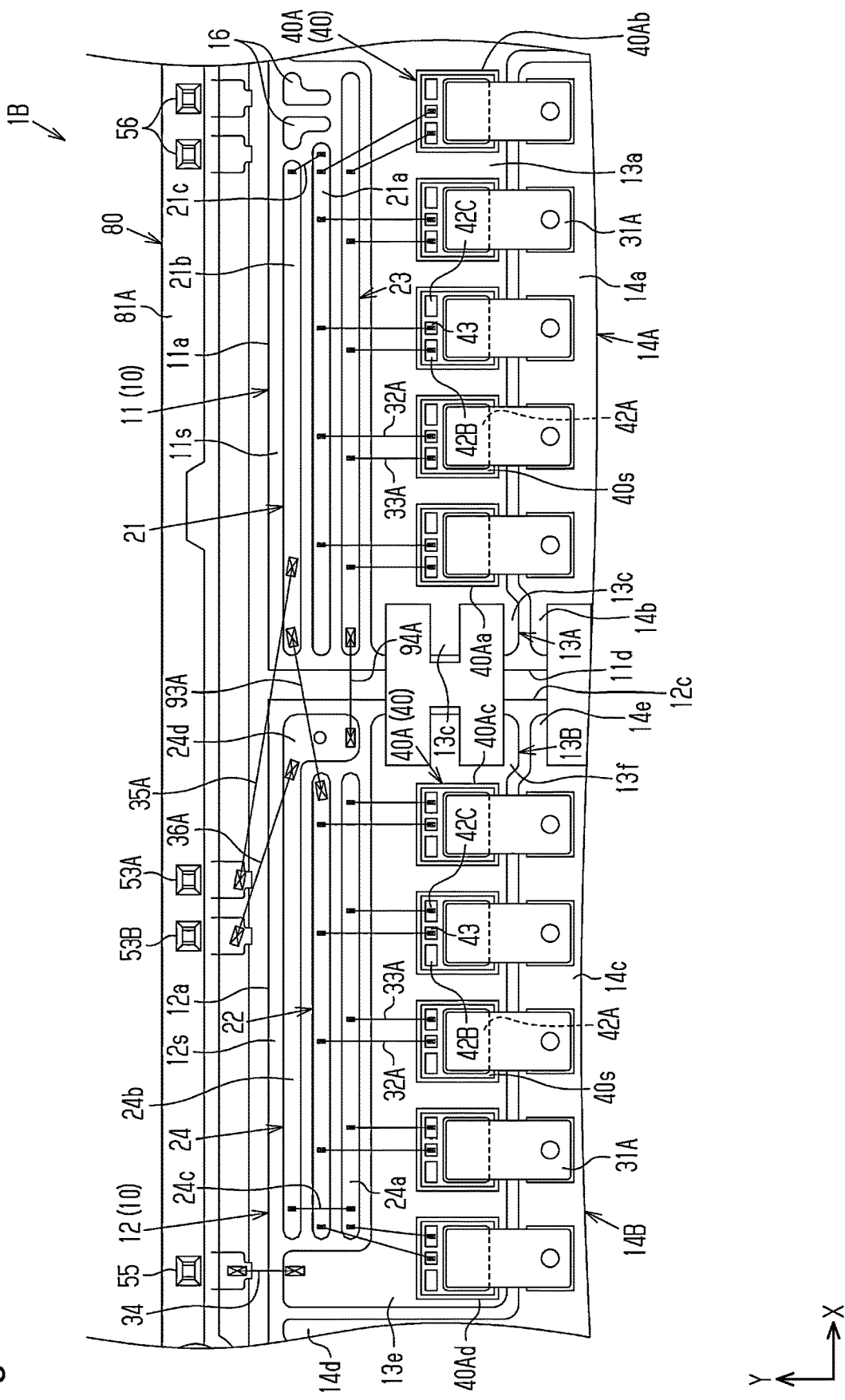
FIG. 27 is a partial enlarged view of FIG. 26.
Figure 28:
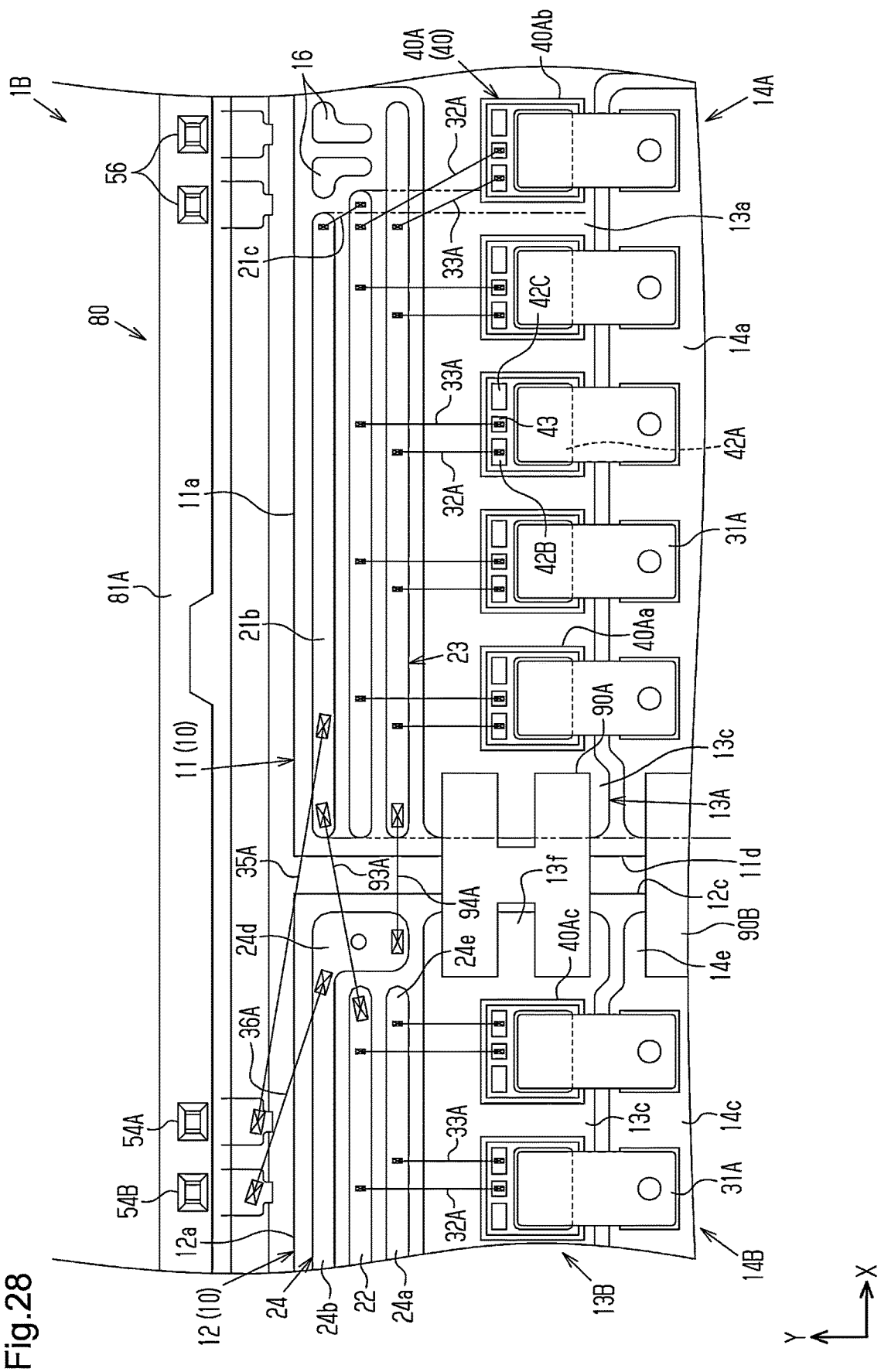
FIG. 28 is a partial enlarged view of FIG. 27.

As shown in FIGS. 26 to 28, the first control layer 21 includes the first control-side wiring portion 21a, the first control-side detour portion 21b, and the first control-side joint portion 21c. In the present embodiment, the first control-side wiring portion 21a, the first control-side detour portion 21b, and the first control-side joint portion 21c are separately formed. The first control-side wiring portion 21a and the first control-side detour portion 21b are formed of, for example, a copper foil. The first control-side joint portion 21c is, for example, a wire formed by wire bonding. The first control-side joint portion 21c is formed from, for example, Au, a Au alloy, Al, an Al alloy, Cu, or a Cu alloy.

The first control-side wiring portion 21a and the first control-side detour portion 21b extend in the longitudinal direction X. The first control-side detour portion 21b and the first drive layer 23 are located at opposite sides of the first control-side wiring portion 21a in the lateral direction Y. An end of the first control-side wiring portion 21a in the longitudinal direction X located toward the fourth substrate side surface 11d of the first substrate 11 is aligned in the longitudinal direction X with an end of the first control-side detour portion 21b in the longitudinal direction X located toward the fourth substrate side surface 11d of the first substrate 11. These ends are aligned with the interlayer connection portion 13c of the first mount layer 13A as viewed in the lateral direction Y. That is, the ends are located closer to the fourth substrate side surface 11d of the first substrate 11 than the first power semiconductor element 40Aa, which is the first power semiconductor element 40A located closest to the fourth substrate side surface 11d of the first substrate 11. The first control-side wiring portion 21a is longer than the first control-side detour portion 21b in the longitudinal direction X. That is, an end of the first control-side wiring portion 21a in the longitudinal direction X located toward the third substrate side surface 11c of the first substrate 11 is located closer to the third substrate side surface 11c than an end of the first control-side detour portion 21b in the longitudinal direction X located toward the third substrate side surface 11c of the first substrate 11.

The first control-side wiring portion 21a is formed to overlap the first power semiconductor elements 40A as viewed in the lateral direction Y. The end of the first control-side wiring portion 21a in the longitudinal direction X located toward the third substrate side surface 11c of the first substrate 11 is formed to overlap an end of the first power semiconductor element 40Ab in the longitudinal direction X located toward the fourth substrate side surface 11d of the first substrate 11. The first power semiconductor element 40Ab is one of the first power semiconductor elements 40A located closest to the third substrate side surface 11c of the first substrate 11.

The first control-side connection member 32A connected to each first power semiconductor element 40A of the first substrate 11 is connected to the first control-side wiring portion 21a. The first control-side connection members 32A are separated from each other in the longitudinal direction X, which conforms to the arrangement direction of the first power semiconductor elements 40A. The first control-side connection members 32A that are connected to the four first power semiconductor elements 40A excluding the first power semiconductor element 40Ab, which is the first power semiconductor element 40A located closest to the third substrate side surface 11c of the first substrate 11, extend in the lateral direction Y in plan view. The gate electrode 43 of the first power semiconductor element 40Ab is located closer to the third substrate side surface 11c of the first substrate 11 than the first control-side wiring portion 21a. Hence, the first control-side connection member 32A connected to the first power semiconductor element 40Ab is inclined toward the fourth substrate side surface 11d as the first control-side connection member 32A extends toward the first substrate side surface 11a of the first substrate 11.

The first control-side detour portion 21b is formed to overlap the first power semiconductor elements 40A excluding the first power semiconductor element 40Ab as viewed in the lateral direction Y. That is, the end of the first control-side detour portion 21b in the longitudinal direction X located toward the third substrate side surface 11c of the first substrate 11 is located closer to the fourth substrate side surface 11d of the first substrate 11 than the first power semiconductor element 40Ab. As shown in FIGS. 26 to 28, the first control-side connection members 32A are not connected at the first control-side detour portion 21b.

The first control-side joint portion 21c connects the end of the first control-side wiring portion 21a in the longitudinal direction X located toward the third substrate side surface 11c of the first substrate 11 and the end of the first control-side detour portion 21b in the longitudinal direction X located toward the third substrate side surface 11c of the first substrate 11. Thus, the first control-side wiring portion 21a is electrically connected to the first control-side detour portion 21b. The first control-side joint portion 21c is located closer to the third substrate side surface 11c of the first substrate 11 than the first control-side connection member 32A that is connected to the first power semiconductor element 40Ab. As the first control-side joint portion 21c extends toward the first substrate side surface 11a of the first substrate 11, the first control-side joint portion 21c is inclined toward the fourth substrate side surface 11d.

The first drive layer 23 extends in the longitudinal direction X. The first drive layer 23 is arranged adjacent to the first mount layer 13A in the lateral direction Y. The first drive layer 23 is located between the first control-side wiring portion 21a and the first mount layer 13A in the lateral direction Y. The first drive layer 23 is longer than the first control-side wiring portion 21a and the first control-side detour portion 21b. An end of the first drive layer 23 in the longitudinal direction X located toward the fourth substrate side surface 11d of the first substrate 11 is aligned in the lateral direction Y with an end of the first control-side wiring portion 21a in the longitudinal direction X located toward the fourth substrate side surface 11d and an end of the first control-side detour portion 21b in the longitudinal direction X located toward the fourth substrate side surface 11d. The first drive layer 23 overlaps the first power semiconductor elements 40A of the first substrate 11 as viewed in the lateral direction Y. The first drive layer 23 also overlaps the thermistor mount layer 16 as viewed in the lateral direction Y.

The first drive-side connection member 33A connected to each first power semiconductor element 40A of the first substrate 11 is connected to the first drive layer 23. The first drive-side connection members 33A are separated from each other in the longitudinal direction X, which conforms to the arrangement direction of the first power semiconductor elements 40A. The first drive-side connection members 33A that are connected to the four first power semiconductor elements 40A excluding the first power semiconductor element 40Ab, which is the first power semiconductor element 40A located closest to the third substrate side surface 11c of the first substrate 11, extend in the lateral direction Y in plan view. The first drive-side connection member 33A that is connected to the first power semiconductor element 40Ab is inclined toward the fourth substrate side surface 11d as the first drive-side connection member 33A extends toward the first substrate side surface 11a of the first substrate 11.

The thermistor mount layer 16 differs from the thermistor mount layer 16 of the first embodiment in orientation relative to the first substrate 11. The thermistor mount layer 16 is arranged so as to be rotated in the clockwise direction by 90° from the thermistor mount layer 16 of the first embodiment. The thermistor mount layer 16 overlaps the first control layer 21 as viewed in the longitudinal direction X. The thermistor mount layer 16 is located closer to the first substrate side surface 11a of the first substrate 11 than the first drive layer 23 in the lateral direction Y.

Figure 29:
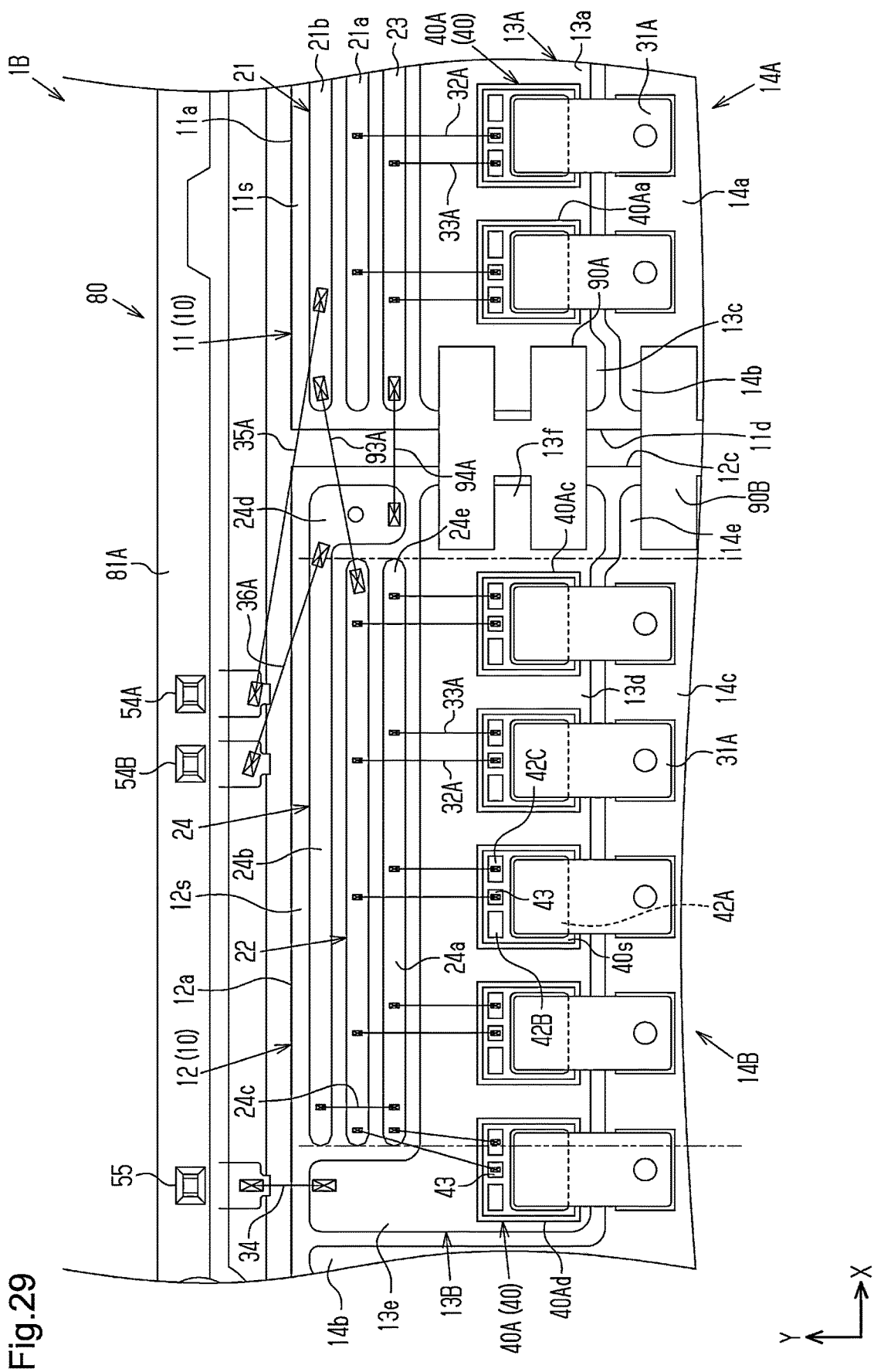
FIG. 29 is a partial enlarged view of FIG. 27.

As shown in FIGS. 27 and 29, the first drive layer 24 includes a first drive-side wiring portion 24a, a first drive-side detour portion 24b, a first drive-side joint portion 24c, and a first drive-side connector 24d. In the present embodiment, the first drive-side wiring portion 24a, the first drive-side detour portion 24b, and the first drive-side joint portion 24c are separately formed, and the first drive-side detour portion 24b and the first drive-side connector 24d are integrally formed. The first drive-side wiring portion 24a, the first drive-side detour portion 24b, and the first drive-side connector 24d are formed of, for example, a copper foil. The first drive-side joint portion 24c is, for example, a wire formed by wire bonding. The first drive-side joint portion 24c is formed from, for example, Au, a Au alloy, Al, an Al alloy, Cu, or a Cu alloy.

The first drive-side wiring portion 24a and the first drive-side detour portion 24b extend in the longitudinal direction X. The first drive-side detour portion 24b and the first drive layer 24 are located at opposite sides of the first drive-side wiring portion 24a in the lateral direction Y. An end of the first drive-side wiring portion 24a in the longitudinal direction X located toward the fourth substrate side surface 12d of the second substrate 12 is aligned in the longitudinal direction X with an end of the first drive-side detour portion 24b in the longitudinal direction X located toward the fourth substrate side surface 12d of the second substrate 12. These ends are adjacent to the interlayer connection portion 13f of the first mount layer 13B as viewed in the lateral direction Y. The first drive-side detour portion 24b is slightly longer than the first drive-side wiring portion 24a in the longitudinal direction X.

The first drive-side wiring portion 24a is formed to overlap the first power semiconductor elements 40A as viewed in the lateral direction Y. the end of the first drive-side wiring portion 24a in the longitudinal direction X located toward the fourth substrate side surface 12d of the second substrate 12 is formed to overlap an end of the first power semiconductor element 40Ad in the longitudinal direction X located toward the third substrate side surface 12c of the second substrate 12. The first power semiconductor element 40Ad is one of the first power semiconductor elements 40A located closest to the fourth substrate side surface 12d of the second substrate 12.

The first drive-side connection member 33A connected to each first power semiconductor element 40A of the second substrate 12 is connected to the first drive-side wiring portion 24a. The first drive-side connection members 33A are separated from each other in the longitudinal direction X, which conforms to the arrangement direction of the first power semiconductor elements 40A. The first drive-side connection members 33A that are connected to the four first power semiconductor elements 40A excluding the first power semiconductor element 40Ad extend in the lateral direction Y in plan view. The gate electrode 43 of the first power semiconductor element 40Ad is located closer to the fourth substrate side surface 12d of the second substrate 12 than the first drive-side wiring portion 24a. Hence, the first drive-side connection member 33A connected to the first power semiconductor element 40Ad is inclined toward the third substrate side surface 12c as the first drive-side connection member 33A extends toward the first substrate side surface 12a of the second substrate 12.

The first drive-side detour portion 24b is formed to overlap the first power semiconductor elements 40A as viewed in the lateral direction Y. As shown in FIGS. 26, 27, and 29, the first drive-side connection members 33A are not connected at the first drive-side detour portion 24b.

The first drive-side joint portion 24c joins a point of the first drive-side wiring portion 24a in the longitudinal direction X located toward the fourth substrate side surface 12d of the second substrate 12 and a point of the first drive-side detour portion 24b in the longitudinal direction X located toward the fourth substrate side surface 12d of the second substrate 12. In plan view, the first drive-side joint portion 24c extends in the lateral direction Y. The first drive-side joint portion 24c is formed to extend over the first control layer 22.

The first drive-side connector 24d is formed on an end of the first drive-side detour portion 24b in the longitudinal direction X located toward the third substrate side surface 12c of the second substrate 12. The first drive-side connector 24d is located closer to the third substrate side surface 12c of the second substrate 12 than the first drive-side wiring portion 24a in the longitudinal direction X. The first drive-side connector 24d extends in the lateral direction Y. The first drive-side connector 24d is arranged adjacent to the interlayer connection portion 13f of the first mount layer 13B in the lateral direction Y. The width-wise dimension of the first drive-side connector 24d (dimension of the first drive-side connector 24d in the longitudinal direction X) is greater than the width-wise dimension of the first drive-side detour portion 24b (dimension of the first drive-side detour portion 24b in the lateral direction Y). The first drive-side connector 24d is separated from the first drive-side wiring portion 24a in the longitudinal direction X when the edge of the first drive-side connector 24d in the lateral direction Y located toward the first mount layer 13B is aligned in the lateral direction Y with the edge of the first drive-side wiring portion 24a in the lateral direction Y located toward the first mount layer 13B.

The first control layer 22 is located between the first drive-side wiring portion 24a and the first drive-side detour portion 24b of the first drive layer 24 in the lateral direction Y. The first control layer 22 extends in the longitudinal direction X. In plan view, the first control layer 22 is slim-band-shaped. In the present embodiment, the width-wise dimension of the first control layer 22 (dimension of the first control layer 22 in the lateral direction Y) is equal to the width-wise dimension of the first drive-side wiring portion 24a of the first drive layer 24 (dimension of the first drive-side wiring portion 24a in the lateral direction Y). The width-wise dimension of the first control layer 22 is also equal to the width-wise dimension of the first drive-side detour portion 24b of the first drive layer 24 (dimension of the first drive-side detour portion 24b in the lateral direction Y).

When the difference in the dimension in the lateral direction Y between the first control layer 22 and the first drive-side wiring portion 24a of the first drive layer 24 is within, for example, 5% of the dimension of the first drive-side wiring portion 24a of the first drive layer 24 in the lateral direction Y, the width-wise dimension of the first control layer 22 may be considered to be equal to the width-wise dimension of the first drive-side wiring portion 24a of the first drive layer 24. When the difference in the dimension in the lateral direction Y between the first control layer 22 and the first drive-side detour portion 24b of the first drive layer 24 is within, for example, 5% of the dimension of the first drive-side detour portion 24b of the first drive layer 24 in the lateral direction Y, the width-wise dimension of the first control layer 22 may be considered to be equal to the width-wise dimension of the first drive-side detour portion 24b of the first drive layer 24.

The first control layer 22 is equal to the first drive-side wiring portion 24a of the first drive layer 24 in the longitudinal direction X. As viewed in the lateral direction Y, the end of the first control layer 22 in the longitudinal direction X located toward the third substrate side surface 12c of the second substrate 12 is aligned with the end 24e of the first drive-side wiring portion 24a of the first drive layer 24. Also, the end of the first control layer 22 in the longitudinal direction X located toward the third substrate side surface 12c of the second substrate 12 is located adjacent to the interlayer connection portion 13f of the first mount layer 13B in the longitudinal direction X. As viewed in the longitudinal direction X, the first control layer 22 overlaps the first drive-side connector 24d of the first drive layer 24.

The first control-side connection member 32A connected to each first power semiconductor element 40A of the second substrate 12 is connected to the first control layer 22. The first control-side connection members 32A are separated from each other in the longitudinal direction X, which conforms to the arrangement direction of the first power semiconductor elements 40A. The first control-side connection member 32A that are connected to the four first power semiconductor elements 40A excluding the first power semiconductor element 40Ad, which is located closest to the fourth substrate side surface 12d of the second substrate 12 among the first power semiconductor elements 40A, extend in the lateral direction Y in plan view. The gate electrode 43 of the first power semiconductor element 40Ad is located closer to the fourth substrate side surface 12d of the second substrate 12 than the first control layer 22. Hence, the first control-side connection member 32A connected to the first power semiconductor element 40Ad is inclined toward the third substrate side surface 12c as the first control-side connection member 32A extends toward the first substrate side surface 12a of the second substrate 12.

As shown in FIGS. 26 to 29, the first control terminal-side connection member 35A is connected to a point of the first control-side detour portion 21b located toward the fourth substrate side surface 11d of the first substrate 11 in the longitudinal direction X. As viewed in the lateral direction Y, the first control terminal-side connection member 35A is formed to overlap the first power semiconductor element 40Aa.

The first control layer connection member 93A is connected to an end of the first control-side detour portion 21b in the longitudinal direction X located toward the fourth substrate side surface 11d of the first substrate 11. The first control layer connection member 93A is located closer to the fourth substrate side surface 11d of the first substrate 11 than the first power semiconductor element 40Aa. The first control layer connection member 93A is also connected to an end of the first control layer 22 in the longitudinal direction X located toward the third substrate side surface 12c of the second substrate 12. The first control-side detour portion 21b is located closer to the side wall 81A of the case 80 than the first control layer 22 in the lateral direction Y. Hence, in plan view, as the first control layer connection member 93A extends from the first control layer 22 toward the first control layer 21, the first control layer connection member 93A is inclined toward the side wall 81A. As shown in FIG. 26, the first control layer connection member 93A extends over the first drive-side connector 24d of the first drive layer 24 in the longitudinal direction X.

The first detection terminal-side connection member 36A is connected to the first drive-side detour portion 24b. More specifically, the first detection terminal-side connection member 36A is connected to an end of the first drive-side detour portion 24b in the longitudinal direction X located toward the first drive-side connector 24d.

The first drive layer connection member 94A is connected to the end of the first drive layer 23 in the longitudinal direction X located toward the fourth substrate side surface 11d of the first substrate 11. The first drive layer connection member 94A is connected to an end of the first drive-side connector 24d in the lateral direction Y located toward the first mount layer 13B. In plan view, the first drive layer connection member 94A extends in the longitudinal direction X.

Figure 30:
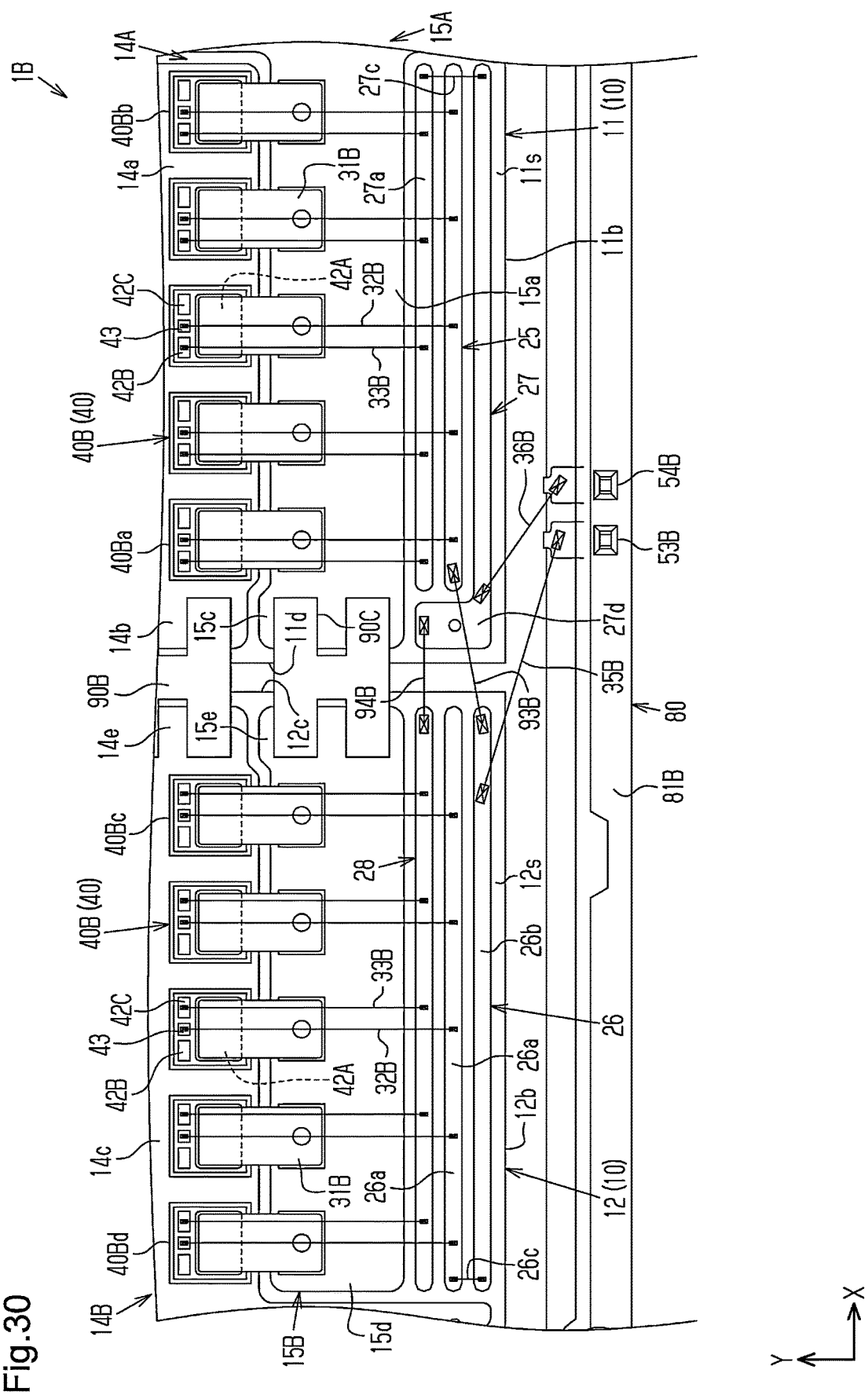
FIG. 30 is a partial enlarged view of FIG. 26.
Figure 31:
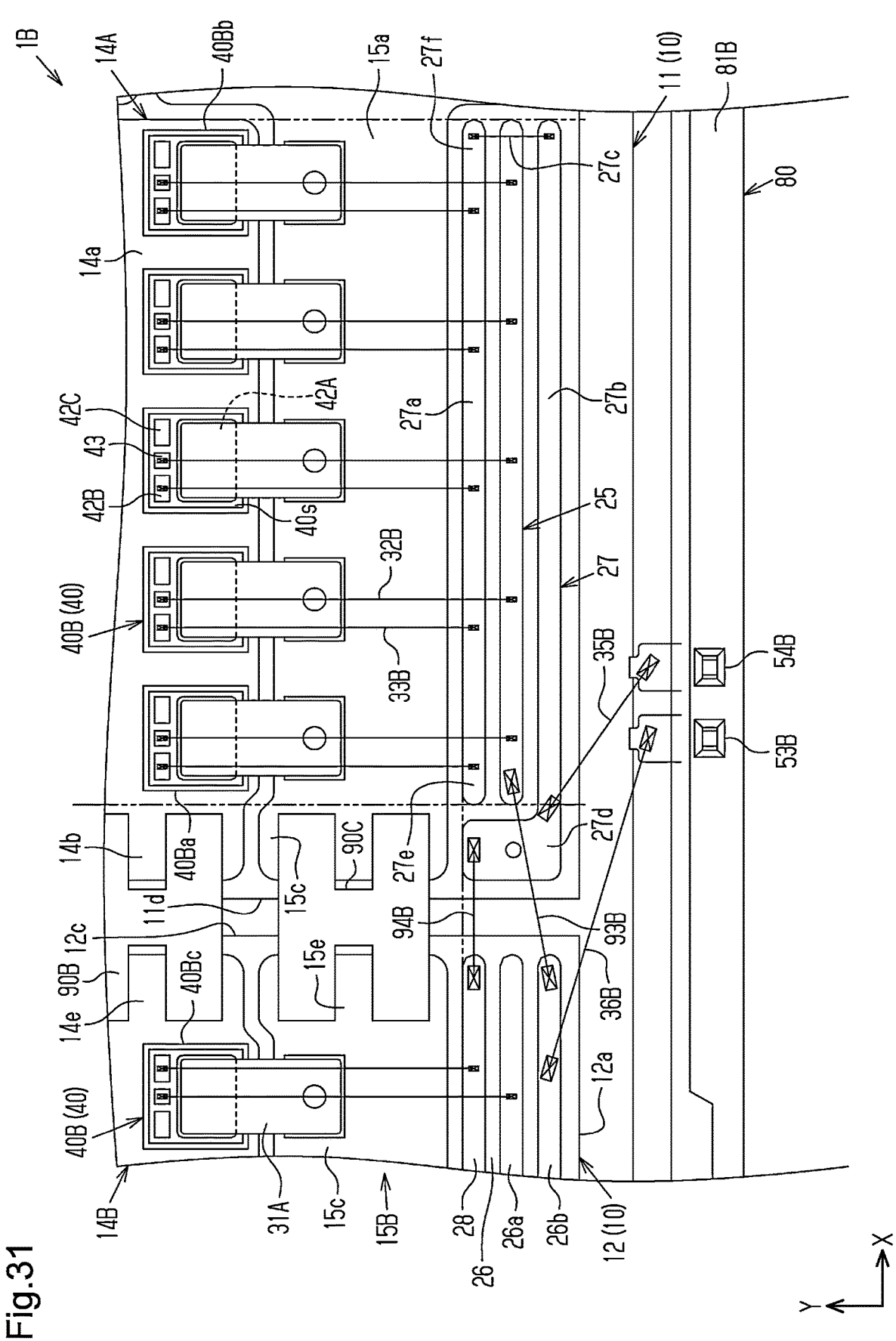
FIG. 31 is a partial enlarged view of FIG. 30.

As shown in FIGS. 30 and 31, the second drive layer 27 includes a second drive-side wiring portion 27a, a second drive-side detour portion 27b, a second drive-side joint portion 27c, and a second drive-side connector 27d. In the present embodiment, the second drive-side wiring portion 27a, the second drive-side detour portion 27b, and the second drive-side joint portion 27c are separately formed, and the second drive-side detour portion 27b and the second drive-side connector 27d are integrally formed. The second drive-side wiring portion 27a, the second drive-side detour portion 27b, and the second drive-side connector 27d are formed of, for example, a copper foil. The second drive-side joint portion 27c is a wire formed by wire bonding. In plan view, the second drive-side wiring portion 27a and the second drive-side detour portion 27b are slim-band-shaped.

The second drive-side wiring portion 27a extends in the longitudinal direction X. In the lateral direction Y, the second drive-side wiring portion 27a is arranged adjacent to the conductive layer 15A. The end 27e of the second drive-side wiring portion 27a, which is located toward the fourth substrate side surface 11d of the first substrate 11 in the longitudinal direction X, is located closer to the fourth substrate side surface 11d of the first substrate 11 than a second power semiconductor element 40Ba that is one of the second power semiconductor elements 40B located closest to the fourth substrate side surface 11d in the longitudinal direction X. The second drive-side wiring portion 27a has an end 27f located toward the third substrate side surface 11c of the first substrate 11 in the longitudinal direction X. The end 27f is located closer to the third substrate side surface 11c of the first substrate 11 than the second power semiconductor element 40Bb, which is the second power semiconductor element 40B located closest to the third substrate side surface 11c, in the longitudinal direction X. That is, as viewed in the lateral direction Y, the second drive-side wiring portion 27a extends in the longitudinal direction X to overlap all of the second power semiconductor elements 40B arranged on the first substrate 11.

The second drive-side connection member 33B connected to each second power semiconductor element 40B is connected to the second drive-side wiring portion 27a. The second drive-side connection members 33B are separated from each other in the longitudinal direction X, which conforms to the arrangement direction of the second power semiconductor elements 40B. The second drive-side connection members 33B that are connected to the second power semiconductor elements 40B extend in the lateral direction Y in plan view.

The second drive-side detour portion 27b is separated from the second drive-side wiring portion 27a in the lateral direction Y. The second drive-side detour portion 27b and the conductive layer 15A are located at opposite sides of the second drive-side wiring portion 27a in the lateral direction Y. The second drive-side detour portion 27b is located closer to the second substrate side surface 11b of the first substrate 11 than the second control layer 25 in the lateral direction Y. In the lateral direction Y, the second drive-side detour portion 27b is arranged adjacent to the second substrate side surface 11b of the first substrate 11. The second drive-side detour portion 27b extends in the longitudinal direction X. The second drive-side detour portion 27b is slightly longer than the second drive-side wiring portion 27a in the longitudinal direction X. As shown in FIG. 31, the second drive-side connection members 33B are not connected at the second drive-side detour portion 27b.

The second drive-side joint portion 27c joins the second drive-side wiring portion 27a and the second drive-side detour portion 27b. More specifically, the second drive-side joint portion 27c joins an end of the second drive-side wiring portion 27a in the longitudinal direction X located toward the third substrate side surface 11c of the first substrate 11 and an end of the second drive-side detour portion 27b in the longitudinal direction X located toward the third substrate side surface 11c. The second drive-side joint portion 27c extends in the lateral direction Y. As viewed in the lateral direction Y, the second drive-side joint portion 27c is arranged to overlap an end of the second power semiconductor element 40Bb in the longitudinal direction X located toward the third substrate side surface 11c of the first substrate 11. The second power semiconductor element 40Bb is one of the second power semiconductor elements 40B located closest to the third substrate side surface 11c. In the longitudinal direction X, the second drive-side joint portion 27c is located closer to the third substrate side surface 11c of the first substrate 11 than the second control-side connection member 32B and the second drive-side connection member 33B that are connected to the second power semiconductor element 40Bb.

The second drive-side connector 27d is formed on a distal end of the second drive-side detour portion 27b. The second drive-side connector 27d is located closer to the fourth substrate side surface 11d of the first substrate 11 than the second drive-side wiring portion 27a in the longitudinal direction X. The second drive-side connector 27d extends in the lateral direction Y. The width-wise dimension of the second drive-side connector 27d (dimension of the second drive-side connector 27d in the longitudinal direction X) is greater than the width-wise dimension of the second drive-side detour portion 27b (dimension of the second drive-side detour portion 27b in the lateral direction Y). The second drive-side connector 27d is separated from the second drive-side wiring portion 27a in the longitudinal direction X when the edge of the second drive-side connector 27d in the lateral direction Y located toward the conductive layer 15A is aligned in the lateral direction Y with the edge of the second drive-side wiring portion 27a in the lateral direction Y located toward the conductive layer 15A.

The second control layer 25 extends in the longitudinal direction X. In plan view, the second control layer 25 is slim-band-shaped. The second control layer 25 is located between the second drive-side wiring portion 27a and the second drive-side detour portion 27b in the lateral direction Y. In the present embodiment, the width-wise dimension of the second control layer 25 (dimension of the second control layer 25 in the lateral direction Y) is equal to the width-wise dimension of the second drive-side wiring portion 27a of the second drive layer 27 (dimension of the second drive-side wiring portion 27a in the lateral direction Y). The width-wise dimension of the second control layer 25 is also equal to the width-wise dimension of the second drive-side detour portion 27*b* of the second drive layer 27 (dimension of the second drive-side detour portion 27*b* in the lateral direction Y).

When the difference in the dimension in the lateral direction Y between the second control layer 25 and the second drive-side wiring portion 27*a* of the second drive layer 27 is within, for example, 5% of the dimension of the second drive-side wiring portion 27*a* of the second drive layer 27 in the lateral direction Y, the width-wise dimension of the second control layer 25 may be considered to be equal to the width-wise dimension of the second drive-side wiring portion 27*a* of the second drive layer 27. When the difference in the dimension in the lateral direction Y between the second control layer 25 and the second drive-side detour portion 27*b* of the second drive layer 27 is within, for example, 5% of the dimension of the second drive-side detour portion 27*b* of the second drive layer 27 in the lateral direction Y, the width-wise dimension of the second control layer 25 may be considered to be equal to the width-wise dimension of the second drive-side detour portion 27*b* of the second drive layer 27.

The second control layer 25 is equal to the second drive-side wiring portion 27*a* of the second drive layer 27 in the longitudinal direction X. In the lateral direction Y, opposite ends of the second control layer 25 in the longitudinal direction X are aligned with opposite ends of the second drive-side wiring portion 27*a* of the second drive layer 27 in the longitudinal direction X.

The second control-side connection member 32B connected to each second power semiconductor element 40B is connected to the second control layer 25. The second control-side connection members 32B are separated from each other in the longitudinal direction X, which conforms to the arrangement direction of the second power semiconductor elements 40B. The second control-side connection members 32B that are connected to the second power semiconductor elements 40B extend in the lateral direction Y in plan view. The first drive layer connection member 94A is connected to the end of the first drive layer 23 in the longitudinal direction X located toward the fourth substrate side surface 11*d* of the first substrate 11.

Figure 32:
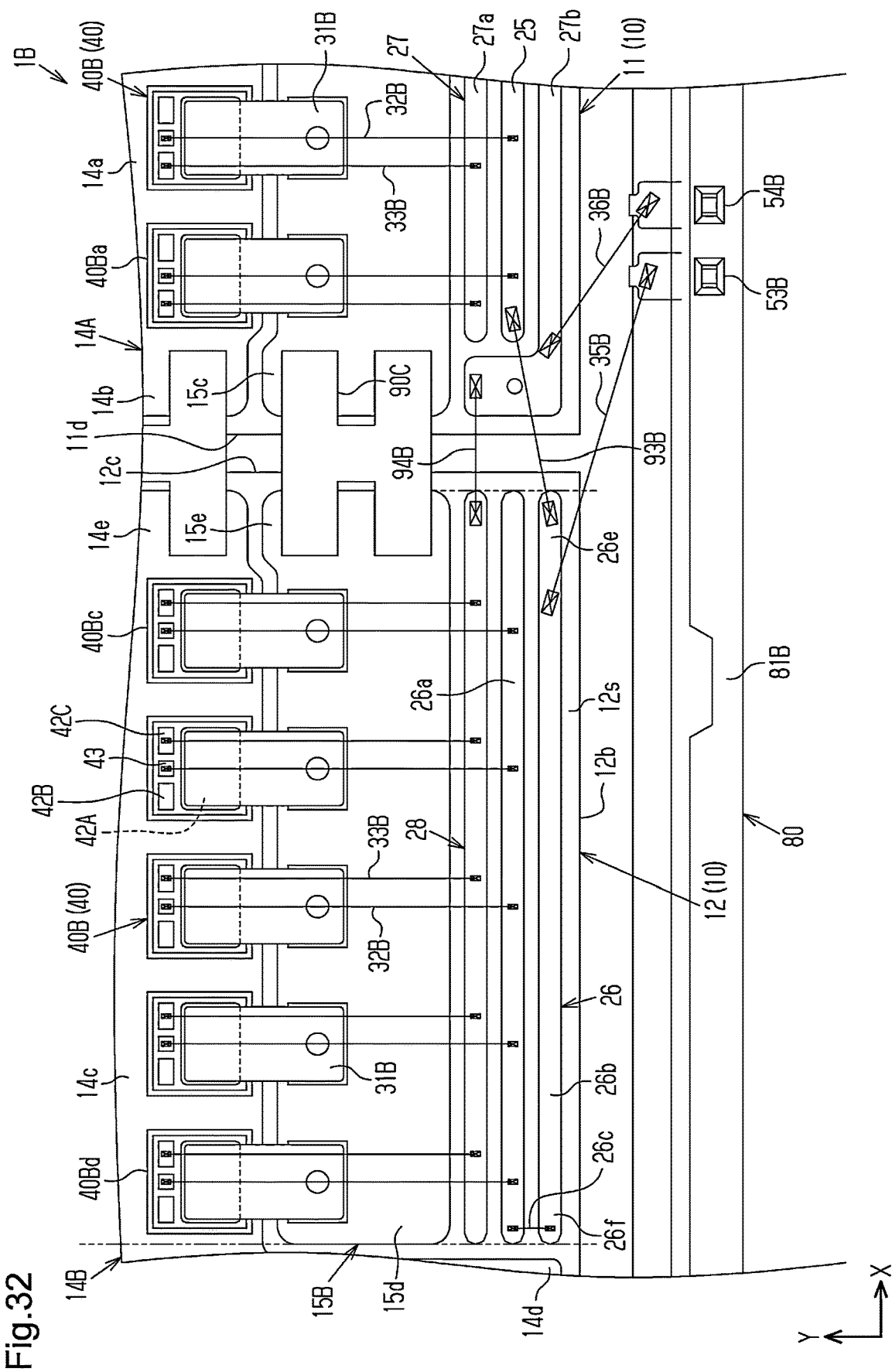
FIG. 32 is a partial enlarged view of FIG. 30.

As shown in FIGS. 30 and 32, the second control layer 26 includes the second control-side wiring portion 26*a*, the second control-side detour portion 26*b*, and the second control-side joint portion 26*c*. In the present embodiment, the second control-side wiring portion 26*a*, the second control-side detour portion 26*b*, and the second control-side joint portion 26*c* are separately formed. The second control-side wiring portion 26*a*, the second control-side detour portion 26*b*, and the second control-side connector 26*d* are formed of, for example, a copper foil. The second control-side joint portion 26*c* is a wire formed by wire bonding. In plan view, the second control-side wiring portion 26*a* and the second control-side detour portion 26*b* are slim-band-shaped.

The second control-side wiring portion 26*a* extends in the longitudinal direction X. The end 26*e* of the second control-side wiring portion 26*a*, which is located toward the third substrate side surface 12*c* of the second substrate 12 in the longitudinal direction X, is located closer to the third substrate side surface 12*c* of the second substrate 12 than a second power semiconductor element 40B*c* that is one of the second power semiconductor elements 40B located closest to the third substrate side surface 12*c* in the longitudinal direction X. The second control-side wiring portion 26*a* has an end 26*f* in the longitudinal direction X located toward the fourth substrate side surface 12*d* of the second substrate 12.

The end 26*f* is located closer to the fourth substrate side surface 12*d* of the second substrate 12 than the second power semiconductor element 40B*d*, which is the second power semiconductor element 40B located closest to the fourth substrate side surface 12*d*, in the longitudinal direction X.

The second control-side connection member 32B connected to each second power semiconductor element 40B is connected to the second control-side wiring portion 26*a*. The second control-side connection members 32B are separated from each other in the longitudinal direction X, which conforms to the arrangement direction of the second power semiconductor elements 40B. The second control-side connection members 32B that are connected to the second power semiconductor elements 40B extend in the lateral direction Y in plan view.

The second control-side detour portion 26*b* is separated from the second control-side wiring portion 26*a* in the lateral direction Y. The second control-side detour portion 26*b* and the second drive layer 28 are located at opposite sides of the second control-side wiring portion 26*a* in the lateral direction Y. The second control-side detour portion 26*b* is arranged adjacent to the second substrate side surface 12*b* of the second substrate 12 in the lateral direction Y. The second control-side detour portion 26*b* extends in the longitudinal direction X. The second control-side detour portion 26*b* is equal to the second control-side wiring portion 26*a* in the longitudinal direction X. Opposite ends of the second control-side detour portion 26*b* in the longitudinal direction X are aligned with opposite ends of the second control-side wiring portion 26*a* in the longitudinal direction X. As shown in FIG. 32, the second control-side connection members 32B are not connected at the second control-side detour portion 26*b*.

The second control-side joint portion 26*c* joins the second control-side wiring portion 26*a* and the second control-side detour portion 26*b*. More specifically, the second control-side joint portion 26*c* joins an end of the second control-side wiring portion 26*a* in the longitudinal direction X located toward the fourth substrate side surface 12*d* of the second substrate 12 and an end of the second control-side detour portion 26*b* in the longitudinal direction X located toward the fourth substrate side surface 12*d*. The second control-side joint portion 26*c* extends in the lateral direction Y. As viewed in the lateral direction Y, the second control-side joint portion 26*c* is arranged to overlap the second power semiconductor element 40B*d*, which is the second power semiconductor element 40B located closest to the fourth substrate side surface 12*d* of the second substrate 12 in the longitudinal direction X. In the longitudinal direction X, the second control-side joint portion 26*c* is located closer to the fourth substrate side surface 12*d* of the second substrate 12 than the second control-side connection member 32B and the second drive-side connection member 33B that are connected to the second power semiconductor element 40B*d*.

The second drive layer 28 extends in the longitudinal direction X. In plan view, the second drive layer 28 is slim-band-shaped. In the lateral direction Y, the second drive layer 28 is arranged adjacent to the conductive layer 15B. In the present embodiment, the width-wise dimension of the second drive layer 28 (dimension of the second drive layer 28 in the lateral direction Y) is equal to the width-wise dimension of the second control-side wiring portion 26*a* of the second control layer 26 (dimension of the second control-side wiring portion 26*a* in the lateral direction Y). The width-wise dimension of the second drive layer 28 is also equal to the width-wise dimension of the second control-side detour portion 26b of the second control layer 26 (dimension of the second control-side detour portion 26b in the lateral direction Y).

When the difference in the dimension in the lateral direction Y between the second drive layer 28 and the second control-side wiring portion 26a of the second control layer 26 is within, for example, 5% of the dimension of the second control-side wiring portion 26a of the second control layer 26 in the lateral direction Y, the width-wise dimension of the second drive layer 28 may be considered to be equal to the width-wise dimension of the second control-side wiring portion 26a of the second control layer 26. When the dimension in the lateral direction Y between the second drive layer 28 and the second control-side detour portion 26b of the second control layer 26 is within, for example, 5% of the dimension of the second control-side detour portion 26b of the second control layer 26 in the lateral direction Y, the width-wise dimension of the second drive layer 28 may be considered to be equal to the width-wise dimension of the second control-side detour portion 26b of the second control layer 26.

The second drive layer 28 and the second control-side wiring portion 26a of the second control layer 26 are equal in length in the longitudinal direction X. Opposite ends of the second drive layer 28 in the longitudinal direction X are aligned with opposite ends of the second control-side wiring portion 26a of the second control layer 26 in the longitudinal direction X. The second drive layer 28 and the second control-side detour portion 26b of the second control layer 26 are equal in length in the longitudinal direction X. Opposite ends of the second drive layer 28 in the longitudinal direction X are aligned with opposite ends of the second control-side detour portion 26b of the second control layer 26 in the longitudinal direction X.

The second drive-side connection member 33B connected to each second power semiconductor element 40B of the second substrate 12 is connected to the second drive layer 28. The second drive-side connection members 33B are separated from each other in the longitudinal direction X, which conforms to the arrangement direction of the second power semiconductor elements 40B. The second drive-side connection members 33B that are connected to the second power semiconductor elements 40B extend in the lateral direction Y in plan view.

As shown in FIGS. 30 to 32, the second detection terminal-side connection member 36B is connected to the second drive-side detour portion 27b. More specifically, the second detection terminal-side connection member 36B is connected to an end of the second drive-side detour portion 27b in the longitudinal direction X located toward the second drive-side connector 27d.

The second drive layer connection member 94B is connected to the second drive-side connector 27d. More specifically, the second drive layer connection member 94B is connected to an end of the second drive-side connector 27d in the lateral direction Y located toward the conductive layer 15A. The second drive layer connection member 94B is also connected to an end of the second drive layer 28 in the longitudinal direction X located toward the third substrate side surface 12c of the second substrate 12. In plan view, the second drive layer connection member 94B extends in the longitudinal direction X.

The second control terminal-side connection member 35B and the second control layer connection member 93B are connected to the second control-side detour portion 26b. The second control terminal-side connection member 35B is connected to a point of the second control-side detour portion 26b in the longitudinal direction X located toward the third substrate side surface 12c of the second substrate 12. The second control layer connection member 93B is connected to the end 26e of the second control-side detour portion 26b, which is located toward the third substrate side surface 12c of the second substrate 12 in the longitudinal direction X. The second control layer connection member 93B is also connected to the end 25x of the second control layer 25, which is located toward the fourth substrate side surface 11d of the first substrate 11 in the longitudinal direction X. In the lateral direction Y, the end 26e of the second control-side detour portion 26b is located closer to the second substrate side surface 12b of the second substrate 12 than the end 25x of the second control layer 25. Hence, in plan view, as the second control layer connection member 93B extends from the end 25x of the second control layer 25 toward the end 26e of the second control-side detour portion 26b, the second control layer connection member 93B is inclined toward the second substrate side surface 12b of the second substrate 12. As shown in FIG. 32, the second control layer connection member 93B is formed to extend over the second drive-side connector 27d of the second drive layer 27.

Conductive Path

A control-side conductive path and a drive-side conductive path will now be described. The control-side conductive path is a first conductive path extending from each of the power semiconductor elements 40A and 40B to the respective control terminals 53A and 53B. The drive-side conductive path is a second conductive path extending from each of the power semiconductor elements 40A and 40B to the respective detection terminals 54A and 54B.

As shown in FIG. 27, a first control-side conductive path extending from the gate electrode 43 of each first power semiconductor element 40A on the first substrate 11 to the first control terminal 53A is formed by the first control-side connection member 32A, the first control layer 21, and the first control terminal-side connection member 35A. Thus, the first control-side conductive path for each first power semiconductor element 40A on the first substrate 11 becomes longer from the first power semiconductor element 40Ab toward the first power semiconductor element 40Aa. In other words, the difference in length of the first control-side conductive paths is the largest between the first power semiconductor element 40Aa and the first power semiconductor element 40Ab, which respectively correspond to a first end power semiconductor element and a second end power semiconductor element of the first power semiconductor elements 40A that are located at opposite ends in the arrangement direction of the first power semiconductor elements 40A. In this case, the first control-side conductive path of the first power semiconductor element 40Aa is longest and corresponds to the first end control-side conductive path. The first control-side conductive path of the first power semiconductor element 40Ab is shortest and corresponds to the second end control-side conductive path.

A first drive-side conductive path extending from the source electrode 42 of each first power semiconductor element 40A on the first substrate 11 to the first detection terminal 54A is formed by the first drive-side connection member 33A, the first drive layer 23, the first drive layer connection member 94A, the first drive-side connector 24d of the first drive layer 24, and the first detection terminal-side connection member 36A. Thus, the first drive-side conductive path for each first power semiconductor element 40A on the first substrate 11 becomes longer from the first power semiconductor element 40Aa toward the first power semiconductor element 40Ab. In other words, the difference in length of the first drive-side conductive paths is the largest between the first power semiconductor element 40Aa and the first power semiconductor element 40Ab, which respectively correspond to a first end power semiconductor element and a second end power semiconductor element of the first power semiconductor elements 40A that are located opposite ends in the arrangement direction of the first power semiconductor elements 40A. In this case, the first drive-side conductive path of the first power semiconductor element 40Aa is shortest and corresponds to the first end drive-side conductive path. The first drive-side conductive path of the first power semiconductor element 40Ab is longest and corresponds to the second end drive-side conductive path.

A first control-side conductive path extending from the gate electrode 43 of each first power semiconductor element 40A on the second substrate 12 to the first control terminal 53A is formed by the first control-side connection member 32A, the first control layer 22, the first control layer connection member 93A, the first control layer 21, and the first control terminal-side connection member 35A. Thus, the first control-side conductive path for each first power semiconductor element 40A on the second substrate 12 becomes longer from the first power semiconductor element 40Ac toward the first power semiconductor element 40Ad. In other words, the difference in length of the first control-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction of the first power semiconductor elements 40A. In this case, the first control-side conductive path of the first power semiconductor element 40Ac is shortest and corresponds to the first end control-side conductive path. The first control-side conductive path of the first power semiconductor element 40Ad is longest and corresponds to the second end control-side conductive path.

A first drive-side conductive path extending from the source electrode 42 of each first power semiconductor element 40A on the second substrate 12 to the first detection terminal 54A is formed by the first drive-side connection member 33A, the first drive layer 24, and the first detection terminal-side connection member 36A. Thus, the first drive-side conductive path for each first power semiconductor element 40A on the second substrate 12 becomes longer from the first power semiconductor element 40Ad toward the first power semiconductor element 40Ac. In other words, the difference in length of the first drive-side conductive paths is the largest between the first power semiconductor element 40Ac and the first power semiconductor element 40Ad, which respectively correspond to a first end power semiconductor element and a second end power semiconductor element of the first power semiconductor elements 40A that are located at opposite ends in the arrangement direction of the first power semiconductor elements 40A. In this case, the first drive-side conductive path of the first power semiconductor element 40Ac is longest and corresponds to the first end drive-side conductive path. The first drive-side conductive path of the first power semiconductor element 40Ad is shortest and corresponds to the second end drive-side conductive path.

As described above, in the present embodiment, the first control-side detour portion 21*b* and the first drive-side detour portion 24*b* are formed to reduce the difference between the first power semiconductor elements 40A in the sum of the length of the first control-side conductive path and the length of the first drive-side conductive path. That is, the power module 1B of the present embodiment is formed so that the difference between the first power semiconductor elements 40A in the sum of the length of the first control-side conductive path, which is an example of the first conductive path, and the length of the first drive-side conductive path, which is an example of the second conductive path, is reduced by the first control-side detour portion 21*b* and the first drive-side detour portion 24*b*.

In addition, in the present embodiment, the first control-side detour portion 21*b* and the first drive-side detour portion 24*b* are formed to reduce the difference between the sum of the length of the first end control-side conductive path and the length of the first end drive-side conductive path and the sum of the length of the second end control-side conductive path and the length of the second end drive-side conductive path.

The sum of the length of the first end control-side conductive path and the length of the first end drive-side conductive path is an example of a first sum recited in CLAIMS. The sum of the length of the second end control-side conductive path and the length of the second end drive-side conductive path is an example of a second sum recited in CLAIMS. Thus, the power module 1B of the present embodiment is formed so that the difference between the first sum and the second sum is reduced by the first control-side detour portion 21*b* and the first drive-side detour portion 24*b*.

As shown in FIG. 30, a second control-side conductive path extending from the gate electrode 43 of each second power semiconductor element 40B on the first substrate 11 to the second control terminal 53B is formed by the second control-side connection member 32B, the second control layer 25, the second control layer connection member 93B, the second control-side connector 26*d* of the second control layer 26, and the second control terminal-side connection member 35B. Thus, the second control-side conductive path for each second power semiconductor element 40B on the first substrate 11 becomes longer from the second power semiconductor element 40Ba toward the second power semiconductor element 40Bb. The second control-side conductive path is an example of a third conductive path. In other words, the difference in length of the second control-side conductive paths is the largest between the second power semiconductor element 40Ba and the second power semiconductor element 40Bb, which respectively correspond to a first end power semiconductor element and a second end power semiconductor element of the second power semiconductor elements 40B that are located at opposite ends in the arrangement direction of the second power semiconductor elements 40B. In this case, the second control-side conductive path of the second power semiconductor element 40Ba is shortest and corresponds to the third end control-side conductive path. The second control-side conductive path of the second power semiconductor element 40Bb is longest and corresponds to the fourth end control-side conductive path.

A second drive-side conductive path extending from the source electrode 42 of each second power semiconductor element 40B on the first substrate 11 to the second detection terminal 54B is formed by the second drive-side connection member 33B, the second drive layer 27, and the second detection terminal-side connection member 36B. Thus, the second drive-side conductive path for each second power semiconductor element 40B on the first substrate 11 becomes longer from the second power semiconductor element 40B*b* toward the second power semiconductor element 40B*a*. The second drive-side conductive path is an example of a fourth conductive path. In other words, the difference in length of the second drive-side conductive paths is the largest between the second power semiconductor element 40B*a* and the second power semiconductor element 40B*b*, which respectively correspond to a first end power semiconductor element and a second end power semiconductor element of the second power semiconductor elements 40B that are located at opposite ends in the arrangement direction of the second power semiconductor elements 40B. In this case, the second drive-side conductive path of the second power semiconductor element 40B*a* is longest and corresponds to a third end drive-side conductive path. The second drive-side conductive path of the second power semiconductor element 40B*b* is shortest and corresponds to a fourth end drive-side conductive path.

A second control-side conductive path extending from the gate electrode 43 of each second power semiconductor element 40B on the second substrate 12 to the second control terminal 53B is formed by the second control-side connection member 32B, the second control layer 26, and the second control terminal-side connection member 35B. Thus, the second control-side conductive path for each second power semiconductor element 40B of the second substrate 12 becomes longer from the second power semiconductor element 40B*d* toward the second power semiconductor element 40B*c*. The second control-side conductive path is an example of a third conductive path. In other words, the difference in length of the second control-side conductive paths is the largest between the second power semiconductor element 40B*c* and the second power semiconductor element 40B*d*, which respectively correspond to a first end power semiconductor element and a second end power semiconductor element of the second power semiconductor elements 40B that are located at opposite ends in the arrangement direction of the second power semiconductor elements 40B. In this case, the second control-side conductive path of the second power semiconductor element 40B*c* is longest and corresponds to the third end control-side conductive path. The second control-side conductive path of the second power semiconductor element 40B*d* is shortest and corresponds to the fourth end control-side conductive path.

A second drive-side conductive path extending from the source electrode 42 of each second power semiconductor element 40B on the second substrate 12 to the second detection terminal 54B is formed by the second drive-side connection member 33B, the second drive layer 28, the second drive layer connection member 94B, the second drive-side connector 27d of the second drive layer 27, and the second detection terminal-side connection member 36B. Thus, the second drive-side conductive path for each second power semiconductor element 40B on the second substrate 12 becomes longer from the second power semiconductor element 40B*c* toward the second power semiconductor element 40B*d*. The second drive-side conductive path is an example of a fourth conductive path. In other words, the difference in length of the second drive-side conductive paths is the largest between the second power semiconductor element 40B*c* and the second power semiconductor element 40B*d*, which respectively correspond to a first end power semiconductor element and a second end power semiconductor element of the second power semiconductor elements 40B that are located at opposite ends in the arrangement direction of the second power semiconductor elements 40B. In this case, the second drive-side conductive path of the second power semiconductor element 40B*c* is shortest and corresponds to a third end drive-side conductive path. The second drive-side conductive path of the second power semiconductor element 40B*d* is longest and corresponds to a fourth end drive-side conductive path.

As described above, in the present embodiment, the second control-side detour portion 26b and the second drive-side detour portion 27b are formed to reduce the difference between the second power semiconductor elements 40B in the sum of the length of the second control-side conductive path and the length of the second drive-side conductive path. That is, the power module 1B of the present embodiment is formed so the difference between that the second power semiconductor elements 40B in the sum of the length of the second control-side conductive path, which is an example of a third conductive path, and the length of the second drive-side conductive path, which is an example of a fourth conductive path, is reduced by the second control-side detour portion 26b and the second drive-side detour portion 27b.

In addition, in the present embodiment, the first control-side detour portion 21b and the first drive-side detour portion 24b are formed to reduce the difference between the sum of the length of the third end control-side conductive path and the length of the third end drive-side conductive path and the sum of the length of the fourth end control-side conductive path and the length of the fourth end drive-side conductive path.

The sum of the length of the third end control-side conductive path and the length of the third end drive-side conductive path is an example of a third sum recited in CLAIMS. The sum of the length of the fourth end control-side conductive path and the length of the fourth end drive-side conductive path is an example of a fourth sum recited in CLAIMS. Thus, the power module 1B of the present embodiment is formed so that the difference between the third sum and the fourth sum is reduced by the second control-side detour portion 26b and the second drive-side detour portion 27b.

Advantage

The power module 1B of the present embodiment has the following advantages in addition to the advantages of the power module 1A of the first embodiment.

(2-1) The first control-side joint portion 21c of the first control layer 21 is formed of a wire. The first drive-side joint portion 24c of the first drive layer 24 is also formed of a wire. This structure allows the first control-side joint portion 21c and the first drive-side joint portion 24c to extend over other wires arranged on the substrate 10, thereby increasing the degree of freedom for arrangement. The layout of the first control layer 21 and the first drive layer 24 is easily designed.

Application of Power Module

Examples of circuit configurations including the power modules 1A and 1B will now be described. For the sake of convenience, the body diode 44 is not shown in FIGS. 33 and 34.

Figure 33:
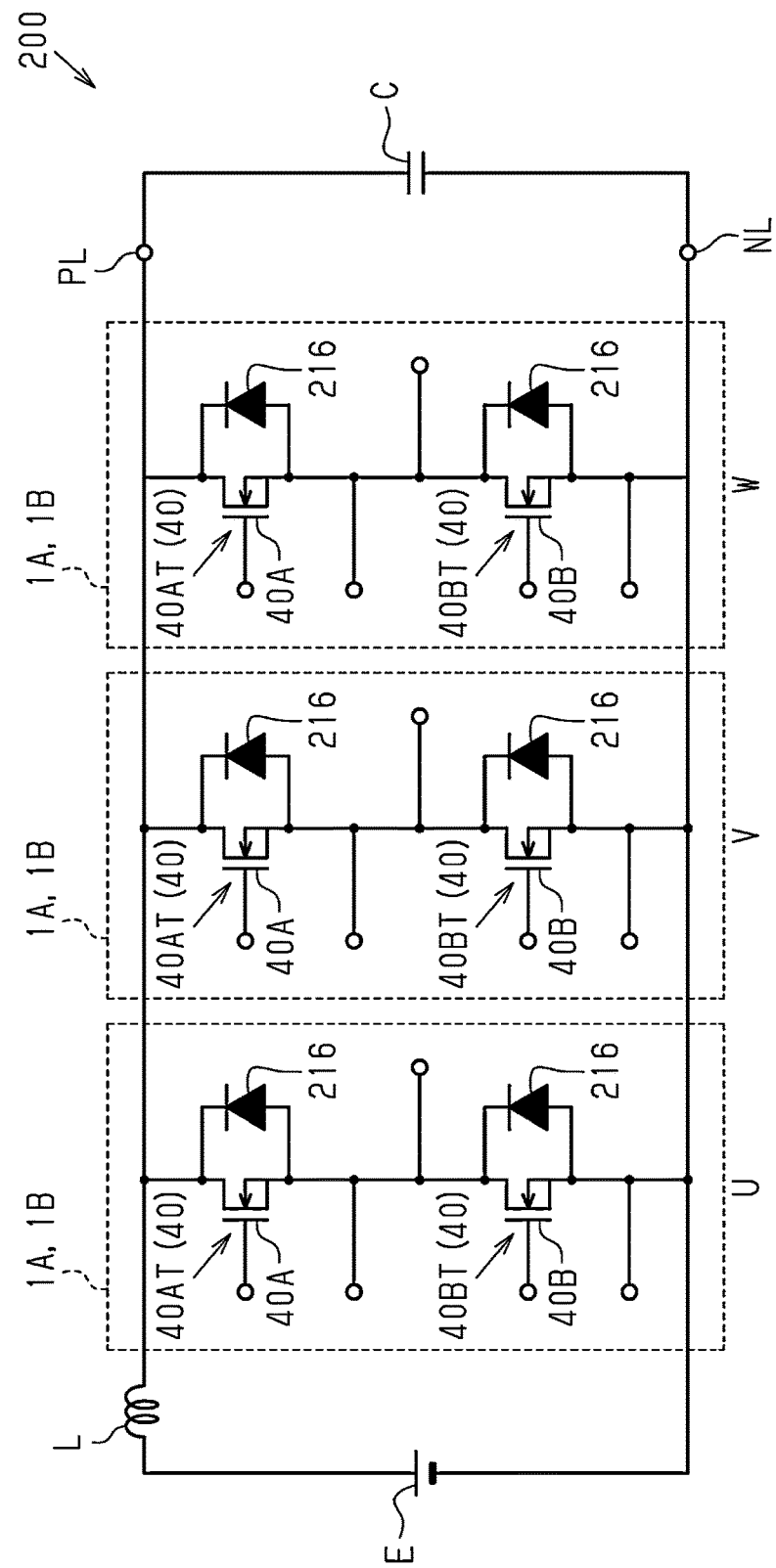
FIG. 33 is a circuit diagram of a three-phase alternating current (AC) inverter to which a power module is applied.

FIG. 33 shows a three-phase AC inverter 200 including the power modules 1A and 1B as a first example of the circuit configurations. In the three-phase AC inverter 200, a power module 1A configured to be a U-phase inverter, a power module 1A configured to be a V-phase inverter, and a power module 1A configured to be a W-phase inverter are connected in parallel to each other. In the three-phase AC inverter 200, SiC MOSFETs are used as the power semiconductor elements 40, and a snubber capacitor C is connected between a power terminal PL and a ground terminal NL. Alternatively, a three-phase AC inverter (not shown) may include IGBTs used as the power semiconductor elements 40 and the snubber capacitor C connected between the power terminal PL and the ground terminal NL. In this case, the three-phase AC inverter 200 further includes diodes connected in antiparallel to the IGBTs.

As shown in FIG. 33, when the power modules 1A and 1B are connected to a power supply E and perform switching operation, the switching speed of the SiC MOSFETs is fast, so that a large surge voltage Ldi/dt is generated by inductance L of the connection line. For example, when current change is di=300 A and time change in accordance with the switching is dt=100 nsec, di/dt=3×10$^9$ (A/s).

The value of surge voltage Ldi/dt changes depending on the value of inductance L, and the surge voltage Ldi/dt is superimposed on the power supply E. The surge voltage Ldi/dt is absorbed by the snubber capacitor C, which is connected between the power terminal PL and the ground terminal NL.

Figure 34:
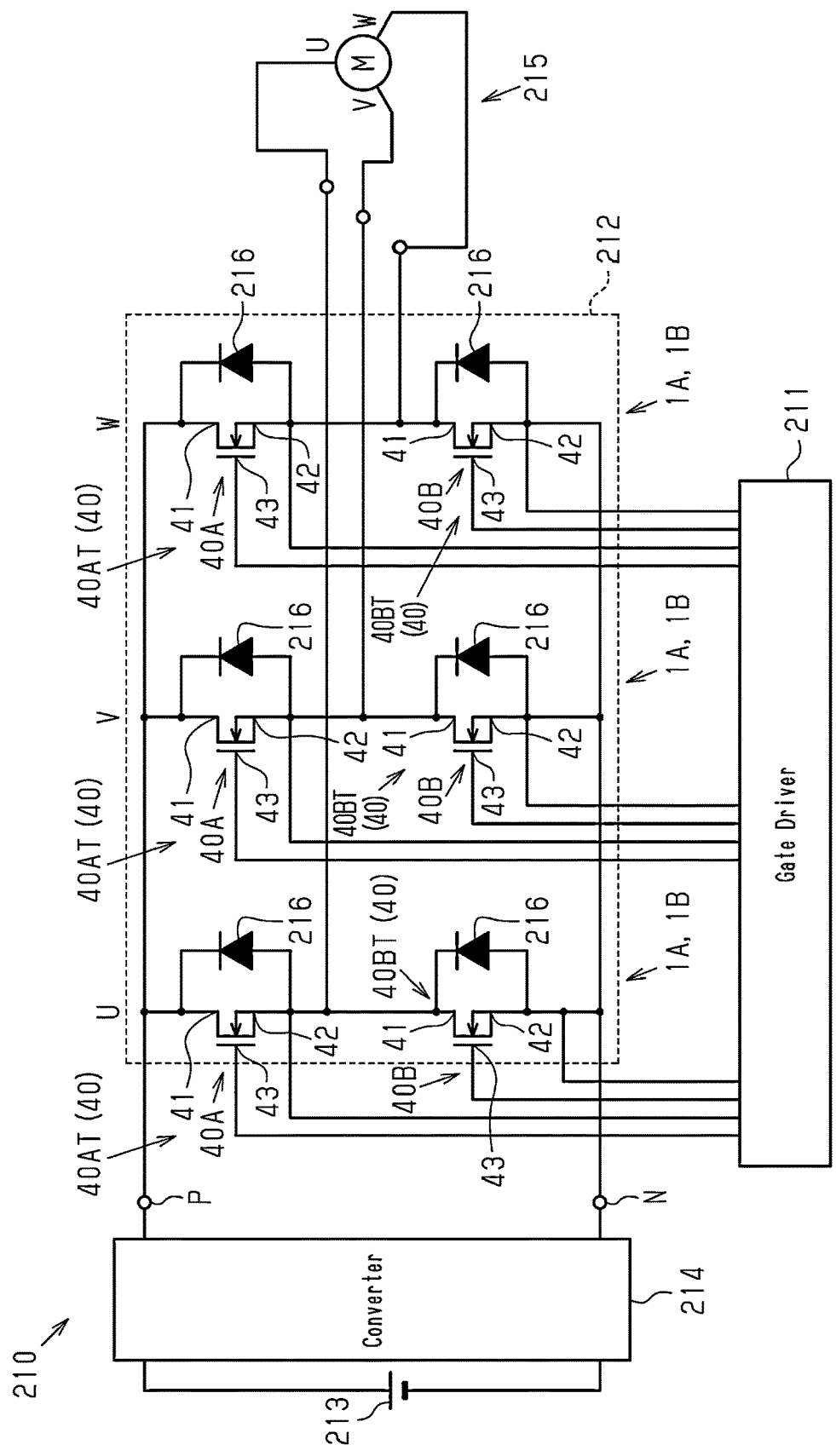
FIG. 34 is a circuit diagram of a three-phase AC inverter to which a power module is applied.

FIG. 34 shows a three-phase AC inverter 210 including the power modules 1A and 1B as a second example of the circuit configurations.

The three-phase AC inverter 210 includes a power module unit 212 connected to a gate driver 211, a power supply or a storage battery 213, and a converter 214 and controls the driving of a three-phase AC motor unit 215. The power module unit 212 includes a U-phase inverter, a V-phase inverter, a W-phase inverter that are connected in correspondence with the U-phase, the V-phase, and the W-phase of the three-phase AC motor unit 215.

The gate driver 211 is connected to the gate electrode 43 of a first power semiconductor element group 40AT and the gate electrode 43 of a second power semiconductor element group 40BT of a power module 1A forming the U-phase inverter, the gate electrode 43 of a first power semiconductor element group 40AT and the gate electrode 43 of a second power semiconductor element group 40BT of a power module 1A forming the V-phase inverter, and the gate electrode 43 of a first power semiconductor element group 40AT and the gate electrode 43 of a second power semiconductor element group 40BT of a power module 1A forming the W-phase inverter. The gate driver 211 is also connected to the source electrode 42 of the first power semiconductor element group 40AT and the source electrode 42 of the second power semiconductor element group 40BT of the power module 1A forming the U-phase inverter, the source electrode 42 of the first power semiconductor element group 40AT and the source electrode 42 of the second power semiconductor element group 40BT of the power module 1A forming the V-phase inverter, and the source electrode 42 of the first power semiconductor element group 40AT and the source electrode 42 of the second power semiconductor element group 40BT of the power module 1A forming the W-phase inverter.

The power module unit 212 is connected between a positive terminal (+) P and a negative terminal (−) N of the converter 214 connected to the power supply or the storage battery (E) 213. The power module unit 212 includes the power semiconductor element groups 40AT and 40BT of the power module 1A forming the U-phase inverter, the power semiconductor element groups 40AT and 40BT of the power module 1A forming the V-phase inverter, and the power semiconductor element groups 40AT and 40BT of the power module 1A forming the W-phase inverter.

A flyback diode 216 is connected in antiparallel to the source electrode 42 and the drain electrode 41 of each of the power semiconductor element groups 40AT and 40BT in the phase inverters.

MODIFIED EXAMPLES

The above embodiments exemplify, without any intention to limit, applicable forms of a power module according to the present disclosure. The power module according to the present disclosure can be applicable to forms differing from the above embodiments. In an example of such a form, a portion of the configurations of the above embodiments is replaced, changed, or omitted, or a further configuration is added to the above embodiments. In the following modified examples, the same reference characters are given to those parts that are the same as the corresponding parts of the above embodiments. Such parts will not be described in detail.

In the first embodiment, the first control layer 21 and the first drive layer 23 may be switched, the first control layer 22 and the first drive layer 24 may be switched.

Figure 35:
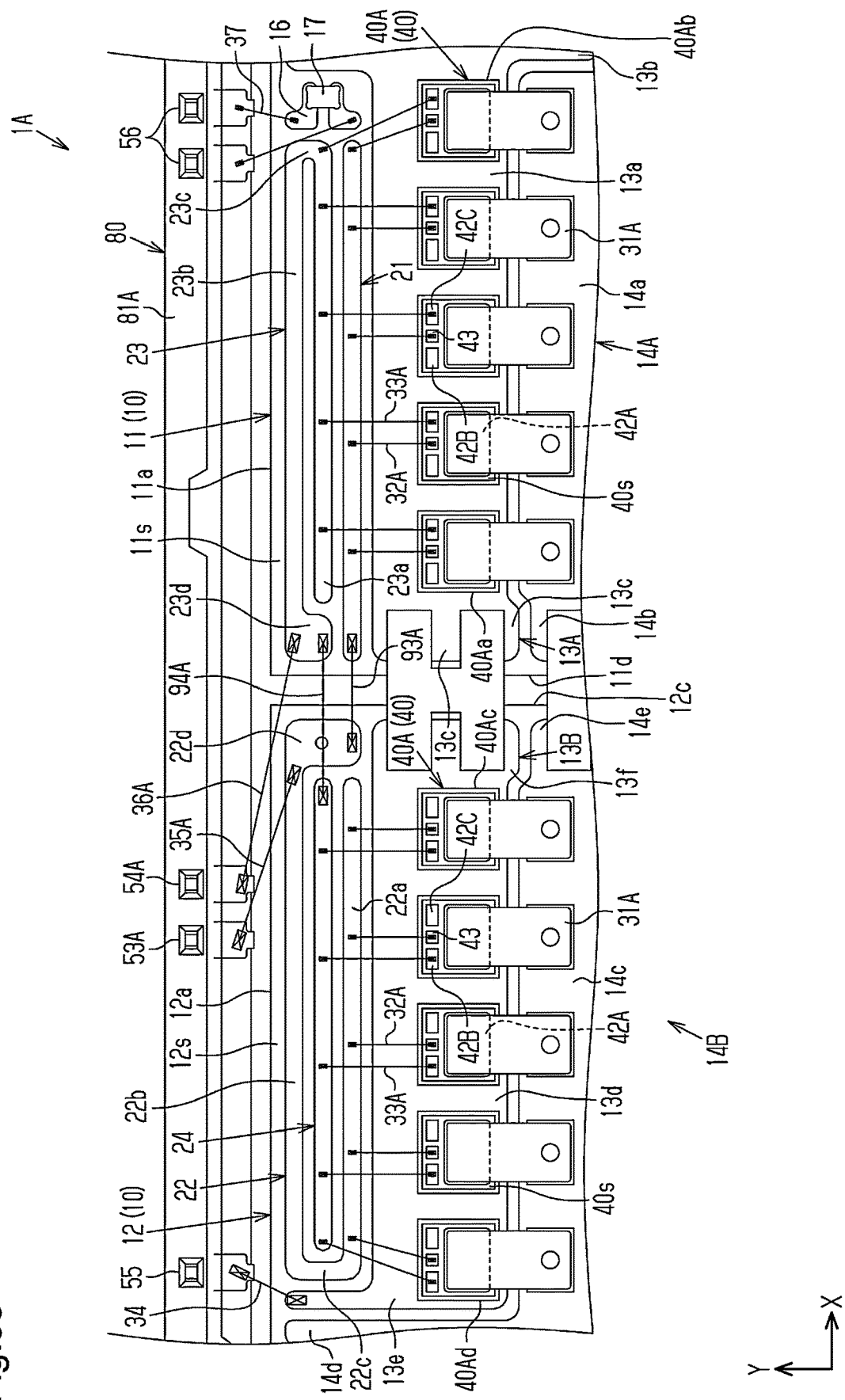
FIG. 35 is a partial enlarged plan view showing an internal structure of a modified example of a power module.

FIG. 35 shows an example in which the first control layer 21 is located adjacent to the first mount layer 13A in the lateral direction Y, and the first drive layer 23 and the first mount layer 13A are located at opposite sides of the first control layer 21 in the first substrate 11.

The first control layer 21 extends in the longitudinal direction X. The first control layer 21 is identical in shape to the first drive layer 23 of the first embodiment. The first control-side connection member 32A connected to each first power semiconductor element 40A of the first substrate 11 is connected to the first control layer 21.

The first drive layer 23 is identical in shape to the first control layer 21 of the first embodiment. The first drive layer 23 includes a first drive-side wiring portion 23a, a first drive-side detour portion 23b, a first drive-side joint portion 23c, and a first drive-side connector 23d. The first drive layer 23 is a single-piece member in which the first drive-side wiring portion 23a, the first drive-side detour portion 23b, the first drive-side joint portion 23c, and the first drive-side connector 23d are integrally formed. In the lateral direction Y, the first drive-side detour portion 23b and the first control layer 21 are located at opposite sides of the first drive-side wiring portion 23a. The first drive-side connection member 33A connected to each first power semiconductor element 40A of the first substrate 11 is connected to the first drive-side wiring portion 23a of the first drive layer 23. As shown in FIG. 35, the first drive-side connection member 33A connected to each first power semiconductor element 40A of the first substrate 11 is not connected at the first drive-side detour portion 23b. The first detection terminal-side connection member 36A and the first drive layer connection member 94A are connected to the first drive-side connector 23d.

Also, in the second substrate 12, the first control layer 22 is located adjacent to the first mount layer 13B in the lateral direction Y, and the first drive layer 24 and the first mount layer 13B are located at opposite sides of the first control layer 22.

The first control layer 22 is identical in shape to the first drive layer 24 of the first embodiment. The first control layer 22 includes a first control-side wiring portion 22a, a first control-side detour portion 22b, a first control-side joint portion 22c, and a first control-side connector 22d. The first control layer 22 is a single-piece member in which the first control-side wiring portion 22a, the first control-side detour portion 22b, the first control-side joint portion 22c, and the first control-side connector 22d are integrally formed. In the lateral direction Y, the first control-side detour portion 22b and the first control-side wiring portion 22a are located at opposite sides of the first drive layer 24. The first control-side connection member 32A connected to each first power semiconductor element 40A of the second substrate 12 is connected to the first control-side wiring portion 22a. As shown in FIG. 35, the first control-side connection member 32A connected to each first power semiconductor element 40A of the second substrate 12 is not connected at the first control-side detour portion 22b. The first control terminal-side connection member 35A and the first control layer connection member 93A are connected to the first control-side connector 22d. In plan view, the first control layer connection member 93A extends in the longitudinal direction X.

The first drive layer 24 is identical in shape to the first control layer 22 of the first embodiment. The first drive layer 24 extends in the longitudinal direction X. In the lateral direction Y, the first drive layer 24 is located between the first control-side wiring portion 22a and the first control-side detour portion 22b. The first drive layer connection member 94A is connected to an end of the first drive layer 24 in the longitudinal direction X located toward the third substrate side surface 12c of the second substrate 12. In plan view, the first drive layer connection member 94A extends in the longitudinal direction X.

As shown in FIG. 35, the first control terminal 53A and the first detection terminal 54A may be inversely arranged from those of the first embodiment in the longitudinal direction X. Thus, in plan view, intersection of the first control terminal-side connection member 35A with the first detection terminal-side connection member 36A is avoided.

In the first embodiment, the second control layer 25 and the second drive layer 27 may be switched, and the second control layer 26 and the second drive layer 28 may be switched.

Figure 36:
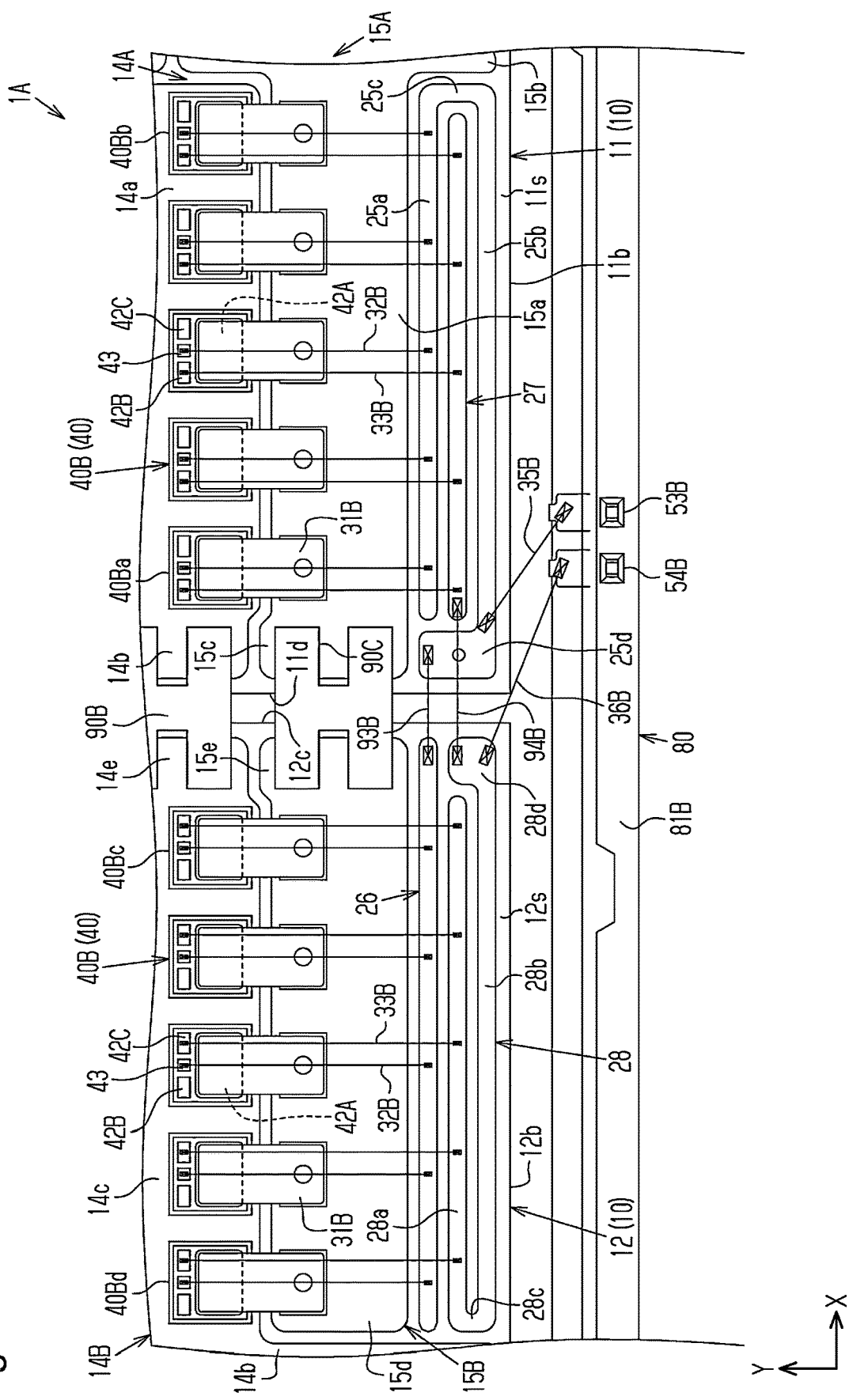
FIG. 36 is a partial enlarged plan view showing an internal structure of a modified example of a power module.

FIG. 36 shows an example in which the second control layer 25 is located adjacent to the conductive layer 15A in the lateral direction Y, and the second drive layer 27 and the conductive layer 15A are located at opposite sides of the second control layer 25 in the first substrate 11.

The second control layer 25 is identical in shape to the second drive layer 27 of the first member. The second control layer 25 includes a second control-side wiring portion 25a, a second control-side detour portion 25b, a second control-side joint portion 25c, and a second control-side connector 25d. The second control layer 25 is a single-piece member in which the second control-side wiring portion 25a, the second control-side detour portion 25b, the second control-side joint portion 25c, and the second control-side connector 25d are integrally formed. The second control-side detour portion 25b and the second control-side wiring portion 25a are located at opposite sides of the second drive layer 27 in the lateral direction Y. The second control-side connection member 32B connected to each second power semiconductor element 40B of the first substrate 11 is connected to the second control-side wiring portion 25a. As shown in FIG. 36, the second control-side connection member 32B connected to each second power semiconductor element 40B of the first substrate 11 is not connected at the second control-side detour portion 25b. The second control terminal-side connection member 35B and the second control layer connection member 93B are connected to the second control-side connector 25d.

The second drive layer 27 is identical in shape to the second control layer 25 of the first embodiment. The second drive layer 27 extends in the longitudinal direction X. The second drive layer 27 is located between the second control-side wiring portion 25a and the second control-side detour portion 25b of the second control layer 25 in the lateral direction Y. The second drive layer connection member 94B is connected to an end of the second drive layer 27 in the longitudinal direction X located toward the fourth substrate side surface 11d of the first substrate 11.

Also, in the second substrate 12, the second control layer 26 is located adjacent to the conductive layer 15B in the lateral direction Y, and the second drive layer 28 and the conductive layer 15B are located at opposite sides of the second control layer 26.

The second drive layer 28 is identical in shape to the second control layer 26 of the first embodiment. The second drive layer 28 includes a second drive-side wiring portion 28a, a second drive-side detour portion 28b, a second drive-side joint portion 28c, and a second drive-side connector 28d. The second drive layer 28 is a single-piece member in which the second drive-side wiring portion 28a, the second drive-side detour portion 28b, the second drive-side joint portion 28c, and the second drive-side connector 28d are integrally formed. The second drive-side detour portion 28b and the second control layer 26 are located at opposite sides of the second drive-side wiring portion 28a in the lateral direction Y. The second drive-side connection member 33B connected to each second power semiconductor element 40B of the second substrate 12 is connected to the second drive-side wiring portion 28a. As shown in FIG. 36, the second drive-side connection member 33B connected to each second power semiconductor element 40B of the second substrate 12 is not connected at the second drive-side detour portion 28b. The second detection terminal-side connection member 36B and the second drive layer connection member 94B are connected to the second drive-side connector 28d. In plan view, the second drive layer connection member 94B extends in the longitudinal direction X.

The second control layer 26 is identical in shape to the second drive layer 28 of the first member. The second control layer 26 extends in the longitudinal direction X. The second control layer 26 is located between the second drive-side wiring portion 28a and the second drive-side detour portion 28b in the lateral direction Y. The second control layer connection member 93B is connected to an end of the second drive layer 28 in the longitudinal direction X located toward the third substrate side surface 12c of the second substrate 12. In plan view, the second control layer connection member 93B extends in the longitudinal direction X.

As shown in FIG. 36, the second control terminal 53B and the second detection terminal 54B may be inversely arranged from the first embodiment in the longitudinal direction X. Thus, in plan view, intersection of the second control terminal-side connection member 35B with the second detection terminal-side connection member 36B is avoided.

In the second embodiment, the first control layer 21 and the first drive layer 23 may be switched, the first control layer 22 and the first drive layer 24 may be switched.

Figure 37:
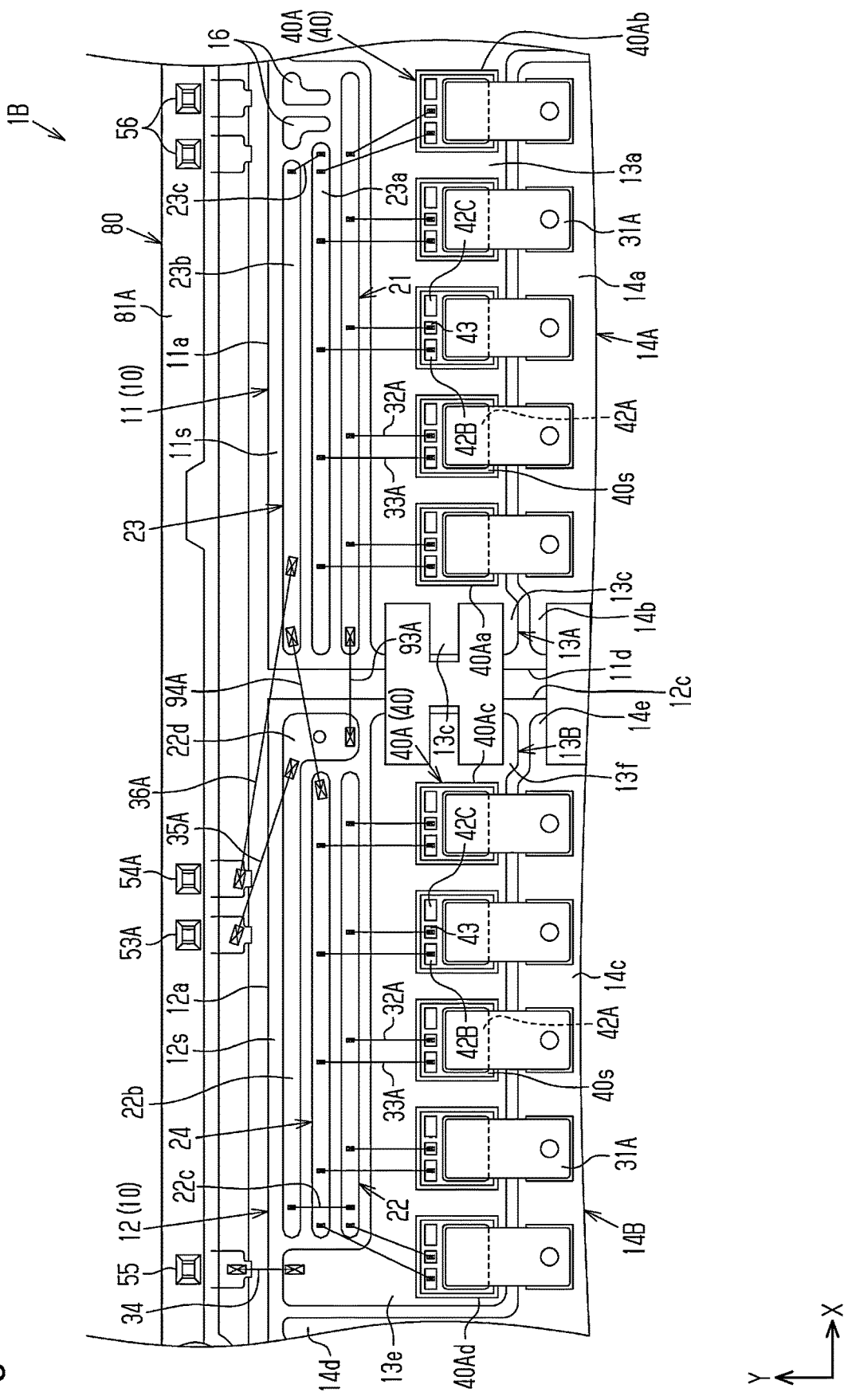
FIG. 37 is a partial enlarged plan view showing an internal structure of a modified example of a power module.

FIG. 37 shows an example in which the first control layer 21 is located adjacent to the first mount layer 13A in the lateral direction Y, and the first drive layer 23 and the first mount layer 13A are located at opposite sides of the first control layer 21 in the first substrate 11.

The first control layer 21 extends in the longitudinal direction X. The first control layer 21 is identical in shape to the first drive layer 23 of the second embodiment. The first control-side connection member 32A connected to each first power semiconductor element 40A of the first substrate 11 is connected to the first control layer 21.

The first drive layer 23 is identical in shape to the first control layer 21 of the second embodiment. The first drive layer 23 includes the first drive-side wiring portion 23a, the first drive-side detour portion 23b, and the first drive-side joint portion 23c. The first drive-side wiring portion 23a, the first drive-side detour portion 23b, and the first drive-side joint portion 23c are separately formed. The first drive-side wiring portion 23a and the first drive-side detour portion 23b are formed of, for example, a copper foil. The first drive-side joint portion 23c is, for example, a wire formed of wire bonding. In the lateral direction Y, the first drive-side detour portion 23b and the first control layer 21 are located at opposite sides of the first drive-side wiring portion 23a. The first drive-side connection member 33A connected to each first power semiconductor element 40A of the first substrate 11 is connected to the first drive-side wiring portion 23a of the first drive layer 23. As shown in FIG. 37, the first drive-side connection member 33A connected to each first power semiconductor element 40A of the first substrate 11 is not connected at the first drive-side detour portion 23b. The first detection terminal-side connection member 36A and the first drive layer connection member 94A are connected to the first drive-side connector 23d.

Also, in the second substrate 12, the first control layer 22 is located adjacent to the first mount layer 13B in the lateral direction Y, and the first drive layer 24 and the first mount layer 13B are located at opposite sides of the first control layer 22.

The first control layer 22 is identical in shape to the first drive layer 24 of the first embodiment. The first control layer 22 includes the first control-side wiring portion 22a, the first control-side detour portion 22b, the first control-side joint portion 22c, and the first control-side connector 22d. The first control-side wiring portion 22a, the first control-side detour portion 22b, the first control-side joint portion 22c, and the first control-side connector 22d are separately formed. The first control-side detour portion 22b and the first control-side connector 22d are integrally formed. The first control-side wiring portion 22a, the first control-side detour portion 22b, and the first control-side connector 22d are formed of, for example, a copper foil. The first control-side joint portion 22c is, for example, a wire formed by wire bonding. In the lateral direction Y, the first control-side detour portion 22b and the first control-side wiring portion 22a are located at opposite sides of the first drive layer 24. The first control-side connection member 32A connected to each first power semiconductor element 40A of the second substrate 12 is connected to the first control-side wiring portion 22a. As shown in FIG. 37, the first control-side connection member 32A connected to each first power semiconductor element 40A of the second substrate 12 is not connected at the first control-side detour portion 22b. The first control terminal-side connection member 35A and the first control layer connection member 93A are connected to the first control-side connector 22d. In plan view, the first control layer connection member 93A extends in the longitudinal direction X.

The first drive layer 24 is identical in shape to the first control layer 22 of the first embodiment. The first drive layer 24 extends in the longitudinal direction X. In the lateral direction Y, the first drive layer 24 is located between the first control-side wiring portion 22a and the first control-side detour portion 22b. The first drive layer connection member 94A is connected to an end of the first drive layer 24 in the longitudinal direction X located toward the third substrate side surface 12c of the second substrate 12.

As shown in FIG. 37, the first control terminal 53A and the first detection terminal 54A may be inversely arranged from those of the first embodiment in the longitudinal direction X. Thus, in plan view, intersection of the first control terminal-side connection member 35A with the first detection terminal-side connection member 36A is avoided.

In the second embodiment, the second control layer 25 and the second drive layer 27 may be switched, and the second control layer 26 and the second drive layer 28 may be switched.

Figure 38:
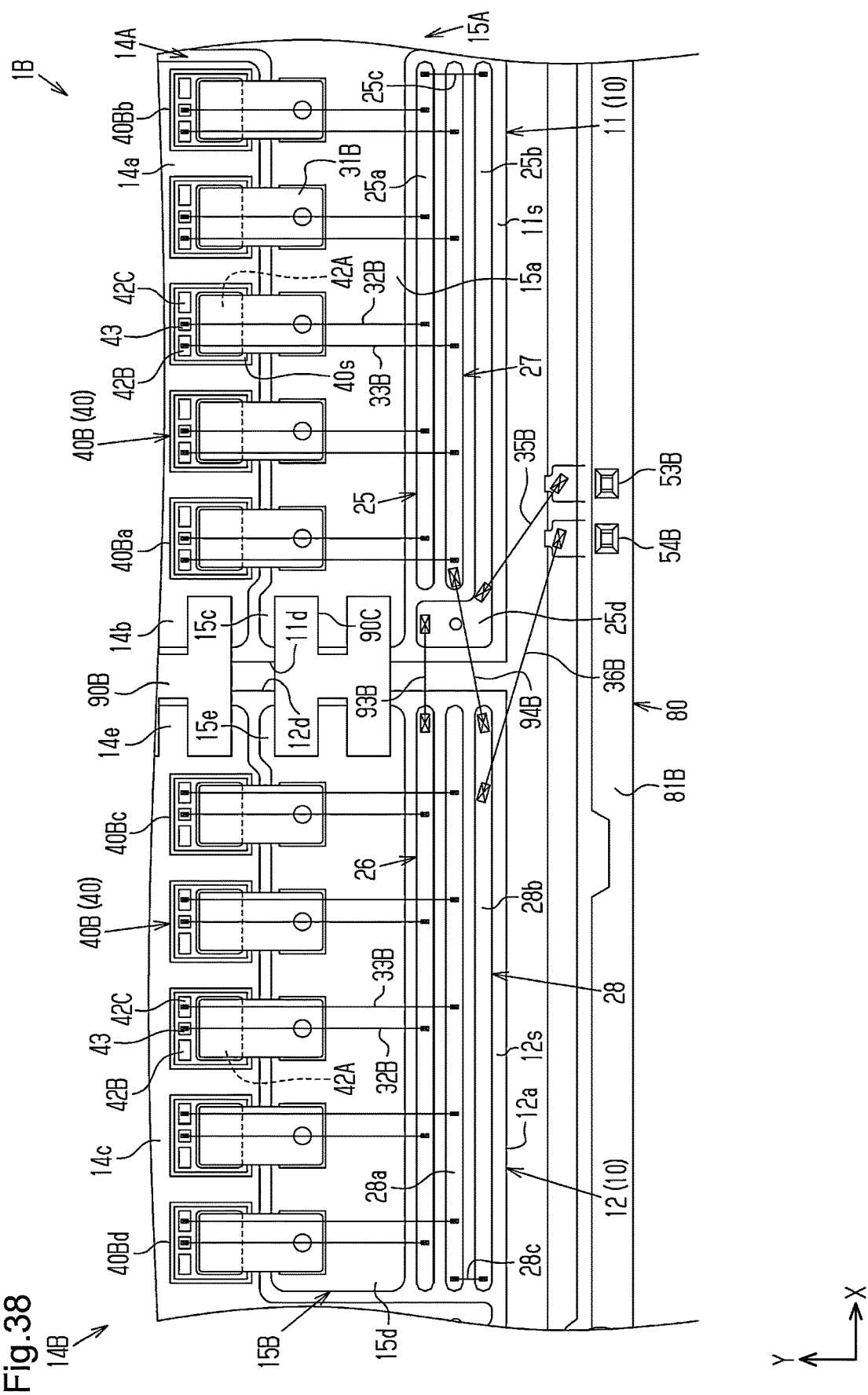
FIG. 38 is a partial enlarged plan view showing an internal structure of a modified example of a power module.

FIG. 38 shows an example in which the second control layer 25 is located adjacent to the conductive layer 15A in the lateral direction Y, and the second drive layer 27 and the conductive layer 15A are located at opposite sides of the second control layer 25 in the first substrate 11.

The second control layer 25 is identical in shape to the second drive layer 27 of the second embodiment. The second control layer 25 includes a second control-side wiring portion 25a, a second control-side detour portion 25b, a second control-side joint portion 25c, and a second control-side connector 25d. The second control-side wiring portion 25a, the second control-side detour portion 25b, and the second control-side joint portion 25c are separately formed. The second control-side detour portion 25b and the second control-side connector 25d are integrally formed. The second control-side detour portion 25b and the second control-side wiring portion 25a are located at opposite sides of the second drive layer 27 in the lateral direction Y. The second control-side connection member 32B connected to each second power semiconductor element 40B of the first substrate 11 is connected to the second control-side wiring portion 25a. As shown in FIG. 38, the second control-side connection member 32B connected to each second power semiconductor element 40B of the first substrate 11 is not connected at the second control-side detour portion 25b. The second control terminal-side connection member 35B and the second control layer connection member 93B are connected to the second control-side connector 25d.

The second drive layer 27 is identical in shape to the second control layer 25 of the second embodiment. The second drive layer 27 extends in the longitudinal direction X. The second drive layer 27 is located between the second control-side wiring portion 25a and the second control-side detour portion 25b of the second control layer 25 in the lateral direction Y. The second drive layer connection member 94B is connected to an end of the second drive layer 27 in the longitudinal direction X located toward the fourth substrate side surface 11d of the first substrate 11.

Also, in the second substrate 12, the second control layer 26 is located adjacent to the conductive layer 15B in the lateral direction Y, and the second drive layer 28 and the conductive layer 15B are located at opposite sides of the second control layer 26.

The second drive layer 28 is identical in shape to the second control layer 26 of the second embodiment. The second drive layer 28 includes the second drive-side wiring portion 28a, the second drive-side detour portion 28b, and the second drive-side joint portion 28c. The second drive-side wiring portion 28a, the second drive-side detour portion 28b, and the second drive-side joint portion 28c are separately formed. The second drive-side detour portion 28b and the second control layer 26 are located at opposite sides of the second drive-side wiring portion 28a in the lateral direction Y. The second drive-side connection member 33B connected to each second power semiconductor element 40B of the second substrate 12 is connected to the second drive-side wiring portion 28a. As shown in FIG. 38, the second drive-side connection member 33B connected to each second power semiconductor element 40B of the second substrate 12 is not connected at the second drive-side detour portion 28b. The second detection terminal-side connection member 36B and the second drive layer connection member 94B are connected to the second drive-side connector 28d.

The second control layer 26 is identical in shape to the second drive layer 28 of the second embodiment. The second control layer 26 extends in the longitudinal direction X. The second control layer 26 is located between the second drive-side wiring portion 28a and the second drive-side detour portion 28b in the lateral direction Y. The second control layer connection member 93B is connected to an end of the second drive layer 28 in the longitudinal direction X located toward the third substrate side surface 12c of the second substrate 12. In plan view, the second control layer connection member 93B extends in the longitudinal direction X.

As shown in FIG. 38, the second control terminal 53B and the second detection terminal 54B may be inversely arranged from the first embodiment in the longitudinal direction X. Thus, in plan view, intersection of the second control terminal-side connection member 35B with the second detection terminal-side connection member 36B is avoided.

In the second embodiment, the first control layer 21 may include the first control-side connector 21d as in the first embodiment. The first control-side connector 21d is formed on an end of the first control-side detour portion 21b in the longitudinal direction X located toward the fourth substrate side surface 11d of the first substrate 11. In this case, the first control-side wiring portion 21a of the first control layer 21 is shortened in the longitudinal direction X. The first control-side connector 21d allows the first control layer connection member 93A to extend in the longitudinal direction X in plan view.

In the second embodiment, the second control layer 26 may include the second control-side connector 26d as in the first embodiment. The second control-side connector 26d is formed on an end of the second control-side detour portion 26b in the longitudinal direction X located toward the third substrate side surface 12c of the second substrate 12. In this case, the second control-side wiring portion 26a of the second control layer 26 is shortened in the longitudinal direction X. The second control-side connector 26d allows the second control layer connection member 93B to extend in the longitudinal direction X in plan view.

In the second embodiment, the first control-side joint portion 21c of the first control layer 21 may be formed of a band-shaped thin plate instead of a wire. The material of the band-shaped thin plate is Cu, a Cu alloy, Al, or an Al alloy.

In the second embodiment, the first drive-side joint portion 24c of the first drive layer 24 may be formed of a band-shaped thin plate instead of a wire. The material of the band-shaped thin plate is Cu, a Cu alloy, Al, or an Al alloy.

In the second embodiment, the second control-side joint portion 26c of the second control layer 26 may be formed of a band-shaped thin plate instead of a wire. The material of the band-shaped thin plate is Cu, a Cu alloy, Al, or an Al alloy.

In the second embodiment, the second drive-side joint portion 27c of the second drive layer 27 may be formed of a band-shaped thin plate instead of a wire. The material of the band-shaped thin plate is Cu, a Cu alloy, Al, or an Al alloy.

In each embodiment described above, at least one of the first element connection member 31A and the second element connection member 31B may be formed of one or more wires.

In each embodiment described above, at least one of the joint members 90A to 90C may be formed of one or more wires.

Figure 39:
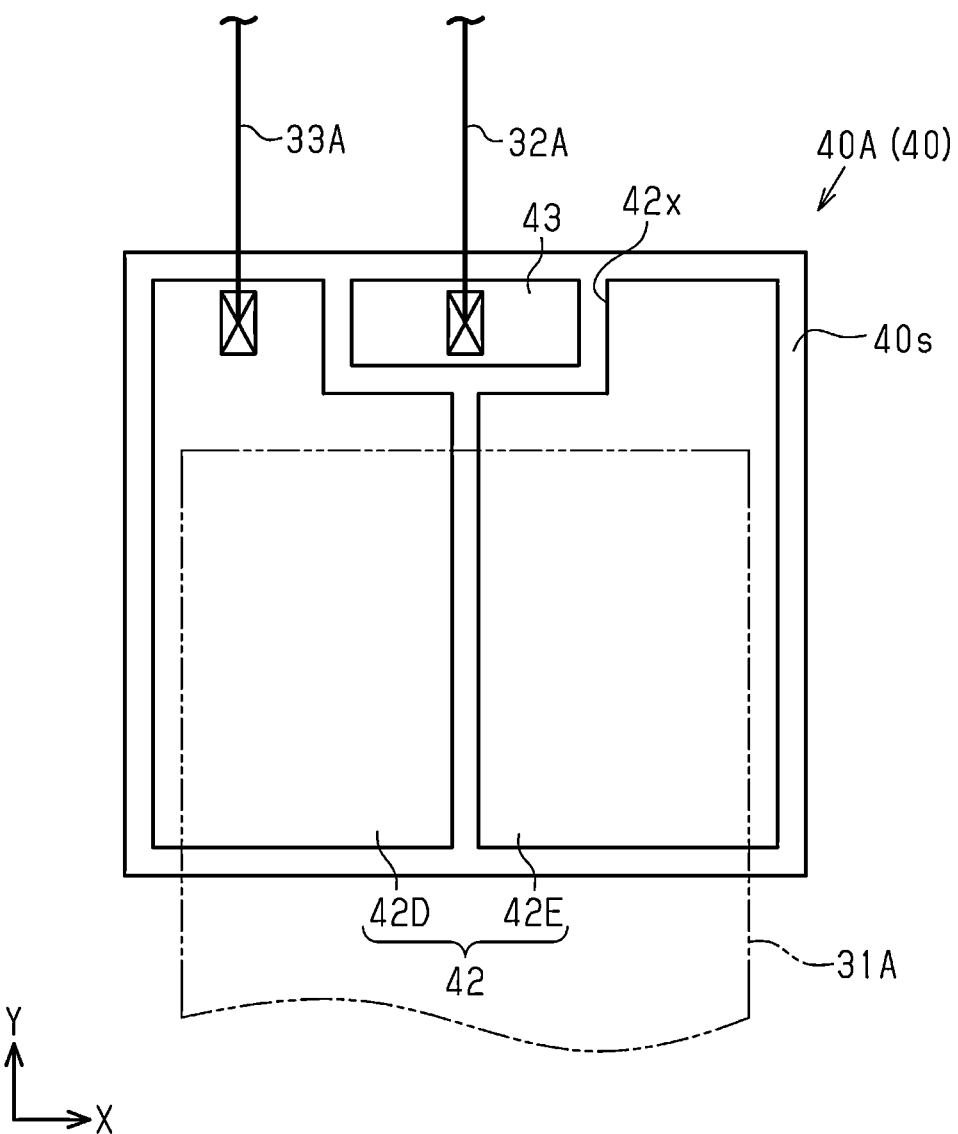
FIG. 39 is a plan view of a first power semiconductor element in a modified example of a power module.

In each embodiment described above, the structures of the power semiconductor elements 40 (40A, 40B) may be changed in any manner. In an example, as shown in FIG. 39, the source electrode 42 and the gate electrode 43 are formed on the element main surface 40s of the first power semiconductor element 40A. The source electrode 42 is formed on a large portion of the element main surface 40s. In the present embodiment, the source electrode 42 includes a first source electrode 42D and a second source electrode 42E. In plan view, the first source electrode 42D and the second source electrode 42E are separated in the longitudinal direction X. In plan view, the gate electrode 43 is arranged in a recess 42x formed in the source electrode 42. In FIG. 39, the first drive-side connection member 33A is connected to the second source electrode 42E. The first drive-side connection member 33A may be connected to the first source electrode 42D. The second power semiconductor element 40B may be changed as shown in FIG. 39.

In each embodiment described above, one of the first output terminal 52A and the second output terminal 52B may be omitted.

In each embodiment described above, the first substrate 11 and the second substrate 12 may be integrally formed as the substrate 10. In this case, the joint members 90A to 90C are omitted. The first control layer 21 and the first control layer 22 may be integrated. In this case, the first control layer connection member 93A is omitted. The first drive layer 23 and the first drive layer 24 may be integrated. In this case, the first drive layer connection member 94A is omitted. The second control layer 25 and the second control layer 26 may be integrated. In this case, the second control layer connection member 93B is omitted. The second drive layer 27 and the second drive layer 28 may be integrated. In this case, the second drive layer connection member 94B is omitted.

In each embodiment described above, one of the first substrate 11 and the second substrate 12 may be omitted from the substrate 10. When the second substrate 12 is omitted from the substrate 10, the first mount layer 13B, the second mount layer 14B, the conductive layer 15B, the first control layer 22, the first drive layer 24, the second control layer 26, the second drive layer 28, and the power semiconductor elements 40A and 40B of the second substrate 12 are mainly omitted. When the first substrate 11 is omitted from the substrate 10, the first mount layer 13A, the second mount layer 14A, the conductive layer 15A, the first control layer 21, the first drive layer 23, the second control layer 25, the second drive layer 27, and the power semiconductor elements 40A and 40B of the first substrate 11 are mainly omitted.

In each embodiment described above, the power supply current terminal 55 may be omitted. In this case, the power supply detection-side connection member 34 is omitted.

In each embodiment described above, the thermistor 17 may be omitted. In addition, the thermistor mount layer 16, the two temperature detection terminals 56, and the two thermistor-side connection members 37 may be omitted.

In each embodiment described above, the power module may include: a single substrate having a substrate main surface; a mount layer, a conductive layer, a control layer, and a drive layer, which are arranged on the substrate main surface; power semiconductor elements arranged on the mount layer; a control terminal; and a detection terminal. In this case, a detour portion is formed on at least one of the control layer and the drive layer to reduce the difference between the power semiconductor elements in the sum of the length of the control-side conductive path and the length of the drive-side conductive path.

CLAUSES

Technical concepts obtained from the above embodiments and the modified examples will now be described.

Clause 1

A power module including:
an electrically insulative substrate including a substrate main surface and a substrate back surface that face in opposite directions in a thickness-wise direction;
a mount layer, a control layer, and a drive layer that are formed on the substrate main surface and are electrically conductive;
a power semiconductor element mounted on the mount layer and including an element back surface, an element main surface, a first drive electrode formed on the element back surface and electrically connected to the mount layer, a second drive electrode, and a control electrode, the second drive electrode and the control electrode being formed on the element main surface;
a control-side connection member connecting the control electrode to the control layer;
a drive-side connection member connecting the second drive electrode to the drive layer;
a control terminal electrically connected to the control layer; and
a detection terminal electrically connected to the drive layer, in which
the power semiconductor element is one of power semiconductor elements arranged on the mount layer in one direction as viewed in the thickness-wise direction,
the control-side connection member is one of control-side connection members corresponding to one of the power semiconductor elements,
the drive-side connection member is one of drive-side connection members corresponding to one of the power semiconductor elements,
a first conductive path is a path between the control electrode and the control terminal,
a second conductive path is a path between the second drive electrode and the detection terminal, and
at least one of the control layer and the drive layer includes a detour portion that detours to reduce a difference between the power semiconductor elements in a sum of a length of the first conductive path and a length of the second conductive path.

Clause 2

A power module including:
an electrically insulative substrate including a substrate main surface and a substrate back surface that face in opposite directions in a thickness-wise direction;
a mount layer, a control layer, and a drive layer that are formed on the substrate main surface and are electrically conductive;
power semiconductor elements mounted on the mount layer and arranged in one direction as viewed in the thickness-wise direction, each of the power semiconductor elements including an element back surface, an element main surface, a first drive electrode formed on the element back surface and electrically connected to the mount layer, a second drive electrode, and a control electrode, the second drive electrode and the control electrode being formed on the element main surface;
control-side connection members arranged in the same direction as an arrangement direction of the power semiconductor elements to connect the control electrodes of the power semiconductor elements to the control layer;
drive-side connection members arranged in the same direction as the arrangement direction of the power semiconductor elements to connect the second drive electrodes of the power semiconductor elements to the drive layer;
a control terminal electrically connected to the control layer; and
a detection terminal electrically connected to the drive layer, in which
the power semiconductor elements include a first end power semiconductor element and a second end power semiconductor element located at opposite ends in the arrangement direction,
a first control-side conductive path is a path between the control electrode of the first end power semiconductor element and the control terminal,
a first drive-side conductive path is a path between the second drive electrode of the first end power semiconductor element and the detection terminal,
a first sum is a sum of a length of the first control-side conductive path and a length of the first drive-side conductive path,
a second control-side conductive path is a path between the control electrode of the second end power semiconductor element and the control terminal,
a second drive-side conductive path is a path between the second drive electrode of the second end power semiconductor element and the detection terminal,
a second sum is a sum of a length of the second control-side conductive path and a length of the second drive-side conductive path, and
at least one of the control layer and the drive layer includes a detour portion that detours the conductive paths to reduce a difference between the first sum and the second sum.

Clause 3

The power module according to clause 1 or 2, in which when the one direction is referred to as a first direction, and a direction intersecting the first direction as viewed in the thickness-wise direction is referred to as a second direction, each of the control layer and the drive layer includes a wiring portion extending in the first direction, and the detour portion is separated from the wiring portion in the second direction and extends in the first direction.

Clause 4

The power module according to clause 3, in which
at least one of the control layer and the drive layer includes a joint portion that joins the detour portion and the wiring portion, and
the wiring portion, the detour portion, and the joint portion are integrally formed as a single-piece member.

Clause 5

The power module according to clause 3, in which
at least one of the control layer and the drive layer includes a joint portion that joins the detour portion and the wiring portion, and
the joint portion is formed of a wire.

Clause 6

The power module according to any one of clauses 1 to 5, in which the drive layer is located closer to the mount layer than the control layer.

Clause 7

The power module according to clause 6, in which
the control layer includes the detour portion, and
the detour portion and the drive layer are located at opposite sides of the wiring portion of the control layer.

Clause 8

The power module according to clause 6, in which
the drive layer includes the detour portion, and
the detour portion and the mount layer are located at opposite sides of the control layer.

Clause 9

The power module according to any one of clauses 1 to 8, in which the control-side connection member and the drive-side connection member are not connected at the detour portion.

Clause 10

The power module according to any one of clauses 1 to 9, in which when the one direction is referred to as a first direction, and a direction intersecting the first direction as viewed in the thickness-wise direction is referred to as a second direction, at least one of the control-side connection member and the drive-side connection member extends in the second direction as viewed in the thickness-wise direction.

Clause 11

The power module according to any one of clauses 1 to 10, in which
the control terminal and the control layer are electrically connected by a control terminal-side connection member, and
the detection terminal and the drive layer are electrically connected by a detection terminal-side connection member.

Clause 12

The power module according to clause 11, in which
the control layer includes the detour portion and a first connection portion formed on a distal end of the detour portion, and
the first connection portion is connected to the control terminal-side connection member.

Clause 13

The power module according to clause 11 or 12, in which
the drive layer includes the detour portion and a second connection portion formed on a distal end of the detour portion, and
the second connection portion is connected to the detection terminal-side connection member.

Clause 14

The power module according to any one of clauses 1 to 13, in which
the substrate includes a first substrate and a second substrate,
the mount layer, the control layer, and the drive layer are arranged on the substrate main surface of each of the first substrate and the second substrate,
the power semiconductor elements are arranged on the mount layer of each of the first substrate and the second substrate in the one direction,
the first substrate and the second substrate are separated in the one direction,
the mount layer of the first substrate and the mount layer of the second substrate are electrically connected by a mount layer connection member,
the control layer of the first substrate and the control layer of the second substrate are electrically connected by a control layer connection member,
the drive layer of the first substrate and the drive layer of the second substrate are electrically connected by a drive layer connection member,
one of the control layer and the drive layer of the first substrate includes the detour portion, and
the other one of the control layer and the drive layer of the second substrate includes the detour portion.

Clause 15

The power module according to clause 14, in which when the one direction is referred to as a first direction, and a direction intersecting the first direction as viewed in the thickness-wise direction is referred to as a second direction, each of the control terminal and the detection terminal is arranged to overlap the second substrate as viewed in the second direction.

Clause 16

The power module according to any one of clauses 1 to 15, in which
the power semiconductor element is formed of a SiC MOSFET,
the first drive electrode is a drain electrode, the second drive electrode is a source electrode, and
the control electrode is a gate electrode.

Clause 17

A power module including:
an electrically insulative substrate including a substrate main surface and a substrate back surface that face in opposite directions in a thickness-wise direction;
a first control layer, a second control layer, a first drive layer, a second drive layer, a first mount layer, a second mount layer, and a conductive layer that are formed on the substrate main surface and are electrically conductive;
a first power semiconductor element mounted on the first mount layer and including a first element back surface and a first element main surface, the first power semiconductor element including a first drive electrode formed on the first element back surface and electrically connected to a first input terminal, a second drive electrode electrically connected to an output terminal, and a control electrode formed on the first element main surface;
a second power semiconductor element mounted on the second mount layer and including a second element back surface and a second element main surface, the second power semiconductor element including a first drive electrode formed on the second element back surface and electrically connected to the output terminal, a second drive electrode electrically connected to a second input terminal, and a control electrode formed on the second element main surface;
a first control-side connection member connecting the control electrode of the first power semiconductor element to the first control layer;
a first drive-side connection member connecting the second drive electrode of the first power semiconductor element to the first drive layer;
a second control-side connection member connecting the control electrode of the second power semiconductor element to the second control layer;
a second drive-side connection member connecting the second drive electrode of the second power semiconductor element to the second drive layer;
a first control terminal electrically connected to the first control layer;
a second control terminal electrically connected to the second control layer;
a first detection terminal electrically connected to the first drive layer; and
a second detection terminal electrically connected to the second drive layer, in which
the first power semiconductor element is one of first power semiconductor elements arranged on the first mount layer in one direction as viewed in the thickness-wise direction,
the first control-side connection member is one of first control-side connection members corresponding to one of the first power semiconductor elements,
the first drive-side connection member is one of first drive-side connection members corresponding to one of the first power semiconductor elements,
a first conductive path is a path between the control electrode of the first power semiconductor element and the first control terminal, a second conductive path is a path between the second drive electrode of the first power semiconductor element and the first detection terminal, and
at least one of the first control layer and the first drive layer includes a first detour portion that detours to reduce a difference between the first power semiconductor elements in a sum of a length of the first conductive path and a length of the second conductive path.

Clause 18

A power module including:
an electrically insulative substrate including a substrate main surface and a substrate back surface that face in opposite directions in a thickness-wise direction;
a first control layer, a second control layer, a first drive layer, a second drive layer, a first mount layer, a second mount layer, and a conductive layer that are formed on the substrate main surface and are electrically conductive;
first power semiconductor elements mounted on the first mount layer and arranged in one direction as viewed in the thickness-wise direction, each of the first power semiconductor elements including a first element back surface, a first element main surface, a first drive electrode formed on the first element back surface and electrically connected to a first input terminal, and a second drive electrode and a control electrode formed on the first element main surface, the second drive electrode being electrically connected to an output terminal;
second power semiconductor elements mounted on the second mount layer and arranged in the one direction as viewed in the thickness-wise direction, each of the second power semiconductor elements including a second element back surface, a second element main surface, a first drive electrode formed on the second element back surface and electrically connected to the output terminal, and a second drive electrode and a control electrode formed on the second element main surface, the second drive electrode being electrically connected to a second input terminal;
first control-side connection members arranged in the same direction as an arrangement direction of the first power semiconductor elements to connect the control electrodes of the first power semiconductor elements to the first control layer;
first drive-side connection members arranged in the same direction as the arrangement direction of the first power semiconductor elements to connect the second drive electrodes of the first power semiconductor elements to the first drive layer;
second control-side connection members arranged in the same direction as an arrangement direction of the second power semiconductor elements to connect the control electrodes of the second power semiconductor elements to the second control layer;
second drive-side connection members arranged in the same direction as the arrangement direction of the second power semiconductor elements to connect the second drive electrodes of the second power semiconductor elements to the second drive layer;
a first control terminal electrically connected to the first control layer;
a second control terminal electrically connected to the second control layer;

a first detection terminal electrically connected to the first drive layer; and a second detection terminal electrically connected to the second drive layer, in which the first power semiconductor elements include a first end power semiconductor element and a second end power semiconductor element located at opposite ends in the arrangement direction of the first power semiconductor elements, a first end control-side conductive path is a path between the control electrode of the first end power semiconductor element and the first control terminal, a first end drive-side conductive path is a path between the second drive electrode of the first end power semiconductor element and the first detection terminal, a first sum is a sum of a length of the first end control-side conductive path and a length of the first end drive-side conductive path, a second end control-side conductive path is a path between the control electrode of the second end power semiconductor element and the first control terminal, a second end drive-side conductive path is a path between the second drive electrode of the second end power semiconductor element and the first detection terminal, a second sum is a sum of a length of the second end control-side conductive path and a length of the second end drive-side conductive path, and at least one of the first control layer and the first drive layer includes a first detour portion that detours the conductive paths to reduce a difference between the first sum and the second sum.

According to clause 18, the voltage between the first control terminal and the first detection terminal is applied to the control electrode of each first power semiconductor element as a control voltage. The time at which the control voltage is applied to the control electrode of the first power semiconductor element is determined in accordance with the sum of the inductance value between the control electrode of the first power semiconductor element and the first control terminal and the inductance value between the second drive electrode of the first power semiconductor element and the first detection terminal. The inductance value between the control electrode of the first power semiconductor element and the first control terminal is mainly determined by the length of the conductive path between the control electrode of the first power semiconductor element and the first control terminal. The inductance value between the second drive electrode of the first power semiconductor element and the first detection terminal is mainly determined by the length of the conductive path between the second drive electrode of the power semiconductor element and the first detection terminal. Hence, reductions in the difference between the first power semiconductor elements in the sum of the length of the conductive path extending from the control electrode of the first power semiconductor element to the first control terminal and the length of the conductive path extending from the second drive electrode of the first power semiconductor element to the first detection terminal will reduce variations in the sum of the inductance values between the first power semiconductor elements.

The difference in the length of the conductive path extending from the first control electrode to the first control terminal and the conductive path extending from the second drive electrode to the first detection terminal is considered to be the largest between the first power semiconductor elements (the first end power semiconductor element and the second end power semiconductor element) located at opposite ends in the arrangement direction of the first power semiconductor elements.

In this regard, the power module according to clause 18 is formed so that the difference between the first sum and the second sum is reduced by the first detour portion. The first sum is a sum of the length of the first end control-side conductive path and the length of the first end drive-side conductive path of the first end power semiconductor element. The second sum is a sum of the length of the second end control-side conductive path and the length of the second end drive-side conductive path of the second end power semiconductor element. This reduces the difference between the sum of the inductance value in the first end control-side conductive path and the inductance value in the first end drive-side conductive path and the sum of the inductance value in the second end control-side conductive path and the inductance value in the second end drive-side conductive path. Accordingly, variations in timing for activating and deactivating the first end power semiconductor element and the second end power semiconductor element, which have the largest difference in inductance value among the first power semiconductor elements, are reduced. Thus, the power module stably operates.

Clause 19

The power module according to clause 17 or 18, in which when the one direction is referred to as a first direction, and a direction intersecting the first direction as viewed in the thickness-wise direction is referred to as a second direction, in the second direction, the second mount layer is located between the first mount layer and the conductive layer in the second direction, the second mount layer and each of the first control layer and the first drive layer are located at opposite sides of the first mount layer, and the second mount layer and each of the second control layer and the second drive layer are located at opposite sides of the conductive layer.

Clause 20

The power module according to clause 19, in which each of the first control layer and the first drive layer includes a first wiring portion extending in the first direction, and the first detour portion is separated from the first wiring portion in the second direction and extends in the first direction.

Clause 21

The power module according to clause 20, in which at least one of the first control layer and the first drive layer includes a first joint portion that joins the first detour portion and the first wiring portion, and the first wiring portion, the first detour portion, and the first joint portion are integrally formed as a single-piece member.

Clause 22

The power module according to clause 20, in which
at least one of the first control layer and the first drive layer includes a first joint portion that joins the first detour portion and the first wiring portion, and
the first joint portion is formed of a wire.

Clause 23

The power module according to any one of clauses 17 to 22, in which when the one direction is referred to as a first direction, and a direction intersecting the first direction as viewed in the thickness-wise direction is referred to as a second direction,
in the second direction, the first drive layer is arranged adjacent to the first mount layer, and
the first control layer and the first mount layer are located at opposite sides of the first drive layer.

Clause 24

The power module according to clause 23, in which
the first control layer includes the first detour portion, and
the first detour portion and the first drive layer are located at opposite sides of the first wiring portion of the first control layer.

Clause 25

The power module according to clause 23, in which
the first drive layer includes the first detour portion, and
the first detour portion and the first mount layer are located at opposite sides of the first control layer.

Clause 26

The power module according to any one of clauses 17 to 25, in which the first control-side connection member and the first drive-side connection member are not connected at the first detour portion.

Clause 27

The power module according to any one of clauses 17 to 26, in which
the first control terminal and the first control layer are electrically connected by a first control terminal-side connection member, and
the first detection terminal and the first drive layer are electrically connected by a first detection terminal-side connection member.

Clause 28

The power module according to clause 27, in which
the first control layer includes the first detour portion and a first connection portion formed on a distal end of the first detour portion, and
the first connection portion is connected to the first control terminal-side connection member.

Clause 29

The power module according to clause 27, in which
the first drive layer includes the first detour portion and a second connection portion formed on a distal end of the first detour portion, and
the second connection portion is connected to the first detection terminal-side connection member.

Clause 30

The power module according to any one of clauses 17 to 29, in which
the substrate includes a first substrate and a second substrate,
the first control layer, the second control layer, the first drive layer, the second drive layer, the first mount layer, the second mount layer, and the conductive layer are arranged on the substrate main surface of each of the first substrate and the second substrate,
the first power semiconductor elements are separated from each other in the one direction and arranged on the first mount layer of the first substrate and the first mount layer of the second substrate,
the second power semiconductor elements are separated from each other in the one direction and arranged on the second mount layer of the first substrate and the second mount layer of the second substrate,
the first substrate and the second substrate are separated in the one direction,
the first mount layer of the first substrate and the first mount layer of the second substrate are electrically connected by a first mount layer connection member,
the first control layer of the first substrate and the first control layer of the second substrate are electrically connected by a first control layer connection member,
the first drive layer of the first substrate and the first drive layer of the second substrate are electrically connected by a first drive layer connection member,
one of the first control layer and the first drive layer of the first substrate includes the first detour portion, and
the other one of the first control layer and the first drive layer of the second substrate includes the first detour portion.

Clause 31

The power module according to clause 30, in which when the one direction is referred to as a first direction, and a direction intersecting the first direction as viewed in the thickness-wise direction is referred to as a second direction, each of the first control terminal and the first detection terminal is arranged to overlap the second substrate as viewed in the second direction.

Clause 32

The power module according to clause 31, in which
in each of the first substrate and the second substrate, the first drive layer is arranged adjacent to the first mount layer in the second direction, and the first control layer and the first mount layer are located at opposite sides of the first drive layer,
the first control layer of the first substrate includes the first detour portion,
the first drive layer of the second substrate includes the first detour portion,
the first detour portion of the first control layer of the first substrate is shorter than the first detour portion of the first drive layer of the second substrate, and the first control-side connection member is longer than the first drive-side connection member.

Clause 33

The power module according to clause 17, in which
the second power semiconductor element is one of second power semiconductor elements arranged on the second mount layer in the one direction as viewed in the thickness-wise direction,
the second control-side connection member is one of second control-side connection members corresponding to one of the second power semiconductor elements,
the second drive-side connection member is one of second drive-side connection members corresponding to one of the second power semiconductor elements,
a third conductive path is a path between the control electrode of the second power semiconductor element and the second control terminal,
a fourth conductive path is a path between the second drive electrode of the second power semiconductor element and the second detection terminal, and
at least one of the second control layer and the second drive layer includes a second detour portion that detours to reduce a difference between the second power semiconductor elements in a sum of a length of the third conductive path and a length of the fourth conductive path.

Clause 34

The power module according to clause 18, in which
the second power semiconductor elements include a first end power semiconductor element and a second end power semiconductor element located at opposite ends in an arrangement direction of the second power semiconductor elements,
a third end control-side conductive path is a path between the control electrode of the first end power semiconductor element of the second power semiconductor elements and the second control terminal,
a third end drive-side conductive path is a path between the second drive electrode of the first end power semiconductor element of the second power semiconductor elements and the second detection terminal,
a third sum is a sum of a length of the third end control-side conductive path and a length of the third end drive-side conductive path,
a fourth end control-side conductive path is a path between the control electrode of the second end power semiconductor element of the second power semiconductor elements and the second control terminal,
a fourth end drive-side conductive path is a path between the second drive electrode of the second end power semiconductor element of the second power semiconductor elements and the second detection terminal,
a fourth sum is a sum of a length of the fourth end control-side conductive path and a length of the fourth end drive-side conductive path, and
at least one of the second control layer and the second drive layer includes a second detour portion that detours the conductive paths to reduce a difference between the third sum and the fourth sum.

Clause 35

The power module according to clause 33 or 34, in which
when the one direction is referred to as a first direction, and a direction intersecting the first direction as viewed in the thickness-wise direction is referred to as a second direction,
each of the second control layer and the second drive layer includes a second wiring portion extending in the first direction, and
the second detour portion is separated from the second wiring portion in the second direction and extends in the first direction.

Clause 36

The power module according to clause 35, in which
at least one of the second control layer and the second drive layer includes a second joint portion that joins the second detour portion and the second wiring portion, and
the second wiring portion, the second detour portion, and the second joint portion are integrally formed as a single-piece member.

Clause 37

The power module according to clause 35, in which
at least one of the second control layer and the second drive layer includes a second joint portion that joins the second detour portion and the second wiring portion, and
the second joint portion is formed of a wire.

Clause 38

The power module according to any one of clauses 33 to 37, in which when the one direction is referred to as a first direction, and a direction intersecting the first direction as viewed in the thickness-wise direction is referred to as a second direction,
the second drive layer is arranged adjacent to the conductive layer in the second direction in the second direction, and
the second control layer and the conductive layer are located at opposite sides of the second drive layer.

Clause 39

The power module according to clause 38, in which
the second control layer includes the second detour portion, and
the second detour portion and the second drive layer are located at opposite sides of the second wiring portion of the second control layer.

Clause 40

The power module according to clause 39, in which
the second drive layer includes the second detour portion, and
the second detour portion and the conductive layer are located at opposite sides of the second control layer.

Clause 41

The power module according to any one of clauses 33 to 40, in which the second control-side connection member and the second drive-side connection member are not connected at the second detour portion.

Clause 42

The power module according to any one of clauses 33 to 41, in which
the second control terminal and the second control layer are electrically connected by a second control terminal-side connection member, and
the second detection terminal and the second drive layer are electrically connected by a second detection terminal-side connection member.

Clause 43

The power module according to clause 42, in which
the second control layer includes the second detour portion and a third connection portion formed on a distal end of the second detour portion, and
the third connection portion is connected to the second control terminal-side connection member.

Clause 44

The power module according to clause 42 or 43, in which
the second drive layer includes the second detour portion and a fourth connection portion formed on a distal end of the second detour portion, and
the fourth connection portion is connected to the second detection terminal-side connection member.

Clause 45

The power module according to any one of clauses 33 to 44, in which
the substrate includes a first substrate and a second substrate,
the first control layer, the second control layer, the first drive layer, the second drive layer, the first mount layer, the second mount layer, and the conductive layer are arranged on the substrate main surface of each of the first substrate and the second substrate,
the first power semiconductor elements are separated from each other in the one direction and arranged on the first mount layer of the first substrate and the first mount layer of the second substrate,
the second power semiconductor elements are separated from each other in the one direction and arranged on the second mount layer of the first substrate and the second mount layer of the second substrate,
the first substrate and the second substrate are separated in the one direction,
the second mount layer of the first substrate and the second mount layer of the second substrate are electrically connected by a second mount layer connection member,
the second control layer of the first substrate and the second control layer of the second substrate are electrically connected by a second control layer connection member,
the second drive layer of the first substrate and the second drive layer of the second substrate are electrically connected by a second drive layer connection member,
one of the second control layer and the second drive layer of the first substrate includes the second detour portion, and
the other one of the second control layer and the second drive layer of the second substrate includes the second detour portion.

Clause 46

The power module according to clause 45, in which when the one direction is referred to as a first direction, and a direction intersecting the first direction as viewed in the thickness-wise direction is referred to as a second direction, each of the second control terminal and the second detection terminal is arranged to overlap the first substrate as viewed in the second direction.

Clause 47

The power module according to any one of clauses 17 to 46, further including:
a first element connection member connecting the second drive electrode of the first power semiconductor element to the second mount layer; and
a second element connection member connecting the second drive electrode of the second power semiconductor element to the conductive layer.

Clause 48

The power module according to any one of clauses 17 to 47, in which
each of the first power semiconductor element and the second power semiconductor element is formed of a SiC MOSFET,
the first drive electrode is a drain electrode,
the second drive electrode is a source electrode, and
the control electrode is a gate electrode.

Clause 49

A power module including
an electrically insulative substrate including a substrate main surface and a substrate back surface that face in opposite directions in a thickness-wise direction;
a first control layer, a second control layer, a first drive layer, a second drive layer, a first mount layer, a second mount layer, and a conductive layer that are formed on the substrate main surface and are electrically conductive;
a first power semiconductor element mounted on the first mount layer and including a first element back surface and a first element main surface, the first power semiconductor element including a first drive electrode formed on the first element back surface and electrically connected to a first input terminal, a second drive electrode electrically connected to an output terminal, and a control electrode formed on the first element main surface;
a second power semiconductor element mounted on the second mount layer and including a second element back surface and a second element main surface, the second power semiconductor element including a first drive electrode formed on the second element back surface and electrically connected to the output terminal, a second drive electrode electrically connected to a second input terminal, and a control electrode formed on the second element main surface;
a first control-side connection member connecting the control electrode of the first power semiconductor element to the first control layer;
a first drive-side connection member connecting the second drive electrode of the first power semiconductor element to the first drive layer;

a second control-side connection member connecting the
control electrode of the second power semiconductor
element to the second control layer;
a second drive-side connection member connecting the
second drive electrode of the second power semiconductor element to the second drive layer;
a first control terminal electrically connected to the first
control layer;
a second control terminal electrically connected to the
second control layer;
a first detection terminal electrically connected to the first
drive layer; and
a second detection terminal electrically connected to the
second drive layer, in which
the second power semiconductor element includes multiple second power semiconductor elements arranged
on the second mount layer in one direction as viewed
in the thickness-wise direction,
the second control-side connection member and the second drive-side connection member include multiple
second control-side connection members and multiple
second drive-side connection members corresponding
to the multiple second power semiconductor elements,
a third conductive path is a path between the control
electrode of the second power semiconductor element
and the second control terminal,
a fourth conductive path is a path between the second
drive electrode of the second power semiconductor
element and the second detection terminal, and
at least one of the second control layer and the second
drive layer includes a second detour portion that
detours to reduce a difference between the second
power semiconductor elements in a sum of a length of
the third conductive path and a length of the fourth
conductive path.

The voltage between the second control terminal and the second detection terminal is applied to the control electrode of each second power semiconductor element as a control voltage. The time at which the control voltage is applied to the control electrode of the second power semiconductor element is determined in accordance with the sum of the inductance value between the control electrode of the second power semiconductor element and the second control terminal and the inductance value between the second drive electrode of the second power semiconductor element and the second detection terminal. The inductance value between the control electrode of the second power semiconductor element and the second control terminal is mainly determined by the length of the third conductive path. The inductance value between the second drive electrode of the second power semiconductor element and the second detection terminal is mainly determined by the length of the fourth conductive path. Hence, when the difference between the second power semiconductor elements in the sum of the length of the third conductive path and the length of the fourth conductive path is reduced, variations in the sum of the inductance values will be reduced between the second power semiconductor elements.

In this regard, the present power module is formed so that the second detour portion reduces the difference between the second power semiconductor elements in the sum of the length of the third conductive path and the length of the fourth conductive path. As a result, the difference between the second power semiconductor elements in the sum of the length of the third conductive path and the length of the fourth conductive path is reduced, thereby reducing variations in the sum of the inductance values between the second power semiconductor elements. Accordingly, variations in timing for activating and deactivating the second power semiconductor elements are reduced. Thus, the power module stably operates.

Clause 50

A power module comprising:
an electrically insulative substrate including a substrate
main surface and a substrate back surface that face in
opposite directions in a thickness-wise direction;
a first control layer, a second control layer, a first drive
layer, a second drive layer, a first mount layer, a second
mount layer, and a conductive layer that are formed on
the substrate main surface and are electrically conductive;
first power semiconductor elements mounted on the first
mount layer and arranged in one direction as viewed in
the thickness-wise direction, each of the first power
semiconductor elements including a first element back
surface and a first element main surface, the first power
semiconductor element including a first drive electrode
formed on the first element back surface and electrically connected to a first input terminal, a second drive
electrode electrically connected to an output terminal,
and a control electrode formed on the first element
main surface;
second power semiconductor elements mounted on the
second mount layer and arranged in the one direction,
each of the second power semiconductor elements
including a second element back surface and a second
element main surface, the second power semiconductor
element including a first drive electrode formed on the
second element back surface and electrically connected
to the output terminal, a second drive electrode electrically connected to a second input terminal, and a
control electrode formed on the second element main
surface;
first control-side connection members arranged in the
same direction as an arrangement direction of the first
power semiconductor elements to connect the control
electrodes of the first power semiconductor elements to
the first control layer;
first drive-side connection members arranged in the same
direction as the arrangement direction of the first power
semiconductor elements to connect the second drive
electrodes of the first power semiconductor elements to
the first drive layer;
second control-side connection members arranged in the
same direction as an arrangement direction of the
second power semiconductor elements to connect the
control electrodes of the second power semiconductor
elements to the second control layer;
second drive-side connection members arranged in the
same direction as the arrangement direction of the
second power semiconductor elements to connect the
second drive electrodes of the second power semiconductor elements to the second drive layer;
a first control terminal electrically connected to the first
control layer;
a second control terminal electrically connected to the
second control layer;
a first detection terminal electrically connected to the first
drive layer; and
a second detection terminal electrically connected to the
second drive layer, in which the second power semiconductor elements include a first end power semiconductor element and a second end power semiconductor element located at opposite ends in an arrangement direction of the second power semiconductor elements, a third end control-side conductive path is a path between the control electrode of the first end power semiconductor element and the second control terminal, a third end drive-side conductive path is a path between the second drive electrode of the first end power semiconductor element and the second detection terminal, a third sum is a sum of a length of the third end control-side conductive path and a length of the third end drive-side conductive path, a fourth end control-side conductive path is a path between the control electrode of the second end power semiconductor element and the second control terminal, a fourth end drive-side conductive path is a path between the second drive electrode of the second end power semiconductor element and the second detection terminal, a fourth sum is a sum of a length of the fourth end control-side conductive path and a length of the fourth end drive-side conductive path, and at least one of the second control layer and the second drive layer includes a second detour portion that detours the conductive paths to reduce a difference between the third sum and the fourth sum.

The voltage between the second control terminal and the second detection terminal is applied to the control electrode of each second power semiconductor element as a control voltage. The time at which the control voltage is applied to the control electrode of the second power semiconductor element is determined in accordance with the sum of the inductance value between the control electrode of the second power semiconductor element and the second control terminal and the inductance value between the second drive electrode of the second power semiconductor element and the second detection terminal. The inductance value between the control electrode of the second power semiconductor element and the second control terminal is mainly determined by the length of the conductive path between the control electrode of the second power semiconductor element and the second control terminal. The inductance value between the second drive electrode of the second power semiconductor element and the second detection terminal is mainly determined by the length of the conductive path between the second drive electrode of the second power semiconductor element and the second detection terminal. Hence, reductions in the difference between the second power semiconductor elements in the sum of the length of the conductive path extending from the control electrode of the second power semiconductor element to the second control terminal and the length of the conductive path extending from the second drive electrode of the second power semiconductor element to the second detection terminal will reduce variations in the sum of the inductance values between the second power semiconductor elements.

The difference in length of the conductive path extending from the second control electrode to the second control terminal and the conductive path extending from the second drive electrode to the second detection terminal is considered to be the largest between the second power semiconductor elements (the first end power semiconductor element and the second end power semiconductor element) located at opposite ends in the arrangement direction of the second power semiconductor elements.

In this regard, the present power module is formed so that the difference between the third sum and the fourth sum is reduced by the second detour portion. The third sum is a sum of the length of the third end control-side conductive path and the length of the third end drive-side conductive path of the first end power semiconductor element. The fourth sum is a sum of the length of the fourth end control-side conductive path and the length of the fourth end drive-side conductive path of the second end power semiconductor element. This reduces the difference between the sum of the inductance value in the third end control-side conductive path and the inductance value in the third end drive-side conductive path and the sum of the inductance value in the fourth end control-side conductive path and the inductance value in the fourth end drive-side conductive path. Accordingly, variations in timing for activating and deactivating the first end power semiconductor element and the second end power semiconductor element, which have the largest difference in inductance value among the second power semiconductor elements, are reduced. Thus, the power module stably operates.

Clause 51

The power module according to clause 49 or 50, in which when the one direction is referred to as a first direction, and a direction intersecting the first direction, as viewed in the thickness-wise direction, is referred to as a second direction,
each of the second control layer and the second drive layer includes a second wiring portion extending in the first direction, and
the second detour portion is separated from the second wiring portion in the second direction and extends in the first direction.

Clause 52

The power module according to clause 51, in which
at least one of the second control layer and the second drive layer includes a second joint portion that joins the second detour portion and the second wiring portion, and
the second wiring portion, the second detour portion, and the second joint portion are integrally formed as a single-piece member.

Clause 53

The power module according to clause 51, in which
at least one of the second control layer and the second drive layer includes a second joint portion that joins the second detour portion and the second wiring portion, and
the second joint portion is formed of a wire.

Clause 54

The power module according to any one of clauses 49 to 53, in which when an arrangement direction of the second power semiconductor elements as viewed in the thickness-wise direction is referred to as a first direction, and a direction intersecting the first direction is referred to as a second direction,
the second drive layer is arranged adjacent to the conductive layer in the second direction, and the second control layer and the conductive layer are located at opposite sides of the second drive layer.

Clause 55

The power module according to clause 54, in which
the second control layer includes the second detour portion, and
the second detour portion and the second drive layer are located at opposite sides of the second wiring portion of the second control layer in the second direction.

Clause 56

The power module according to clause 55, in which
the second drive layer includes the second detour portion, and
the second detour portion and the conductive layer are located at opposite sides of the second control layer in the second direction.

Clause 57

The power module according to any one of clauses 49 to 56, in which the second control-side connection member and the second drive-side connection member are not connected at the second detour portion.

Clause 58

The power module according to any one of clauses 49 to 57, in which
the second control terminal and the second control layer are electrically connected by a second control terminal-side connection member, and
the second detection terminal and the second drive layer are electrically connected by a second detection terminal-side connection member.

Clause 59

The power module according to clause 58, in which
the second control layer includes the second detour portion and a third connection portion formed on a distal end of the second detour portion, and
the third connection portion is connected to the second control terminal-side connection member.

Clause 60

The power module according to clause 59, in which
the second drive layer includes the second detour portion and a fourth connection portion formed on a distal end of the second detour portion, and
the fourth connection portion is connected to the second detection terminal-side connection member.

Clause 61

The power module according to any one of clauses 49 to 60, in which
the substrate includes a first substrate and a second substrate,
the first control layer, the second control layer, the first drive layer, the second drive layer, the first mount layer, the second mount layer, and the conductive layer are arranged on the substrate main surface of each of the first substrate and the second substrate,
the first power semiconductor elements are separated from each other in the one direction and arranged on the first mount layer of the first substrate and the first mount layer of the second substrate,
the second power semiconductor elements are separated from each other in the one direction and arranged on the second mount layer of the first substrate and the second mount layer of the second substrate,
the first substrate and the second substrate are separated in the one direction,
in the one direction, the second mount layer of the first substrate and the second mount layer of the second substrate are electrically connected by a second mount layer connection member,
the second control layer of the first substrate and the second control layer of the second substrate are electrically connected by a second control layer connection member,
the second drive layer of the first substrate and the second drive layer of the second substrate are electrically connected by a second drive layer connection member,
one of the second control layer and the second drive layer of the first substrate includes the second detour portion, and
the other one of the second control layer and the second drive layer of the second substrate includes the second detour portion.

Clause 62

The power module according to clause 61, in which each of the second control terminal and the second detection terminal is arranged to overlap the first substrate as viewed in the first direction.

Clause 63

The power module according to any one of clauses 49 to 62, in which the second power semiconductor element includes a SiC MOSFET.

The invention claimed is:
1. A power module comprising:
an electrically insulative substrate including a substrate main surface and a substrate back surface that face in opposite directions in a thickness-wise direction;
a first control layer, a second control layer, a first drive layer, a second drive layer, a first mount layer, a second mount layer, and a conductive layer that are formed on the substrate main surface and are electrically conductive;
first power semiconductor elements mounted on the first mount layer and arranged in one direction as viewed in the thickness-wise direction, each of the first power semiconductor elements including a first element back surface, a first element main surface, a first drive electrode formed on the first element back surface and electrically connected to a first input terminal, and a second drive electrode and a control electrode formed on the first element main surface, the second drive electrode being electrically connected to an output terminal;
second power semiconductor elements mounted on the second mount layer and arranged in the one direction as viewed in the thickness-wise direction, each of the second power semiconductor elements including a sec- ond element back surface, a second element main surface, a first drive electrode formed on the second element back surface and electrically connected to the output terminal, and a second drive electrode and a control electrode formed on the second element main surface, the second drive electrode being electrically connected to a second input terminal;

first control-side connection members arranged in the same direction as an arrangement direction of the first power semiconductor elements to connect the control electrodes of the first power semiconductor elements to the first control layer;

first drive-side connection members arranged in the same direction as the arrangement direction of the first power semiconductor elements to connect the second drive electrodes of the first power semiconductor elements to the first drive layer;

second control-side connection members arranged in the same direction as an arrangement direction of the second power semiconductor elements to connect the control electrodes of the second power semiconductor elements to the second control layer;

second drive-side connection members arranged in the same direction as the arrangement direction of the second power semiconductor elements to connect the second drive electrodes of the second power semiconductor elements to the second drive layer;

a first control terminal electrically connected to the first control layer;

a second control terminal electrically connected to the second control layer;

a first detection terminal electrically connected to the first drive layer; and a second detection terminal electrically connected to the second drive layer, wherein the first power semiconductor elements include a first end power semiconductor element and a second end power semiconductor element located at opposite ends in the arrangement direction of the first power semiconductor elements, a first end control-side conductive path is a path between the control electrode of the first end power semiconductor element and the first control terminal, a first end drive-side conductive path is a path between the second drive electrode of the first end power semiconductor element and the first detection terminal, a first sum is a sum of a length of the first end control-side conductive path and a length of the first end drive-side conductive path, a second end control-side conductive path is a path between the control electrode of the second end power semiconductor element and the first control terminal, a second end drive-side conductive path is a path between the second drive electrode of the second end power semiconductor element and the first detection terminal, a second sum is a sum of a length of the second end control-side conductive path and a length of the second end drive-side conductive path, and at least one of the first control layer and the first drive layer includes a first detour portion that detours the conductive paths to reduce a difference between the first sum and the second sum.

2. The power module according to claim 1, wherein when the one direction is referred to as a first direction, and a direction intersecting the first direction as viewed in the thickness-wise direction is referred to as a second direction, in the second direction, the second mount layer is located between the first mount layer and the conductive layer in the second direction, the second mount layer and each of the first control layer and the first drive layer are located at opposite sides of the first mount layer, and the second mount layer and each of the second control layer and the second drive layer are located at opposite sides of the conductive layer.

3. The power module according to claim 2, wherein each of the first control layer and the first drive layer includes a first wiring portion extending in the first direction, and the first detour portion is separated from the first wiring portion in the second direction and extends in the first direction.

4. The power module according to claim 3, wherein at least one of the first control layer and the first drive layer includes a first joint portion that joins the first detour portion and the first wiring portion, and the first wiring portion, the first detour portion, and the first joint portion are integrally formed as a single-piece member.

5. The power module according to claim 3, wherein at least one of the first control layer and the first drive layer includes a first joint portion that joins the first detour portion and the first wiring portion, and the first joint portion is formed of a wire.

6. The power module according to claim 1, wherein when the one direction is referred to as a first direction, and a direction intersecting the first direction as viewed in the thickness-wise direction is referred to as a second direction, in the second direction, the first drive layer is arranged adjacent to the first mount layer, and the first control layer and the first mount layer are located at opposite sides of the first drive layer.

7. The power module according to claim 6, wherein the first control layer includes the first detour portion, and the first detour portion and the first drive layer are located at opposite sides of the first wiring portion of the first control layer.

8. The power module according to claim 6, wherein the first drive layer includes the first detour portion, and the first detour portion and the first mount layer are located at opposite sides of the first control layer.

9. The power module according to claim 1, wherein the first control-side connection member and the first drive-side connection member are not connected at the first detour portion.

10. The power module according to claim 1, wherein the first control terminal and the first control layer are electrically connected by a first control terminal-side connection member, and the first detection terminal and the first drive layer are electrically connected by a first detection terminal-side connection member.

11. The power module according to claim 10, wherein the first control layer includes the first detour portion and a first connection portion formed on a distal end of the first detour portion, and the first connection portion is connected to the first control terminal-side connection member.

12. The power module according to claim 10, wherein the first drive layer includes the first detour portion and a second connection portion formed on a distal end of the first detour portion, and the second connection portion is connected to the first detection terminal-side connection member.

13. The power module according to claim 1, wherein
the substrate includes a first substrate and a second substrate,
the first control layer, the second control layer, the first drive layer, the second drive layer, the first mount layer, the second mount layer, and the conductive layer are arranged on the substrate main surface of each of the first substrate and the second substrate,
the first power semiconductor elements are separated from each other in the one direction and arranged on the first mount layer of the first substrate and the first mount layer of the second substrate,
the second power semiconductor elements are separated from each other in the one direction and arranged on the second mount layer of the first substrate and the second mount layer of the second substrate,
the first substrate and the second substrate are separated in the one direction,
the first mount layer of the first substrate and the first mount layer of the second substrate are electrically connected by a first mount layer connection member,
the first control layer of the first substrate and the first control layer of the second substrate are electrically connected by a first control layer connection member,
the first drive layer of the first substrate and the first drive layer of the second substrate are electrically connected by a first drive layer connection member,
one of the first control layer and the first drive layer of the first substrate includes the first detour portion, and
the other one of the first control layer and the first drive layer of the second substrate includes the first detour portion.

14. The power module according to claim 13, wherein when the one direction is referred to as a first direction, and a direction intersecting the first direction as viewed in the thickness-wise direction is referred to as a second direction, each of the first control terminal and the first detection terminal is arranged to overlap the second substrate as viewed in the second direction.

15. The power module according to claim 14, wherein
in each of the first substrate and the second substrate, the first drive layer is arranged adjacent to the first mount layer in the second direction, and the first control layer and the first mount layer are located at opposite sides of the first drive layer,
the first control layer of the first substrate includes the first detour portion,
the first drive layer of the second substrate includes the first detour portion,
the first detour portion of the first control layer of the first substrate is shorter than the first detour portion of the first drive layer of the second substrate, and
the first control-side connection member is longer than the first drive-side connection member.

* * * * *